(12) United States Patent
Takeuchi et al.

(10) Patent No.: US 10,062,706 B2
(45) Date of Patent: Aug. 28, 2018

(54) SEMICONDUCTOR DEVICE

(71) Applicant: RENESAS ELECTRONICS CORPORATION, Tokyo (JP)

(72) Inventors: Yosuke Takeuchi, Tokyo (JP); Eiji Tsukuda, Tokyo (JP); Kenichiro Sonoda, Tokyo (JP); Shibun Tsuda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/682,492

(22) Filed: Aug. 21, 2017

(65) Prior Publication Data

US 2017/0345842 A1    Nov. 30, 2017

Related U.S. Application Data

(62) Division of application No. 15/265,473, filed on Sep. 14, 2016, now Pat. No. 9,780,109.

(30) Foreign Application Priority Data

Sep. 18, 2015   (JP) .................................. 2015-186033

(51) Int. Cl.
*H01L 29/792*   (2006.01)
*H01L 27/11573*   (2017.01)
(Continued)

(52) U.S. Cl.
CPC .. *H01L 27/11573* (2013.01); *H01L 27/11565* (2013.01); *H01L 29/42344* (2013.01);
(Continued)

(58) Field of Classification Search
CPC ........... H01L 27/11573; H01L 27/0886; H01L 29/785–29/7926; H01L 29/66833;
(Continued)

(56) References Cited

U.S. PATENT DOCUMENTS 6,057,580 A     5/2000   Watanabe et al.
6,831,310 B1   12/2004   Mathew et al.
(Continued)

FOREIGN PATENT DOCUMENTS

JP         2006-041354 A     2/2006

*Primary Examiner* — Eric Ward
*Assistant Examiner* — Eric Ashbahian
(74) *Attorney, Agent, or Firm* — McDermott Will & Emery LLP

(57)                ABSTRACT

A semiconductor device includes a semiconductor substrate, an element isolation film, and a fin having side surfaces facing each other in a first direction of an upper surface and a main surface connecting the facing side surfaces and extending in a second direction orthogonal to the first direction. The device further includes a control gate electrode arranged over the side surface via a gate insulation film and extending in the first direction, and a memory gate electrode arranged over the side surface via another gate insulation film having a charge accumulation layer and extending in the first direction. Furthermore, an overlap length by which the memory gate electrode overlaps with the side surface is smaller than an overlap length by which the control gate electrode overlaps with the side surface in the direction orthogonal to the upper surface.

4 Claims, 40 Drawing Sheets

(51) Int. Cl.
  *H01L 29/423* (2006.01)
  *H01L 27/11565* (2017.01)
  *H01L 29/78* (2006.01)

(52) U.S. Cl.
  CPC ........ *H01L 29/7851* (2013.01); *H01L 29/792* (2013.01); *H01L 2029/7857* (2013.01)

(58) Field of Classification Search
  CPC ....... H01L 29/42344; H01L 21/823431; H01L 21/823821; H01L 21/28282
  See application file for complete search history.

(56) References Cited

U.S. PATENT DOCUMENTS

| | | |
|---|---|---|
| 2006/0022260 A1 | 2/2006 | Hisamoto et al. |
| 2006/0183271 A1 | 8/2006 | Forbes et al. |
| 2007/0269948 A1 | 11/2007 | Manger |
| 2012/0306001 A1* | 12/2012 | Hirano .............. H01L 21/28282 257/324 |
| 2013/0240971 A1 | 9/2013 | Takekida et al. |
| 2016/0181381 A1 | 6/2016 | Liu et al. |
| 2017/0062445 A1* | 3/2017 | Yamashita ........ H01L 27/11521 |
| 2017/0084625 A1* | 3/2017 | Takeuchi ............ H01L 29/7851 |
| 2017/0243982 A1* | 8/2017 | Mihara ................ H01L 29/792 |
| 2017/0309755 A1* | 10/2017 | Mihara ............. H01L 21/28282 |
| 2018/0061997 A1* | 3/2018 | Kawashima ...... H01L 29/42344 |

* cited by examiner

| APPLIED VOLTAGE / OPERATION | Vd | Vcg | Vmg | Vs | Vb |
|---|---|---|---|---|---|
| WRITE | Vdd | 1V | 12V | 6V | 0 |
| ERASE | −6V | −6V | 6V | −6V | −6V |
| READ | Vdd | Vdd | 0 | 0 | 0 |

Vdd = 1.5V

| OPERATION | APPLIED VOLTAGE | Vd | Vmg | Vs | Vb |
|---|---|---|---|---|---|
| WRITE | | 0 | 8V | 5V | 0 |
| ERASE | | 0 | 10V | 0 | 0 |

Vdd = 1.5V

SEMICONDUCTOR DEVICE

CROSS-REFERENCE TO RELATED APPLICATION

The present application is a divisional of U.S. patent application Ser. No. 15/265,473, filed on Sep. 14, 2016, which claims priority from Japanese Patent Application No. 2015-186033 filed on Sep. 18, 2015, the contents of which are hereby incorporated by reference into this application.

TECHNICAL FIELD OF THE INVENTION

The present invention relates to a semiconductor device which can be suitably utilized for, for example, a semiconductor device including a non-volatile memory.

BACKGROUND OF THE INVENTION

As a non-volatile memory capable of performing electrical writing and erasing, an electrically erasable and programmable read only memory (EEPROM) is widely used. A storage device represented by a flash memory and widely used in these days includes a conductive floating gate electrode or a trap insulation film surrounded by an oxide film below a gate electrode of a MISFET, and a charge accumulation state in the floating gate electrode or the trap insulation film are deemed as stored information and read as a threshold value of a transistor. This trap insulation film is an insulation film capable of accumulating a charge, and an example trap insulation film is a silicon nitride film. A threshold value of the MISFET is shifted by injecting/discharging a charge to/from such a charge accumulation region, and the MISFET is made to function as a storage element. An example flash memory described above is a split gate cell using a metal oxide nitride oxide semiconductor (MONOS) film. Such a memory has advantages that, since a charge is discretely accumulated through use of the silicon nitride film as the charge accumulation region, reliability of data retention is excellent compared to a conductive floating gate film, and since the reliability of data retention is excellent, the oxide films under and over the silicon nitride film can be thinned, and writing/erasing operation can be performed with low voltage.

Moreover, the split gate memory cell includes: a control gate electrode (selection gate electrode) formed over a semiconductor substrate via a first gate insulation film; and a memory gate electrode formed over the semiconductor substrate via a second gate insulation film including a charge accumulation region. Furthermore, the split gate memory cell includes a pair of semiconductor regions (a source region and a drain region) formed in a front surface of the semiconductor substrate so as to interpose the control gate electrode and the memory gate electrode, and the charge accumulation region is provided in the second gate insulation film.

Furthermore, Japanese Patent Application Laid-Open Publication No. 2006-41354 (Patent Document 1) discloses a split gate memory cell in which an active region in a protruding shape is formed on a front surface of the semiconductor substrate, and a control gate electrode and a memory gate electrode are arranged so as to straddle this protruding active region. Additionally, data writing is performed by the source side injection (SSI) writing method in which hot electrons generated in the semiconductor substrate are injected into a charge accumulation region, and data erasing is performed by the hot hole (band-to-band tunneling: BTBT) erasing method in which holes generated in the semiconductor substrate due to the band-to-band tunnel phenomenon are injected into the charge accumulation region.

SUMMARY OF THE INVENTION

To develop a next-generation non-volatile memory cell, the inventors of the present application have studied a fin-type non-volatile memory cell including a control gate electrode and a memory gate electrode arranged so as to straddle an active region having a protruding shape (referred to as "fin") formed on a front surface of a semiconductor substrate.

A periphery of the fin projecting from the front surface of the semiconductor substrate is covered with an element isolation film formed over the front surface of the semiconductor substrate, and the fin projects from the element isolation film. The fin is a projecting portion of a rectangular parallelepiped, has a width in a first direction of a main surface of the semiconductor substrate, extends in a second direction orthogonal to the first direction, and includes a main surface (upper surface) and side surfaces. The control gate electrode extends in the first direction, is formed along the main surface and the side surfaces of the fin via the first gate insulation film, and extends over the element isolation film around the fin. Moreover, the memory gate electrode is arranged adjacent to the control gate electrode, formed along the main surface and the side surfaces of the fin via a second gate insulation film, and extends over the element isolation film around the fin. Furthermore, the second gate insulation film includes a charge accumulation layer. Additionally, a pair of semiconductor regions (a source region and a drain region) is formed in the fin so as to interpose the control gate electrode and the memory gate electrode.

Additionally, writing in the memory cell is performed by the source side injection (SSI) method in which hot electrons (electrons) generated in the front surface of the semiconductor substrate are injected into the charge accumulation layer, and erasing is performed by utilizing the Fowler-Nordheim (FN) tunnel phenomenon and injecting holes into the charge accumulation layer from the memory gate electrode.

According to the study made by the inventors of the present application, in the non-volatile memory cell, electrical field is concentrated at a corner portion of a tip of the fin and a corner portion of a lower end of the memory gate electrode. Therefore, electrons are efficiently injected into the charge accumulation layer positioned at an upper end of the fin at the time of writing, and holes are efficiently injected into the charge accumulation layer positioned at the lower end of the memory gate electrode at the time of erasing. More specifically, it is found that endurance is deteriorated due to the fact that mismatch is caused between electron distribution and hole distribution in the charge accumulation layer and electrons injected into the charge accumulation layer positioned apart from the lower end of the memory gate electrode are not erased and remain after erasing operation. Here, endurance is the number of times that data can be rewritten, and when the above-mentioned remaining electrons are increased, an electrical field between the memory gate electrode and the semiconductor substrate is weakened due to the increase of the remaining electrons, and data writing and erasing cannot be performed.

In other words, further improvement of performance is more demanded in the semiconductor device including the fin-type non-volatile memory.

Other objects and novel characteristics of the present invention will be apparent from the description of the present specification and the accompanying drawings.

According to an embodiment, a semiconductor device includes a semiconductor substrate, an element isolation film formed over an upper surface of the semiconductor substrate, and a fin being a part of the semiconductor substrate, penetrating the element isolation film, projecting in a direction vertical to the upper surface, having side surfaces facing each other in a first direction of the upper surface and a main surface connecting the facing side surfaces, and extending in a second direction orthogonal to the first direction. The semiconductor device further includes a control gate electrode arranged over the side surfaces via a gate insulation film and extending in the first direction, and a memory gate electrode arranged over the side surfaces via a gate insulation film having a charge accumulation layer and extending in the first direction. Furthermore, a first overlap length by which the memory gate electrode overlaps with the side surface is smaller than a second overlap length by which the control gate electrode overlaps with the side surface in the direction orthogonal to the upper surface.

According to the embodiment, performance of the semiconductor device can be improved.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Further, in the embodiments described below, it goes without saying that the components (including element steps) are not always indispensable unless otherwise stated or except the case where the components are apparently indispensable in principle. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference symbols throughout the drawings for describing the embodiments, and the repetitive description thereof is omitted. In addition, the description of the same or similar portions is not repeated in principle unless particularly required in the following embodiments.

In addition, in some drawings used in the embodiments, hatching may be omitted even in a cross-sectional view so as to make the drawings easy to see. Also, hatching may be used even in a plan view so as to make the drawings easy to see.

Embodiment

<Layout Configuration Example of Semiconductor Chip>

Figure 1:
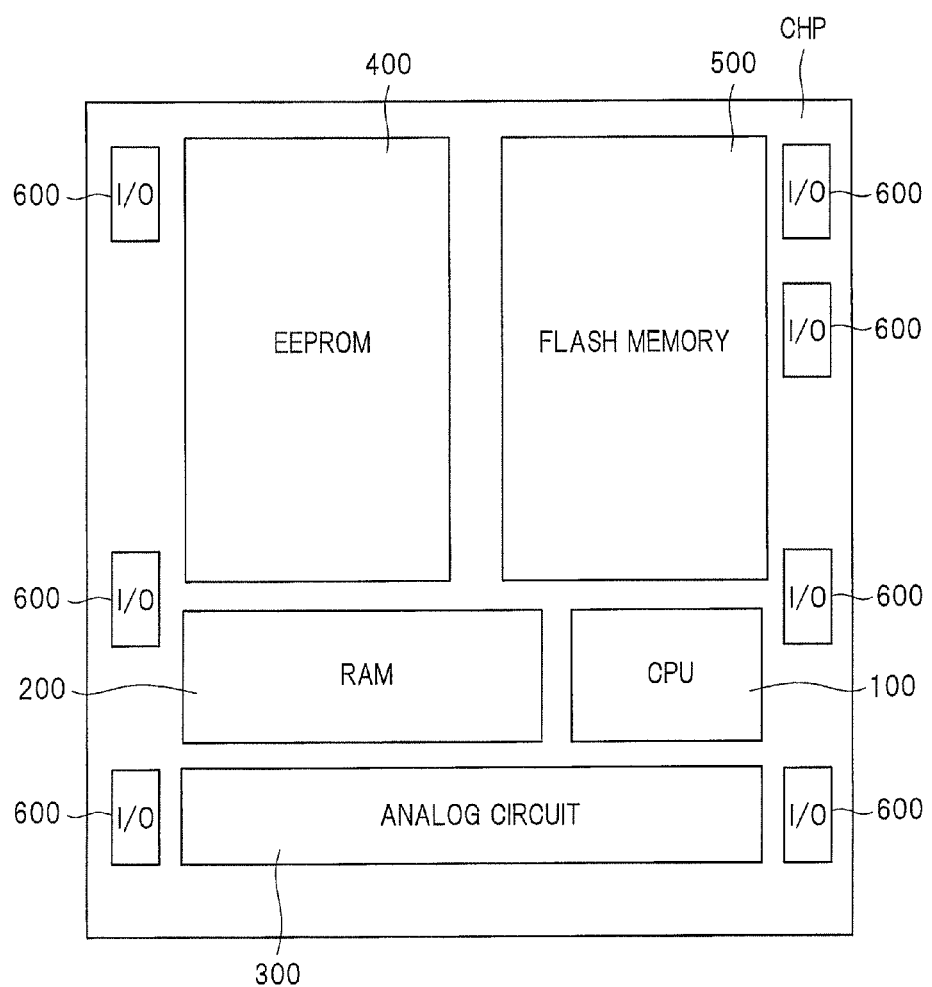
FIG. 1 is a diagram illustrating an example layout structure of a semiconductor device (semiconductor chip) according to an embodiment.

A semiconductor device including a non-volatile memory according to the present embodiment will be described with reference to the drawings. First, a layout configuration of the semiconductor device (semiconductor chip) in which a system including a non-volatile memory is formed will be described. FIG. 1 is a diagram illustrating a layout configuration example of a semiconductor chip CHP according to the present embodiment. In FIG. 1, the semiconductor chip CHP includes a central processing unit (CPU) 100, a random access memory (RAM) 200, an analog circuit 300, an electrically erasable programmable read only memory (EEPROM) 400, a flash memory 500, and an input/output (I/O) circuit 600 and constitutes the semiconductor device.

The CPU (circuit) 100 is also referred to as a central processing unit, reads and decodes a command from a storage device, and performs various kinds of calculations and control based thereon.

The RAM (circuit) 200 is a memory which can randomly read stored information, namely, the stored information stored as needed, and can write new stored information and is also referred to as a memory which can perform writing and reading as needed. As the RAM, a static RAM (SRAM) using a static circuit is used.

The analog circuit 300 is a circuit handling voltage and current signals which continuously change with time, namely, an analog signal and constituted by, for example, an amplification circuit, a conversion circuit, a modulation circuit, an oscillation circuit, a power supply circuit, and the like.

The EEPROM 400 and the flash memory 500 belong to a kind of a non-volatile memory that can electrically perform rewriting in both writing operation and erasing operation and also are referred to as an electrically erasable programmable read only memory. This EEPROM 400 and the flash memory 500 have memory cells constituted by, for example, a metal oxide nitride oxide semiconductor (MONOS) transistor and a metal nitride oxide semiconductor (MNOS) transistor for storage (memory). A difference between the EEPROM 400 and the flash memory 500 is that the EEPROM 400 is a non-volatile memory that can perform erasing in a byte unit, for example, while the flash memory 500 is a non-volatile memory that can perform erasing in a word line unit, for example. In general, in the flash memory 500, a program and the like to execute various kinds of processing in the CPU 100 are stored. In contrast, in the EEPROM 400, various data frequently rewritten is stored. The EEPROM 400 or the flash memory 500 includes: a memory cell array on which a plurality of non-volatile memory cells are arranged in a matrix; and other components such as an address buffer, a row decoder, a column decoder, a verify sense amplifier circuit, a sense amplifier circuit, and a writing circuit.

The I/O circuit 600 is an input/output circuit and also a circuit for outputting data from the inside of the semiconductor chip CHP to an apparatus connected outside the semiconductor chip CHP and receiving data inside the semiconductor chip from the apparatus connected outside the semiconductor chip CHP.

The semiconductor device of the present embodiment includes a memory cell forming region and a logic circuit forming region. In the memory cell forming region, the memory cell array on which the plurality of non-volatile memory cells are arranged in a matrix is formed. In the logic circuit forming region, the CPU 100, RAM 200, analog circuit 300, I/O circuit 600 are formed, and the address buffer, row decoder, column decoder, verify sense amplifier circuit, sense amplifier circuit, writing circuit, and the like of the EEPROM 400 or the flash memory 500 are formed.

<Device Structure of Semiconductor Device>

Figure 2:
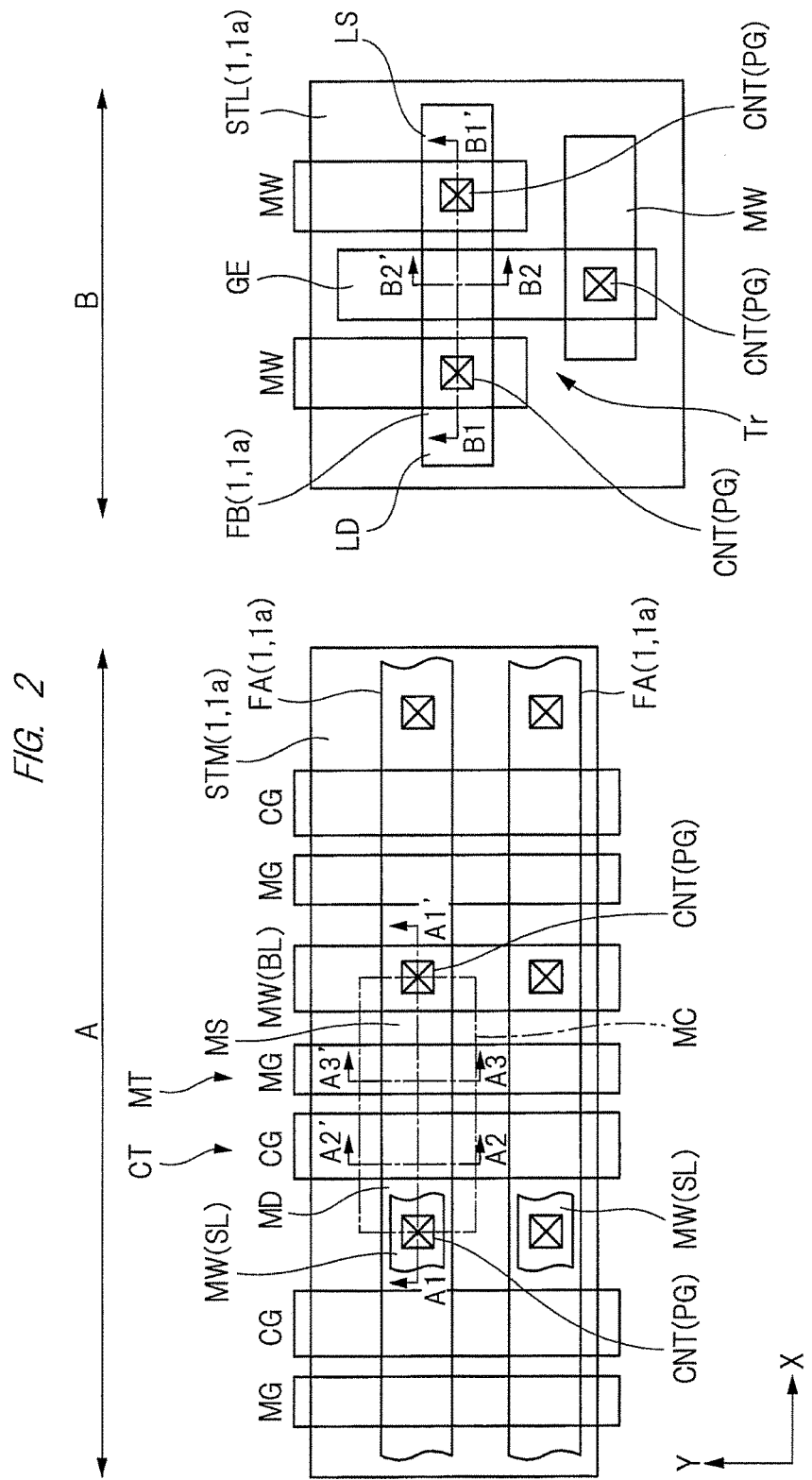
FIG. 2 is a plan view illustrating a main portion of the semiconductor device according to the embodiment.
Figure 3:
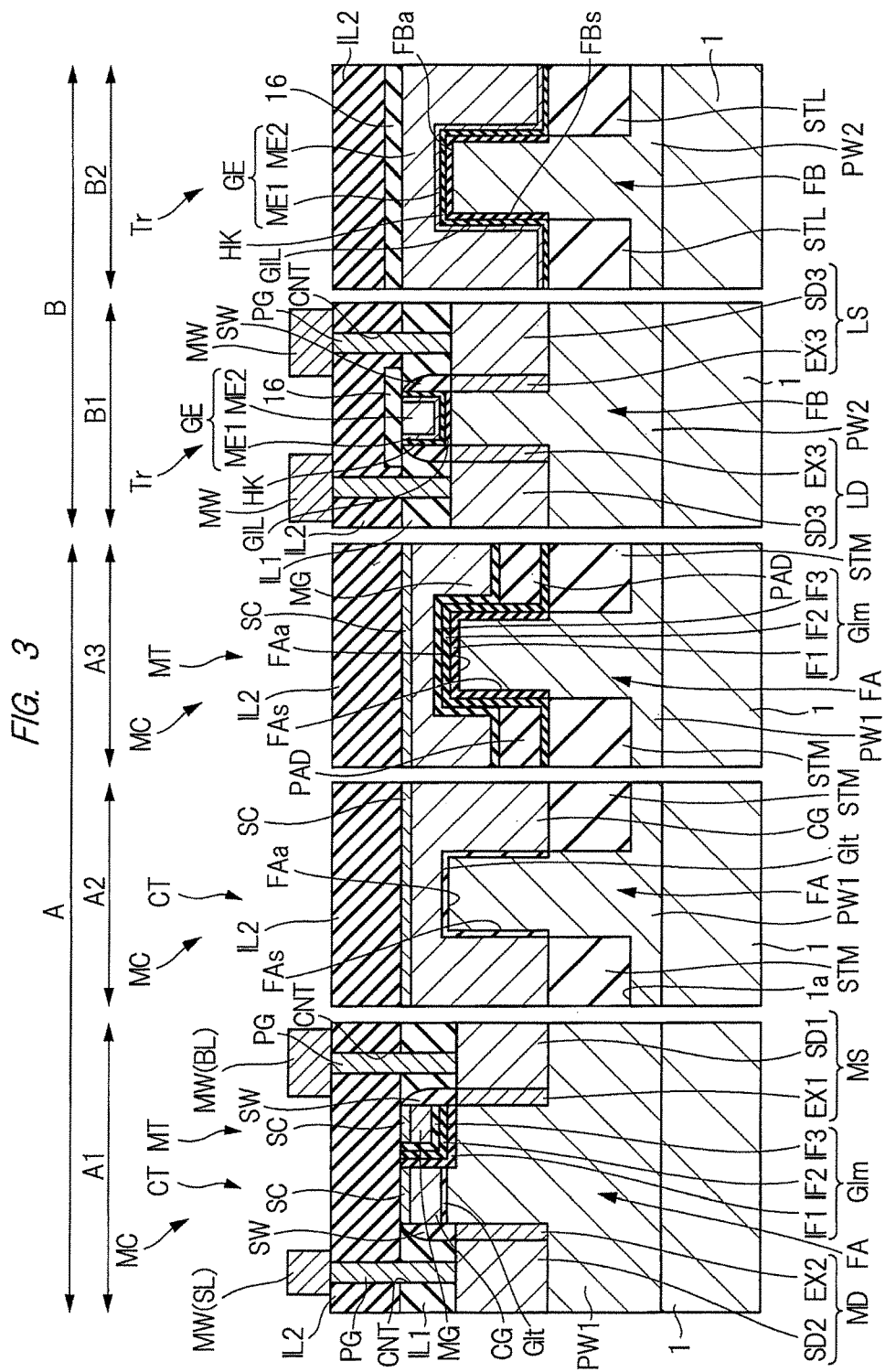
FIG. 3 is a cross-sectional view illustrating a main portion of the semiconductor device according to the embodiment.

FIG. 2 is a plan view illustrating a main portion of the semiconductor device according to the present embodiment. In FIG. 2, a plan view of the main portion of the memory cell array on which the plurality of memory cells are arranged in a matrix is illustrated in a memory cell section A, and a plan view of a main portion of a transistor Tr constituting a logic circuit and the like in the logic circuit forming region is illustrated in a logic section B. As the transistor Tr, n-type metal insulator semiconductor field effect transistor (MISFET) is exemplified. FIG. 3 is a cross-sectional view illustrating the main portion of the semiconductor device according to the present embodiment. In FIG. 3, three cross-sectional views of the memory cell section A and two cross-sectional views of the logic section B are illustrated. A memory cell section A1 is a cross-sectional view taken along an A1-A1' line in FIG. 2, a memory cell section A2 is a cross-sectional view taken along an A2-A2' line in FIG. 2, a memory cell section A3 is a cross-sectional view taken along an A3-A3' line in FIG. 2, a logic section B1 is a cross-sectional view taken along a B1-B1' line in FIG. 2, and a logic section B2 is a cross-sectional view taken along a B2-B2' line in FIG. 2.

As illustrated in FIG. 2, a plurality of fins FA extending in an X-direction are arranged at equal intervals in a Y-direction in the memory cell section A. The fin FA is, for example, a projecting portion (protruding portion) of a rectangular parallelepiped selectively projecting from a main surface (front surface, upper surface) 1a of the semiconductor substrate 1, and a lower portion of the fin FA is surrounded by an element isolation film STM covering the main surface of the semiconductor substrate 1. The fin FA is a part of the semiconductor substrate 1 and also an active region of the semiconductor substrate 1. Accordingly, in the plan view, the element isolation film STM is embedded between the adjacent fins FA, and a periphery of fin FA is surrounded by the element isolation film STM. The fin FA is the active region in order to form the memory cell MC.

A plurality of control gate electrodes CG and a plurality of memory gate electrodes MG each extending in the Y-direction (the direction orthogonal to the X-direction) are arranged over the plurality of fins FA. A drain region MD is formed on the control gate electrode CG side, and a source region MS is formed on the memory gate electrode MG side, so as to interpose the control gate electrode CG and the memory gate electrode MG. The drain region MD and the source region MS are n-type semiconductor regions. The drain region MD is formed between the two adjacent control gate electrodes CG in the X-direction, and the source region MS is formed between the two adjacent memory gate electrodes MG in the X-direction. The memory cell MC includes the control gate electrode CG, the memory gate electrode MG, the drain region MD, and the source region MS. The memory cell MC includes a control transistor CT having the control gate electrode CG, and a memory transistor MT connected to the control transistor CT and having the memory gate electrode MG. The memory cell MC is a split gate cell (split gate memory cell).

In the two adjacent memory cells MC in the X-direction, the drain region MD and the source region MS are shared. The two memory cells sharing the drain region MD are mirror-symmetric in the X-direction relative to the drain region MD, and the two memory cells MC sharing the source region MS are mirror-symmetric in the X-direction relative to the source region MS.

The plurality of memory cells MC are formed in the X-direction in each fin FA, and the drain regions MD of the plurality of memory cells MC arranged in the X-direction are connected to a source line SL formed of a metal wire MW extending in the X-direction via a plug electrode PG formed inside a contact hole CNT. Moreover, the source regions MS of the plurality of memory cells MC arranged in the Y-direction are connected to a bit line BL formed of a metal wire MW extending in the Y-direction. Preferably, for the source line SL, the metal wire of a layer different from that of the bit line BL is used.

Moreover, a fin FB extending in the X-direction is formed in the logic section B, for example. The fin FB is an active region of the semiconductor substrate 1 as well as the fin FA, and a lower portion of the fin FB is surrounded by an element isolation film STL covering the main surface of the semiconductor substrate 1. A gate electrode GE extending in the Y-direction is arranged over the fin FB, and a drain region LD and a source region LS are formed in the fin FB so as to interpose the gate electrode GE. The drain region LD and the source region LS are n-type semiconductor regions. The transistor Tr includes the gate electrode GE, the drain region LD, and the source region LS. The gate electrode GE, the drain region LD, and the source region LS each are connected to a metal wire MW via a plug electrode PG formed inside a contact hole CNT. The fin FB is the active region in order to form the transistor Tr. Note that the fin FB may also extend in the Y-direction and the gate electrode GE may also be arranged to extend in the X-direction.

The fins FA and FB are, for example, projecting portions of a rectangular parallelepiped projecting from the main surface 1a of the semiconductor substrate 1 in a direction vertical to the main surface 1a. Each of the fins FA and FB has an optional length in a long side direction, an optional width in a short side direction, and an optional height in a height direction. Each of the fins FA and FB does not necessarily have the shape of a rectangular parallelepiped and may also have a rectangular shape with round corners in the cross-sectional view in the short side direction. Moreover, the direction in which the fins FA and FB extend in the plan view is the long side direction, and the direction orthogonal to the long side direction is the short side direction. In other words, the length is longer than the width. As long as the fins FA and FB are the projecting portions each having the length, the width, and the height, any shape is applicable. Each of the fins FA and FB includes side surfaces facing to each other in the width direction, and a main surface (upper surface) connecting the side surfaces facing each other. For example, a meandering pattern in a plan view may also be included.

Next, structures of the memory cell MC and the transistor Tr will be described with reference to FIG. 3.

The fins FA that are the projecting portions of the semiconductor substrate 1 are formed in the memory cell section A of the semiconductor substrate 1. The lower portion of the fin FA is surrounded by the element isolation film STM formed over the main surface 1a of the semiconductor substrate 1. In other words, as illustrated in FIG. 2, the fins FA are isolated from each other by the element isolation film STM. A p-type well PW1 that is a p-type semiconductor region is formed at a lower portion of the fin FA. In other words, the fin FA is formed in the p-type well PW1. Practically, the plurality of fins FA are formed in the p-type well PW1.

The control gate electrode CG is formed over a main surface FAa and side surfaces FAs of the fin FA via a gate insulation film GIt, and the memory gate electrode MG is formed via a gate insulation film GIm in the region adjacent to the control gate electrode CG in the long side direction of the fin FA. The control gate electrode CG and the memory gate electrode MG are electrically isolated by the gate insulation film GIm. The control gate electrode CG and the memory gate electrode MG may also be electrically isolated from each other by interposing an insulation film different from the gate insulation film GIm therebetween.

Here, the gate insulation film GIt is a thermal oxide film (silicon oxide film) formed by thermally oxidizing the main surface FAa and the side surfaces FAs of the fin FA that is the projecting portion of the semiconductor substrate 1 made of silicon, and a film thickness of the gate insulation film GIt is 2 nm. Moreover, the gate insulation film GIm is formed of an insulation film IF1 made of a thermal oxide film (silicon oxide film) having a film thickness of 4 nm and formed by thermally oxidizing the main surface FAa and the side surfaces FAs of the fin FA that are the projecting portion of the semiconductor substrate 1 made of silicon, an insulation film IF2 formed over the insulation film IF1, and an insulation film IF3 formed over the insulation film IF2. The insulation film IF2 is made of a silicon nitride film that is a charge accumulation layer (a charge accumulation section, a charge accumulation region), and the insulation film IF3 is made of an oxynitride silicon film covering a front surface of the silicon nitride film. The silicon nitride film has a thickness of 7 nm, and the oxynitride silicon film has a thickness of 9 nm. More specifically, the gate insulation film GIm includes a stacking structure of the silicon oxide film, silicon nitride film, and oxynitride silicon film and has the film thickness of 20 nm which is thicker than the gate insulation film GIt positioned under the control gate electrode CG. The gate insulation film GIm may also have a stacking structure of the silicon oxide film, silicon nitride film, and silicon oxide film. Furthermore, as the gate insulation film GIm, a stacked film formed by combining a silicon oxide film (SiO), a silicon nitride film (SiN) an aluminum oxide film ($AlO_x$), a hafnium oxide film ($HfO_x$), and an oxynitride silicon film (SiON) may also be used. For example, a stacking structure of, for example, SiO/SiON/$HfO_x$/$AlO_x$, $AlO_x$/SiON/$HfO_x$/$AlO_x$, SiON/SiO/$HfO_x$/$AlO_x$, or the like stacked from the semiconductor substrate 1 side may also be applicable.

As illustrated in the memory cell section A2, the control gate electrode CG extends along the main surface FAa and the facing side surfaces FAs of the fin FA in the short side direction of the fin FA via the gate insulation film GIt and extends over the element isolation film STM surrounding (interposing) the lower portion of the fin FA. In the same manner, as illustrated in the memory cell section A3, the memory gate electrode MG extends along the main surface FAa and the facing side surfaces FAs of the fin FA in the short side direction of the fin FA via the gate insulation film GIm and extends over the element isolation film STM surrounding (interposing) the fin FA. In the extending direction of the memory gate electrode MG, a pad insulation film PAD is interposed between the element isolation film STM and the memory gate electrode MG. The pad insulation film PAD is interposed between the insulation film IF2 and the insulation film IF3. The pad insulation film PAD is formed between the element isolation film STM and the memory gate electrode MG outside the fin FA and not formed between the main surface FAa of the fin FA and the memory gate electrode MG. Moreover, the pad insulation film PAD is formed neither between the control gate electrode CG and the element isolation film STM nor between the control gate electrode CG and the main surface FAa of the fin FA. More specifically, the pad insulation film PAD is formed between the memory gate electrode MG and the element isolation film STM outside the fin FA, so that a region where the memory gate electrode MG overlaps with the side surface FAs of the fin FA is reduced without reducing a height (length) of a region where the control gate electrode CG overlaps with the side surface FAs of the fin FA (in other words, without degrading drive performance of the control transistor CT). Note that the pad insulation film PAD is formed in the region other than the fin FA and the control gate electrode CG in the memory cell section A illustrated in FIG. 2. It is sufficient if the pad insulation film PAD remains at least between the memory gate electrode MG and the element isolation film STM, and the pad insulation film PAD may be removed in other regions.

A silicide layer SC is formed over the main surface of each of the control gate electrode CG and memory gate electrode MG.

Furthermore, the source region MS and the drain region MD are provided outside the control gate electrode CG and the memory gate electrode MG so as to interpose the control gate electrode CG and the memory gate electrode MG. The source region MS includes an $n^-$-type semiconductor region EX1 and an $n^+$-type semiconductor region SD1, and the drain region MD includes an $n^-$-type semiconductor region EX2 and an $n^+$-type semiconductor region SD2. The source region MS and the drain region MD are formed over an entire region of the fin FA exposed from the element isolation film STM in the short side direction and in the height direction.

A side wall spacer (side wall or side wall insulation film) SW and an interlayer insulation film IL1 are formed over a side wall of each of the control gate electrode CG and the memory gate electrode MG, and an interlayer insulation film IL2 is formed over the interlayer insulation film IL1 so as to cover the control gate electrode CG, the memory gate electrode MG, the source region MS, and the drain region MD. A metal wire MW is formed over the interlayer insulation film IL2, and the metal wire MW is electrically connected to each of the source region MS and the drain region MD via the plug electrode PG provided in the contact hole CNT formed in the interlayer insulation films IL2 and IL1.

The memory cell MC includes the control gate electrode CG, the memory gate electrode MG, the drain region MD, and the source region MS. Moreover, a distance between the drain region MD and the source region MS in the long side direction corresponds to a channel length of the memory cell MC, and a region where the control gate electrode CG or the memory gate electrode MG in the short side direction faces (overlaps with) the main surface FAa and the side surfaces FAs of the fin FA corresponds to a channel width of the memory cell MC. Furthermore, since the memory cell MC includes the control transistor CT and the memory transistor MT, a length of the control gate electrode CG over the main surface FAa of the fin FA corresponds to a gate length of the control transistor CT, and a region where the control gate electrode CG in the short side direction faces (overlaps with) the main surface FAa and the side surfaces FAs of the fin FA corresponds to a channel width of the control transistor CT. Still Further, a length of the memory gate electrode MG over the main surface FAa of the fin FA corresponds to a gate length of the memory transistor MT, and a region where the memory gate electrode MG in the short side direction faces (overlaps with) the main surface FAa and the side surfaces FAs of the fin FA corresponds to a channel width of the memory transistor MT.

The fin FB that is a projecting portion of the semiconductor substrate 1 is formed in the logic section B of the semiconductor substrate 1. A lower portion of the fin FB is surrounded by the element isolation film STL formed over the main surface 1a of the semiconductor substrate 1. Although not illustrated, a plurality of fins FB are formed in the logic section B, and the fins FB are isolated from each other by the element isolation film STL. A p-type well PW2 that is a p-type semiconductor region is formed at the lower portion of the fin FB. In other words, the fin FB is formed in the p-type well PW2.

A gate electrode GE is formed over a main surface FBa and side surfaces FBs of the fin FB via a gate insulation film GIL and an insulation film HK. As illustrated in the logic section B2, the gate electrode GE extends along the main surface FBa and the side surfaces FBs of the fin FB in the short side direction of the fin FB via the gate insulation film GIL and the insulation film HK and extends over the element isolation film STL surrounding the fin FB. The gate electrode GE has a stacking structure of metal films ME1 and ME2. No pad insulation film PAD is formed in the logic section B.

Furthermore, the source region LS and the drain region LD are provided outside the gate electrode GE so as to interpose the gate electrode GE, and the source region LS includes an n$^-$-type semiconductor region EX3 and an n$^+$-type semiconductor region SD3. Similarly, the drain region LD includes an n$^-$-type semiconductor region EX3 and an n$^+$-type semiconductor region SD3. The source region LS and the drain region LD are formed over an entire region of the fin FB exposed from the element isolation film STL in the short side direction and in the height direction.

A side wall spacer SW and an interlayer insulation film IL1 are formed over each side wall of the gate electrode GE, and an interlayer insulation film IL2 is formed over the gate electrode GE and the interlayer insulation film IL1. Note that an insulation film 16 is formed between the interlayer insulation film IL1 and the interlayer insulation film IL2 so as to cover the gate electrode GE. A metal wire MW is formed over the interlayer insulation film IL2, and the metal wire MW is electrically connected to each of the source region LS and the drain region LD via the plug electrode PG provided inside the contact hole CNT formed in the interlayer insulation films IL2 and IL1.

A transistor Tr includes the gate electrode GE, the drain region LD, and the source region LS. Furthermore, a distance between the drain region LD and the source region LS in the long side direction corresponds to a channel length of the transistor Tr, and a region where the gate electrode GE faces the main surface FBa and the side surfaces FBs of the fin FB corresponds to a channel width of the transistor Tr.

Note that the p-type wells PW1 and PW2 illustrated in FIG. 3 are omitted in FIGS. 4 to 22.

<Manufacturing Process of Semiconductor Device>

FIGS. 4 to 22 are cross-sectional views each illustrating the main portion of the semiconductor device in a manufacturing process according to the present embodiment.

Manufacturing processes of the fin FA in the memory cell section A and the fin FB in the logic section B will be described.

Figure 4:
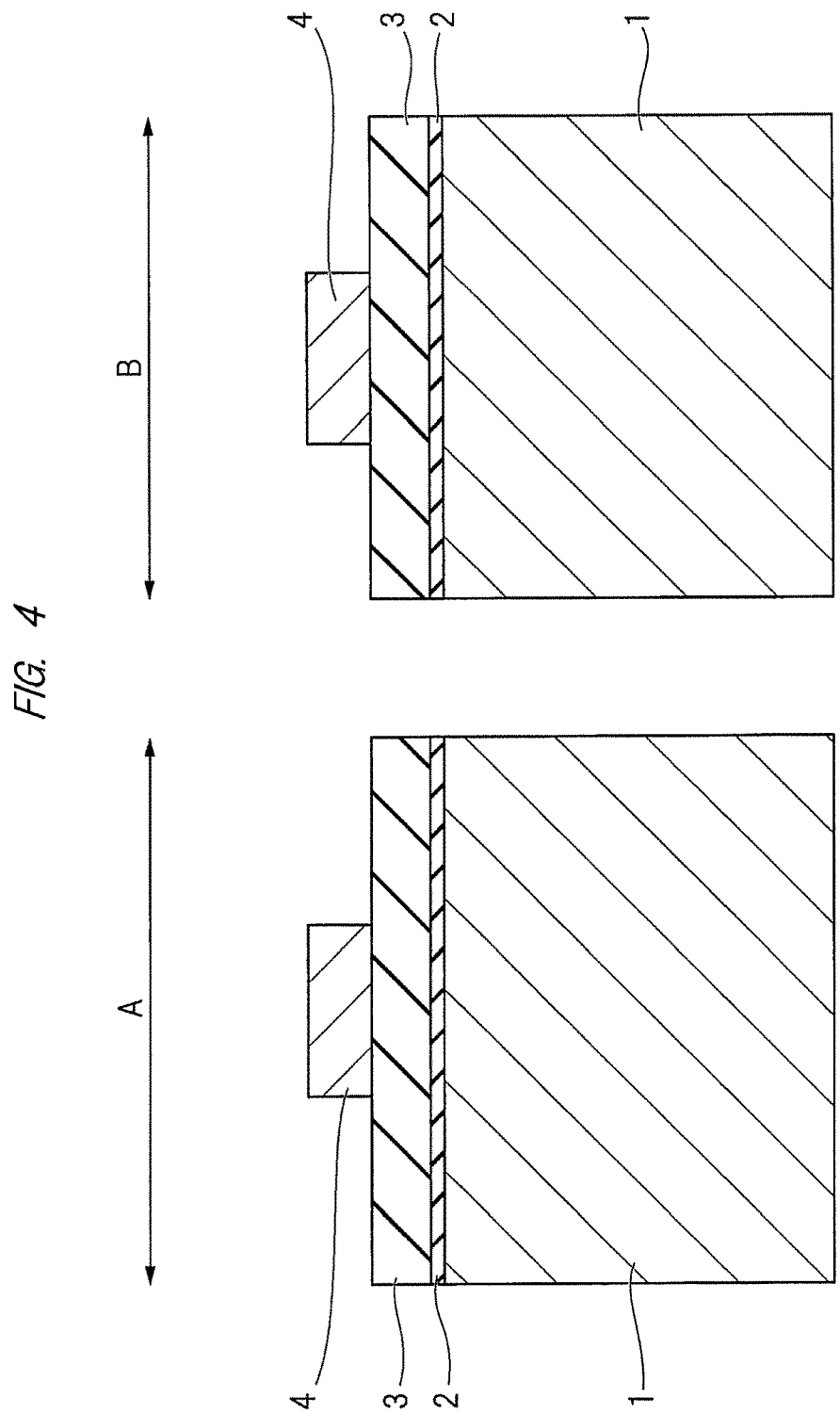
FIG. 4 is a cross-sectional view illustrating the main portion of the semiconductor device in a manufacturing process according to the embodiment.

FIG. 4 is an explanatory diagram for a forming process of a mask film 4 in order to specify each region to form the fins FA and FB (Step S1).

Insulation films 2 and 3 are deposited over the semiconductor substrate 1. The semiconductor substrate 1 is made of, for example, a p-type single crystal silicon having a specific resistance of about 1 to 10Ωcm. The insulation film 2 is made of a silicon oxide film and has a film thickness of about 2 to 10 nm. The insulation film 3 is made of a silicon nitride film and has a film thickness of about 20 to 100 nm. Next, an amorphous silicon film is deposited over the insulation film 3 and patterned in a desired shape to form the mask film 4 made of the amorphous silicon film. The mask film 4 has a film thickness of 20 to 200 nm. Since the fin FA or FB is formed at both ends of the mask film 4, an interval between adjacent fins FA or an interval between adjacent fins FB can be determined by a width of the mask film 4.

Figure 5:
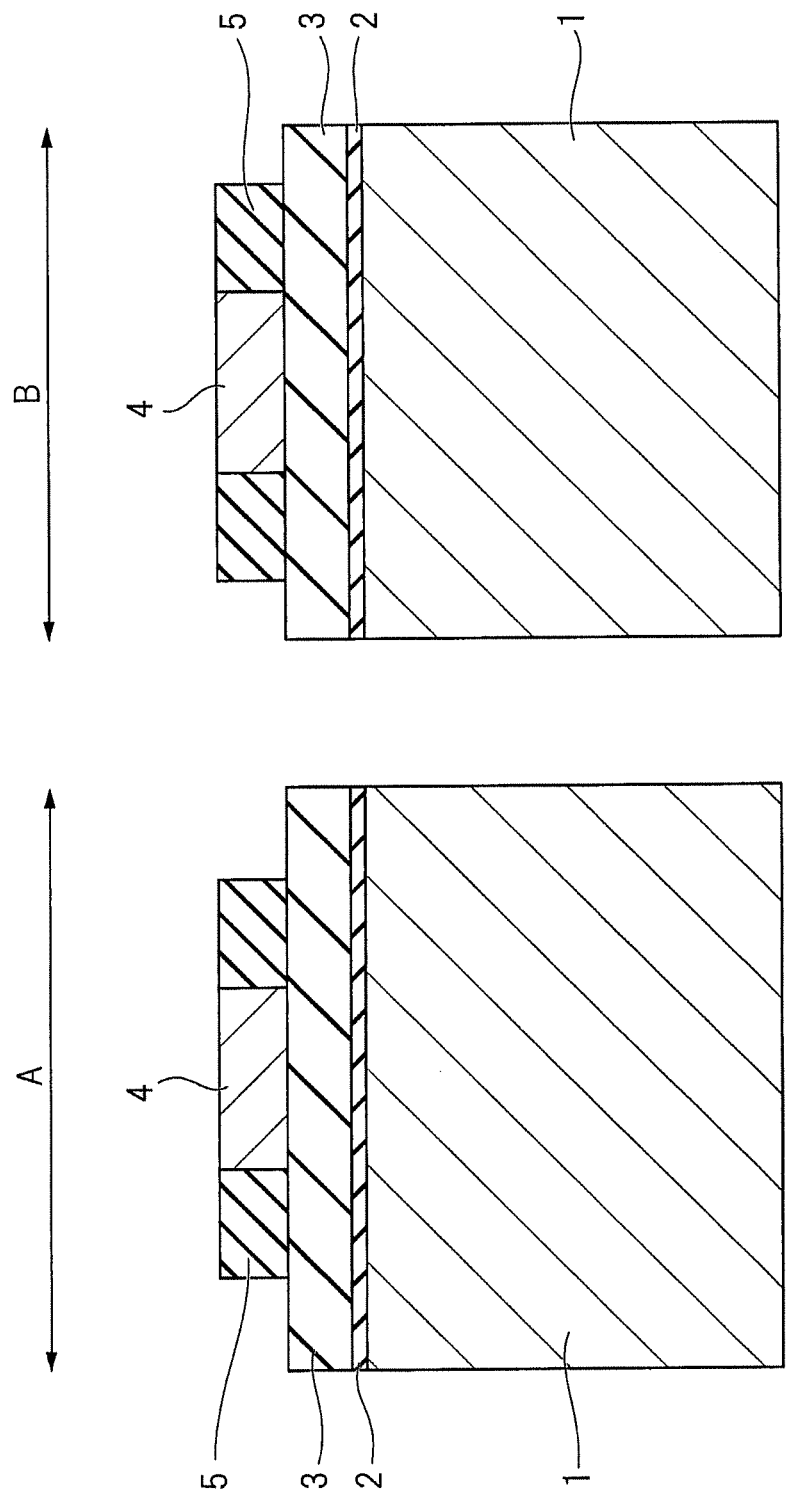
FIG. 5 is a cross-sectional view illustrating the main portion of the semiconductor device in the manufacturing process subsequent to FIG. 4.

FIG. 5 is an explanatory diagram for a forming process of a hard mask film 5 in order to form the fins FA and FB (Step S2).

A silicon oxide film having a film thickness of 10 to 40 nm is deposited over the semiconductor substrate 1 so as to cover an upper surface and side surfaces of the mask film 4, and then the silicon oxide film is subjected to anisotropic dry etching to form the hard mask film 5 over each side wall of the mask film 4. The hard mask film 5 has a width of 10 to 40 nm. After forming the hard mask film 5, the mask film 4 is removed.

Figure 6:
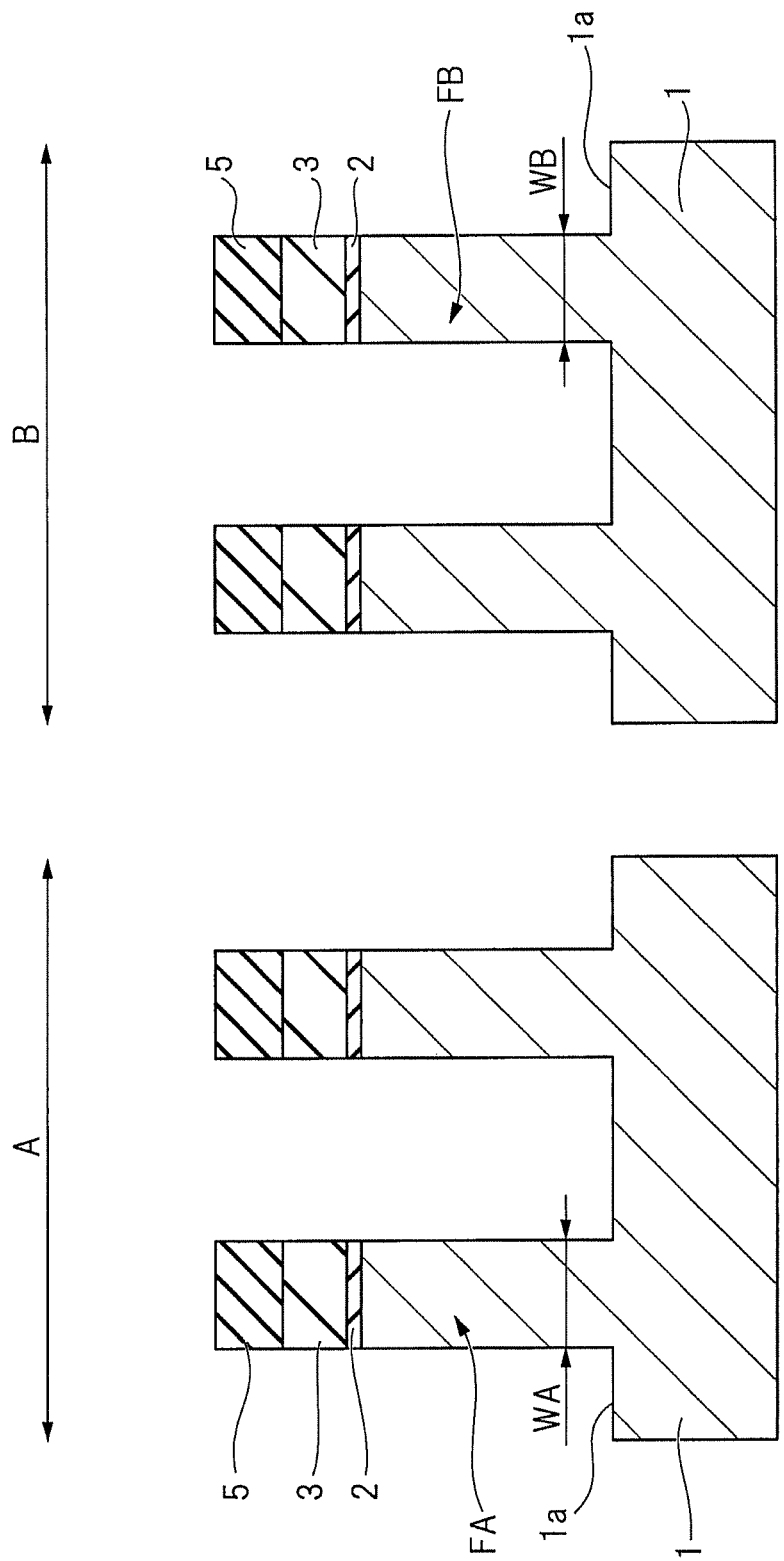
FIG. 6 is a cross-sectional view illustrating the main portion of the semiconductor device in the manufacturing process subsequent to FIG. 5.

FIG. 6 is an explanatory diagram for a forming process of the fins FA and FB (Step S3).

By using the hard mask film 5 as a mask, the insulation films 3 and 2 and the semiconductor substrate 1 are subjected to anisotropic dry etching, and the insulation films 3 and 2 and the fins FA and FB having the same shape as the hard mask film 5 in the plan view are formed. Note that the fins FA and FB each having a height of 100 to 250 nm from the main surface 1a of the semiconductor substrate 1 can be formed by digging, by about 100 to 250 nm, the semiconductor substrate 1 in a region exposed from the hard mask film 5. As a matter of course, a width WA of the fin FA in the memory cell section A is equal to a width WB of the fin FB in the logic section B. Here, the width of the fin FA or the fin FB represents a length in a direction in which the above-described control gate electrode CG or the gate electrode GE intersects. After forming the fins FA and FB, the hard mask film 5 is removed.

Next, a forming process of the element isolation films STM and STL (Step S4) will be described.

Figure 7:
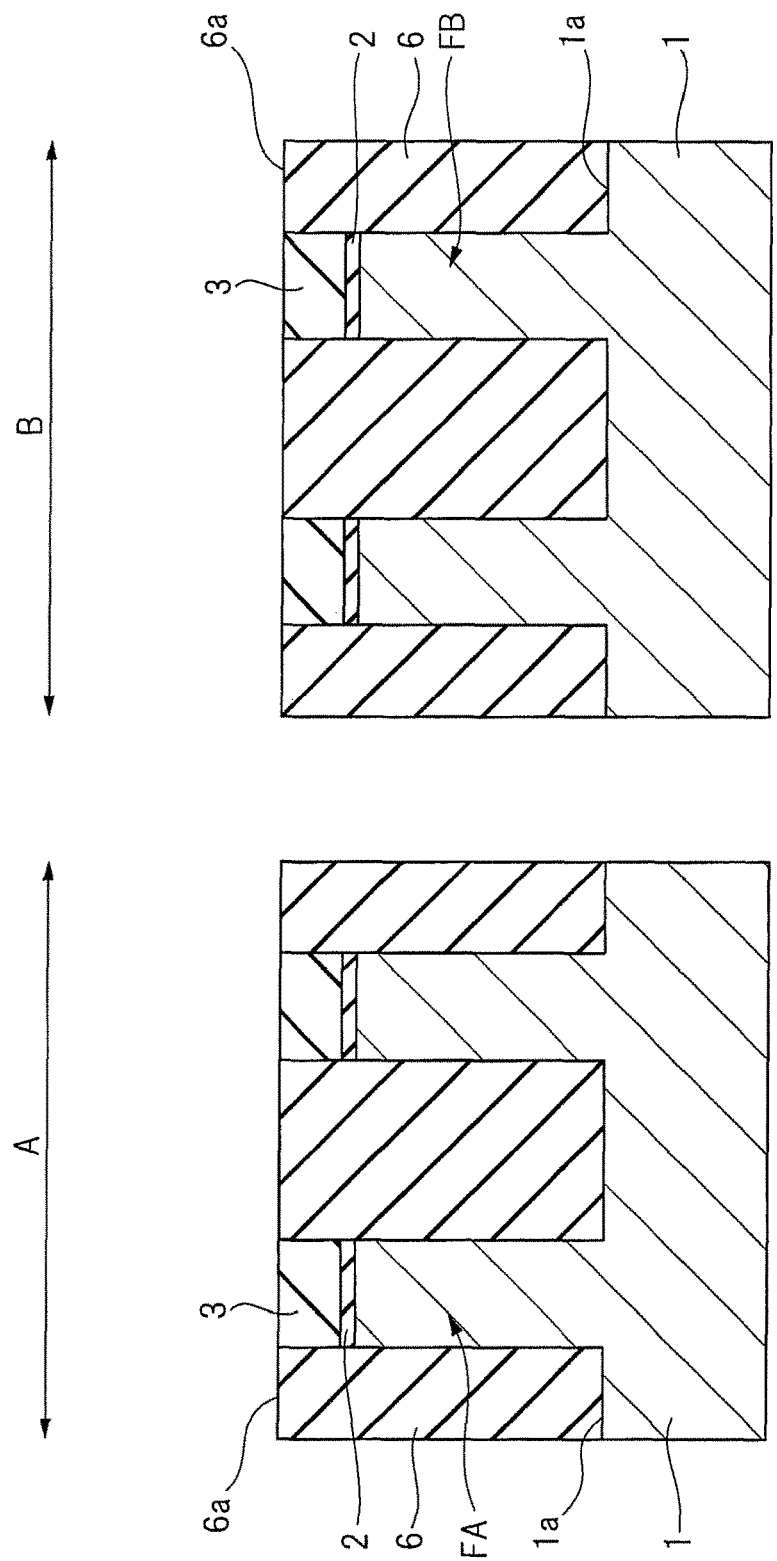
FIG. 7 is a cross-sectional view illustrating the main portion of the semiconductor device in the manufacturing process subsequent to FIG. 6.

An insulation film made of a silicon oxide film and the like is deposited over the semiconductor substrate 1 so as to completely embed the fins FA and FB and the insulation films 2 and 3 and is subjected to chemical mechanical polishing (CMP) to expose a main surface of the insulation film 3. Thus, an insulation film 6 having a uniform main surface 6a is formed over the main surface 1a of the semiconductor substrate 1 as illustrated in FIG. 7. After forming the insulation film 6, the insulation films 3 and 2 are removed. Only the insulation film 3 may be removed.

Figure 8:
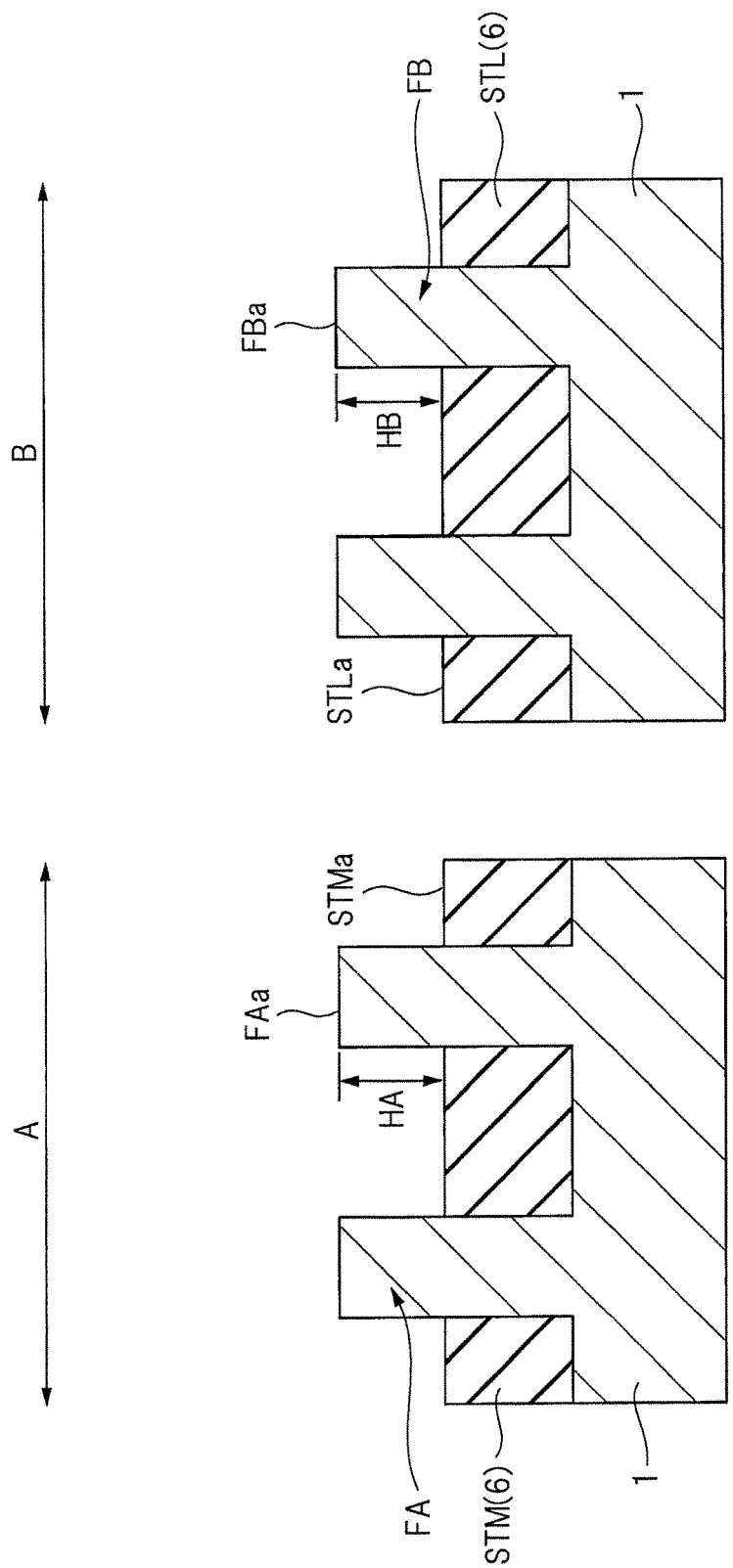
FIG. 8 is a cross-sectional view illustrating the main portion of the semiconductor device in the manufacturing process subsequent to FIG. 7.

Next, as illustrated in FIG. 8, the insulation film 6 is subjected to etching, the main surface 6a of the insulation film 6 is set back (set lower) in the height direction, and then, a part of the side surfaces and the main surfaces of the fins FA and FB are exposed. Thus, the element isolation film STM is formed at the lower portion of the fin FA in the memory cell section A, and the element isolation film STL is formed at the lower portion of the fin FB in the logic section B. Here, since the set-back amount of the insulation film 6 in the memory cell section A is equal to that in the logic section B, an exposure height of the fin FA is equal to that of the fin FB. A height HA of the fin FA in the memory cell section A is a distance from a main surface (upper surface, front surface) STMa of the element isolation film STM to the main surface FAa of the fin FA, and a height HB of the fin FB in the logic section B is a distance from a main surface (upper surface, front surface) STLa of the element isolation film STL to the main surface FBa of the fin FB. The height HB of the fin FB is equal to that of the fin FA. Thus, the forming process of the element isolation films STM and STL is completed (Step S4).

Next, a manufacturing process of the memory cell MC and the transistor Tr will be described in FIGS. 9 to 22. In FIGS. 9 to 22, the memory cell sections A1, A2, and A3 and the logic sections B1 and B2 are illustrated in the same manner as FIG. 3.

Figure 9:
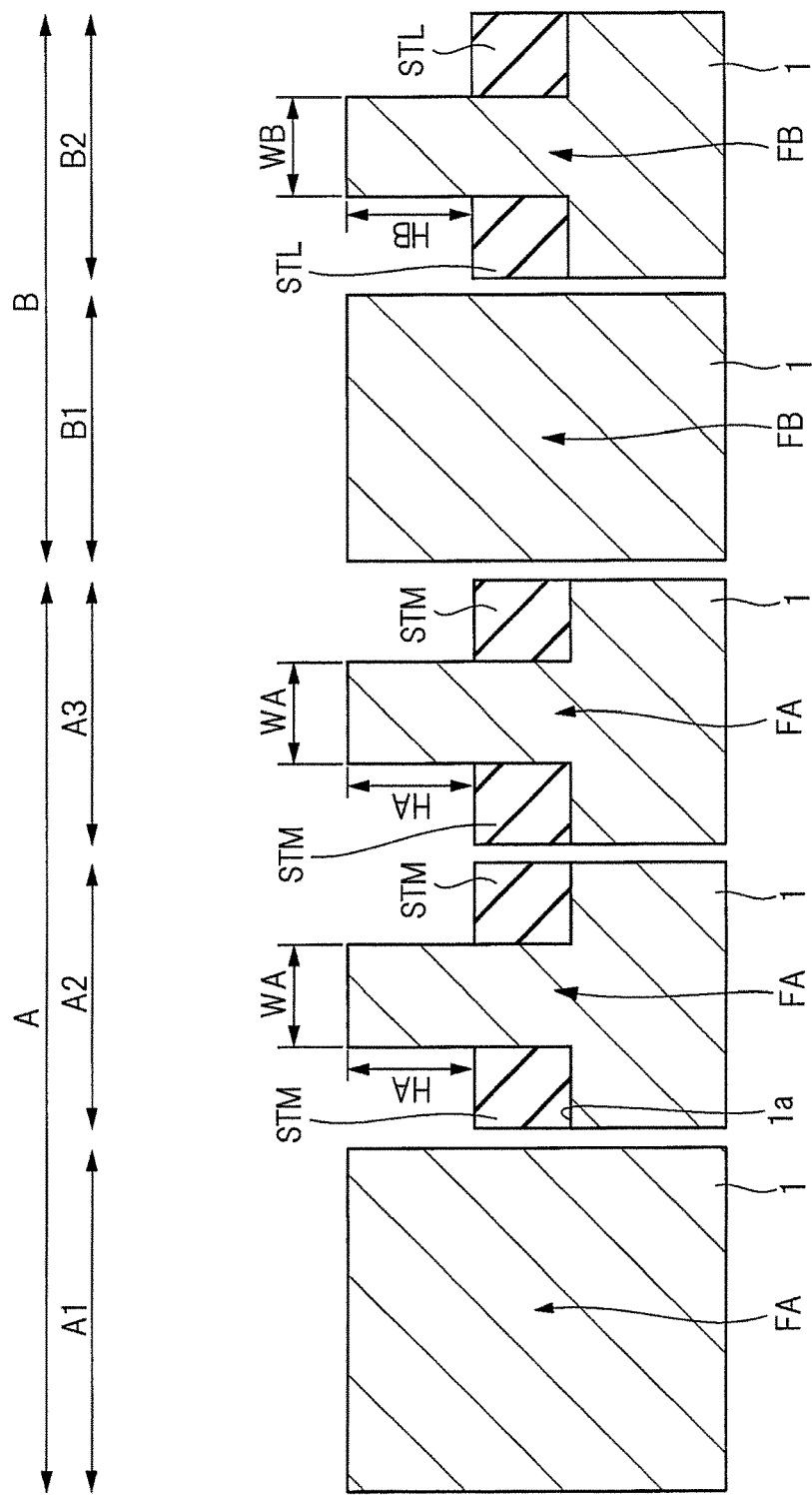
FIG. 9 is a cross-sectional view illustrating the main portion of the semiconductor device in a manufacturing process according to the embodiment.

As illustrated in FIG. 9, the fins FA are prepared in the memory cell sections A1, A2, and A3, and the fins FB are prepared in the logic sections B1 and B2. The width of the fin FA is equal to the width WB of the fin FB (WA=WB), and the height HA of the fin FA is equal to the height HB of the fin FB (HA=HB). Note that the p-type wells PW1 and PW2 illustrated in FIG. 3 are formed before Step S5 described below after performing the forming process of the element isolation films STM and STL illustrated in FIG. 8 (Step S4).

Figure 10:
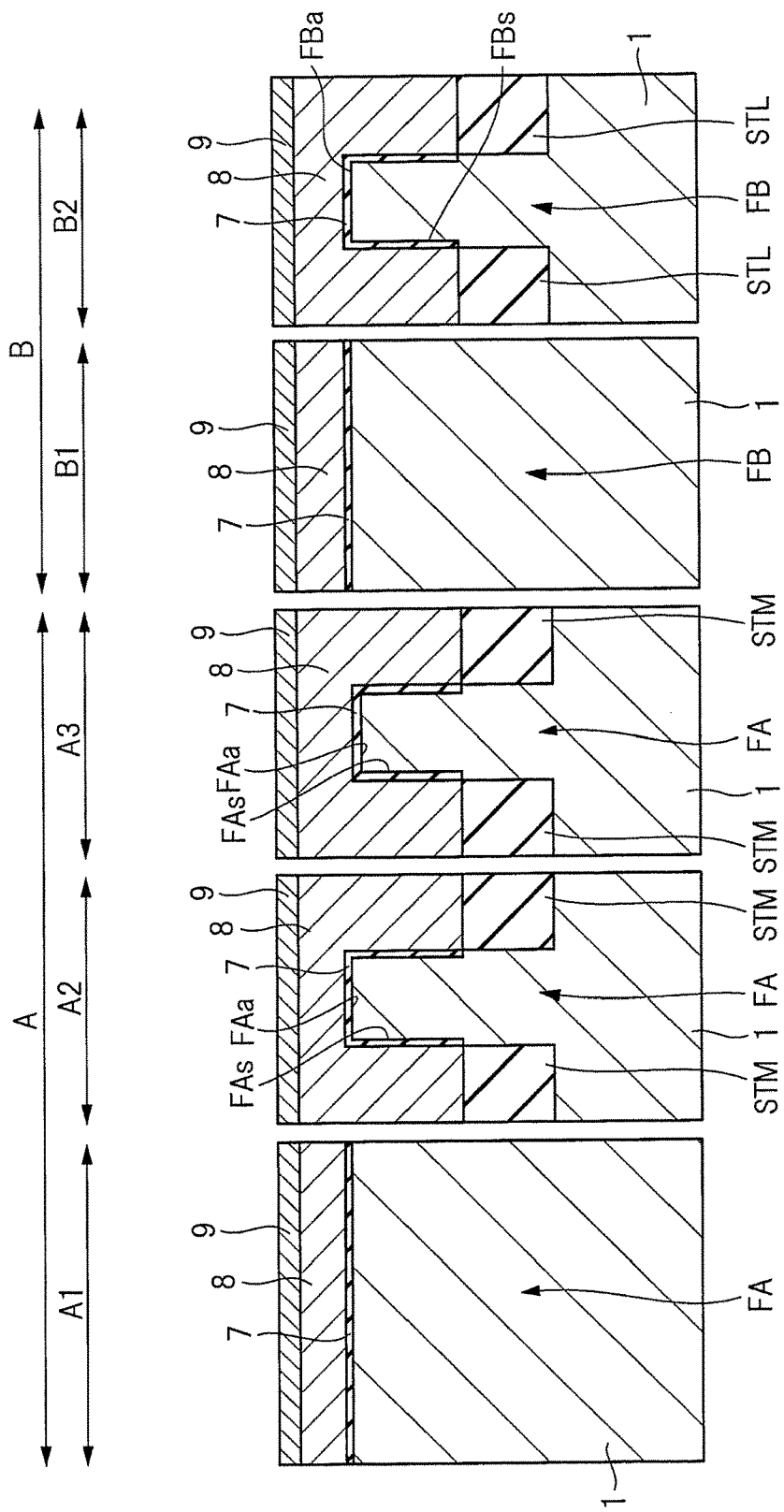
FIG. 10 is a cross-sectional view illustrating the main portion of the semiconductor device in the manufacturing process subsequent to FIG. 9.

FIG. 10 is a diagram illustrating a forming process of an insulation film 7, a conductor film 8, and an insulation film 9 (Step S5). First, the insulation film 7 is formed over each of the main surfaces of FAa and FBa and the side surfaces FAs and FBs of the fins FA and FB. The insulation film 7 is made of a silicon oxide film formed by thermally oxidizing the main surfaces of FAa and FBa and the side surfaces FAs and FBs of the fins FA and FB and having a film thickness of about 2 nm. Next, the conductor film 8 having a film thickness equal to or higher than the height of the fins FA and FB is deposited over the insulation film 7 and subjected to the CMP, and accordingly, the conductor film 8 having a flat main surface is formed. Next, the insulation film 9 is deposited over the main surface of the conductor film 8. The conductor film 8 is made of a polysilicon film (silicon film), and the insulation film 9 is made of a silicon nitride film. Meanwhile, in the CMP process of the conductor film 8, it is important that the conductor film 8 remains over the main surfaces of the fins FA and FB.

Figure 11:
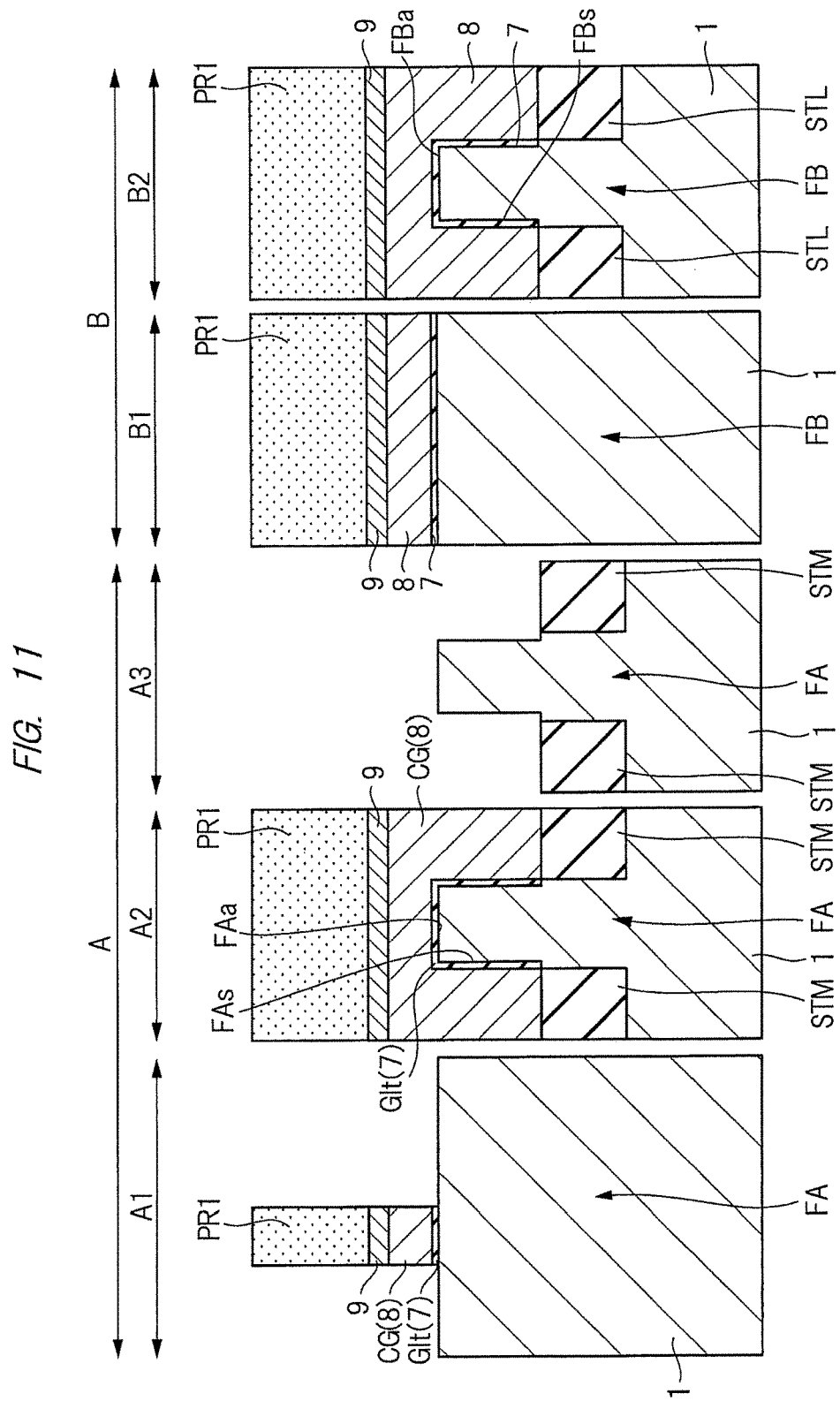
FIG. 11 is a cross-sectional view illustrating the main portion of the semiconductor device in the manufacturing process subsequent to FIG. 10.

FIG. 11 is a diagram illustrating a forming process of the control gate electrode CG (Step S6). A resist film PR1 is selectively formed over the insulation film 9. The resist film PR1 covers a forming region of the control gate electrode CG in the memory cell section A and has a pattern to expose regions other than this covered region. Moreover, the resist film PR1 has a pattern to cover the logic section B. The insulation film 9 and the conductor film 8 are subjected to dry etching to remove the insulation film 9 and the conductor film 8 in the region exposed from the resist film PR1, and accordingly, the control gate electrode CG is formed. The insulation film 7 is processed by dry etching or by a subsequent cleaning process to form the gate insulation film GIt under the control gate electrode CG. Note that, in the memory cell section A3, the insulation film 9, the conductor film 8, and the insulation film 7 are removed, and the main surface FAa and the side surfaces FAs of the fin FA are exposed. Note that the resist film PR1 is removed after the insulation film 9 is patterned or the insulation film 9 and the conductor film 8 are patterned.

Figure 12:
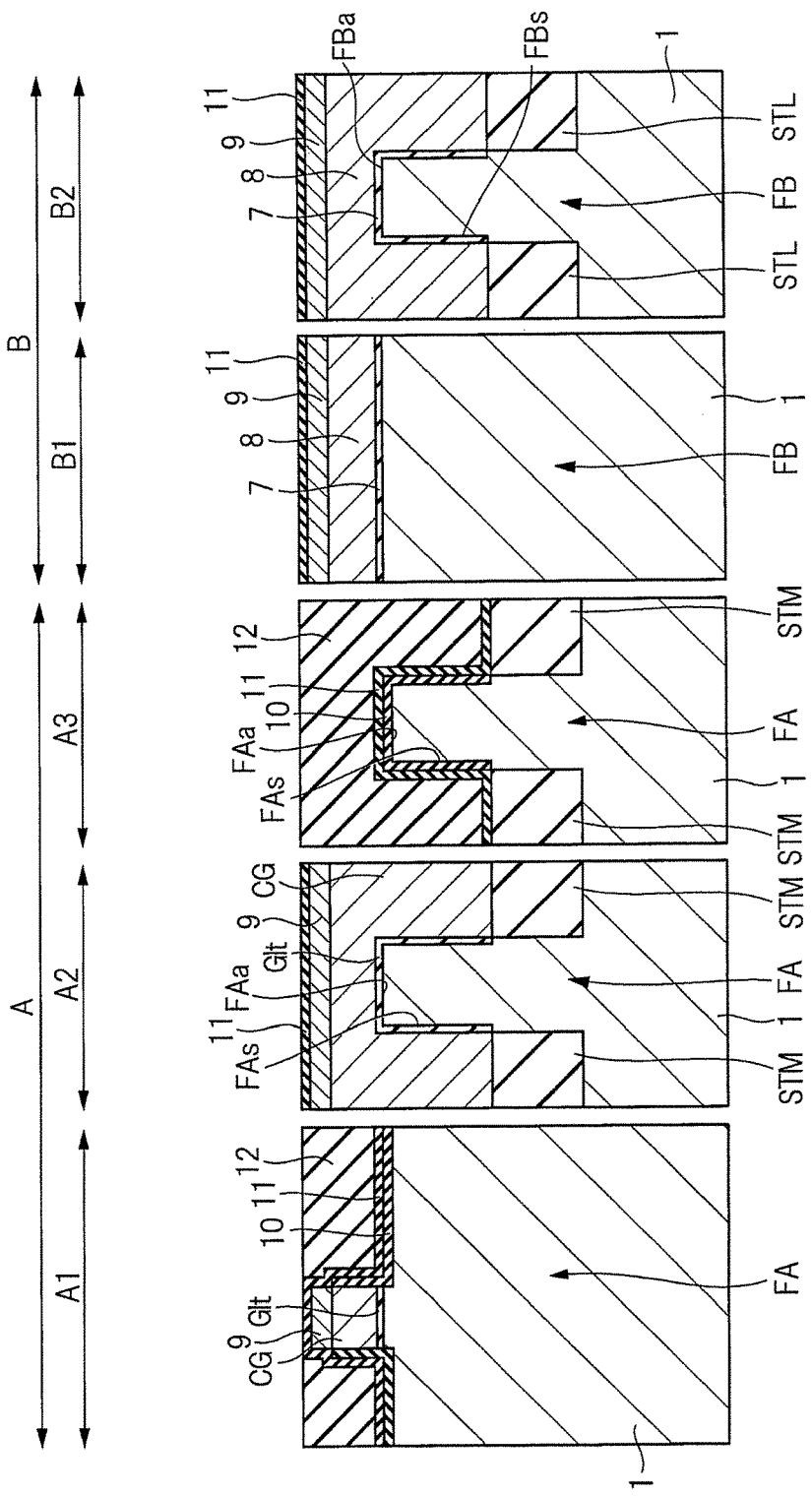
FIG. 12 is a cross-sectional view illustrating the main portion of the semiconductor device in the manufacturing process subsequent to FIG. 11.

FIG. 12 is a diagram illustrating a forming process of insulation films 10 and 11 (Step S7). First, the insulation films 10 and 11 are sequentially formed over the main surface FAa and the side surfaces FAs of the fin FA exposed from the control gate electrode CG. The insulation film 10 is a silicon oxide film formed by thermally oxidizing the main surface FAa and the side surfaces FAs of the fin FA and has a film thickness of 4 nm which is thicker than the film thickness of the gate insulation film GIt. Next, the insulation film 11 is made of a silicon nitride film and has a film thickness of 7 nm. Here, the side surfaces of the control gate electrode CG and the gate insulation film GIt are covered with the insulation film 11.

Moreover, FIG. 12 is a diagram illustrating apart of a forming process of the pad insulation film PAD described below (Step S8). In the memory cell section A3, an insulation film 12 having a film thickness equal to or higher than the height of the fin FA is formed so as to cover the main surface FAa and the side surfaces FAs of the fin FA. The insulation film 12 is made of, for example, a silicon oxide film. In order to form the insulation film 12, the silicon oxide film is deposited over the insulation film 11 and subjected to CMP polishing, the insulation film 11 formed over the control gate electrodes CG in the memory cell sections A1 and A2 is exposed, and accordingly, the insulation film 12 is formed. In other words, in this CMP polishing process, polishing is stopped at the time of detecting exposure of the insulation film 11.

Figure 13:
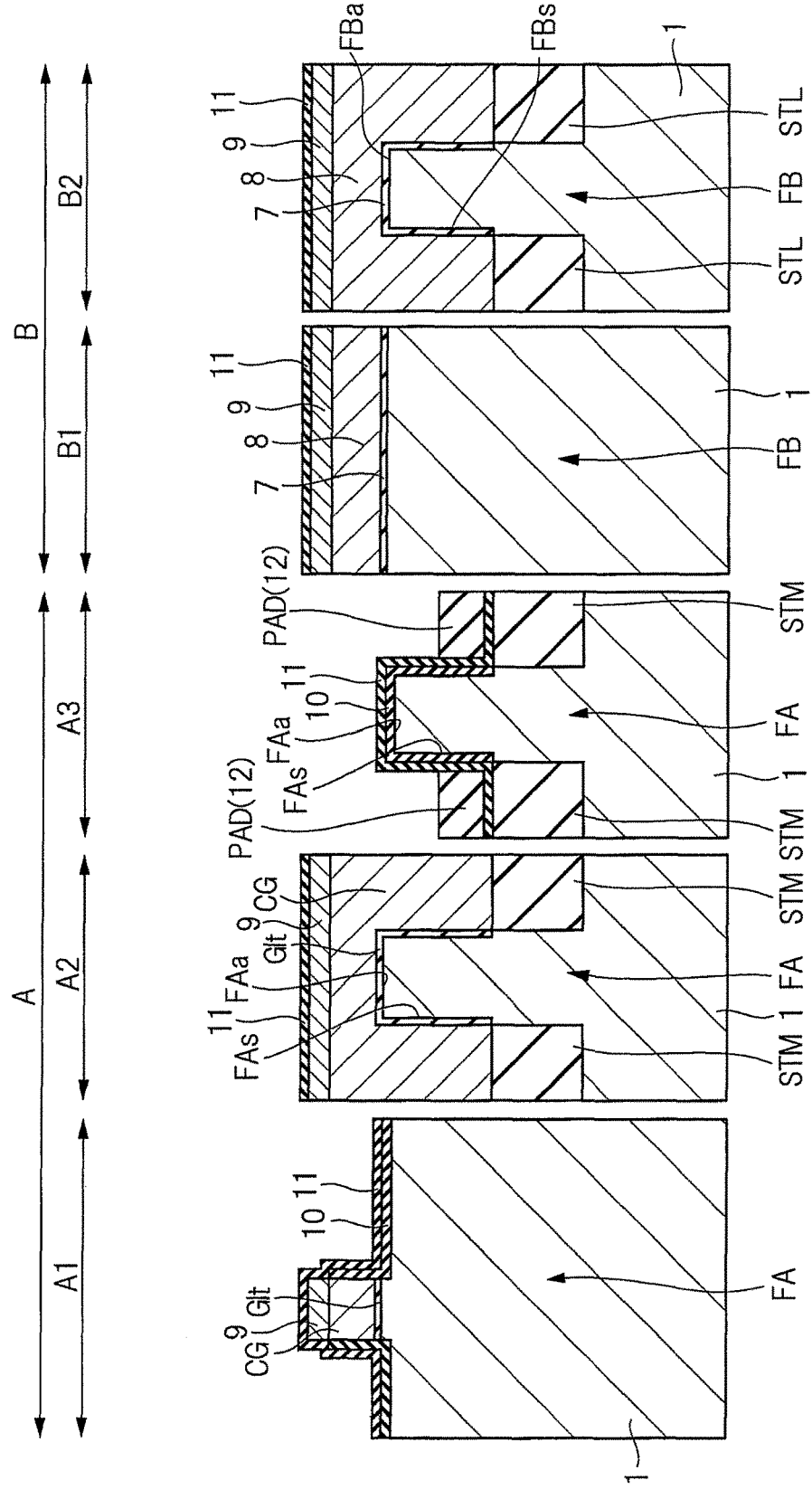
FIG. 13 is a cross-sectional view illustrating the main portion of the semiconductor device in the manufacturing process subsequent to FIG. 12.

FIG. 13 is a diagram illustrating apart of the forming process of the pad insulation film PAD subsequent to FIG. 12 (Step S8). The insulation film 12 is subjected to isotropic etching, and accordingly, the insulation film 12 over the main surface FAa of the fin FA is removed. Moreover, the isotropic etching is continued, and the insulation film 12 is made to selectively remain over the element isolation film STM, thereby forming the pad insulation film PAD. Preferably, the pad insulation film PAD has a film thickness equal to or higher than a half of the height of the fin FA. In other words, in the height direction, an upper half portion of the fin FA exposed from the element isolation film STM is exposed from the pad insulation film PAD. Note that, in the logic section B, no pad insulation film PAD is formed because the insulation film 12 is removed from the entire region. Furthermore, after forming the pad insulation film PAD, a resist film (not illustrated) having a slightly enlarged pattern of the pattern of the memory gate electrode MG illustrated in FIG. 2 is formed, and the insulation film 12 can be removed in a region interposed between the adjacent fins FA and between the adjacent control gate electrodes CG and a region interposed between the adjacent fins FA and between the adjacent memory gate electrodes MG illustrated in FIG. 2.

In the memory cell section A1, although the insulation film 12 over the fin FA is all removed in the forming process of the pad insulation film PAD, since the side surfaces of the control gate electrode CG and the gate insulation film GIt are covered with the insulation film 11 made of the silicon nitride film, the gate insulation film GIt can be prevented from side etching.

Figure 14:
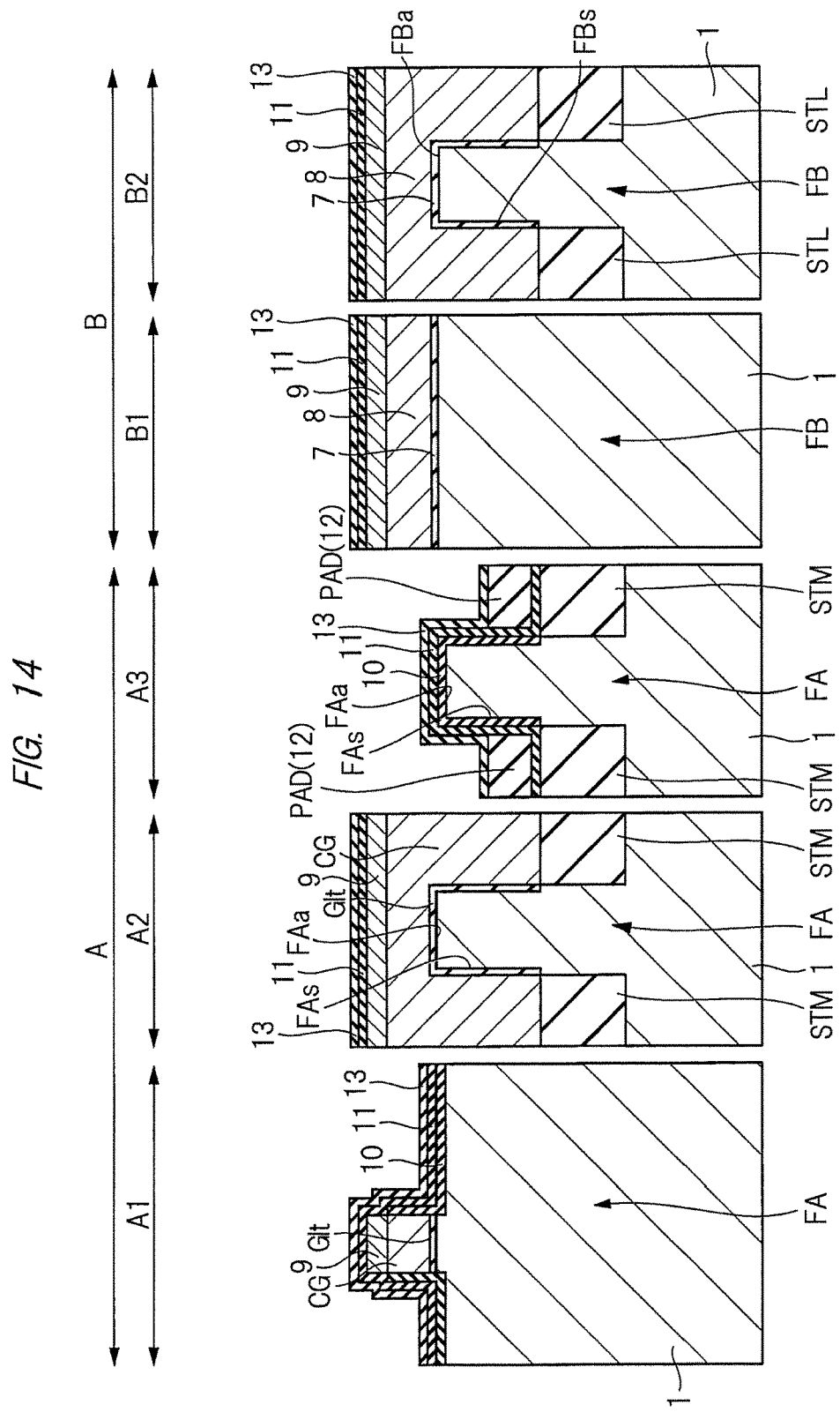
FIG. 14 is a cross-sectional view illustrating the main portion of the semiconductor device in the manufacturing process subsequent to FIG. 13.

FIG. 14 is a diagram illustrating a forming process of an insulation film 13 (Step S9). The insulation film 13 is formed over each of the insulation film 11 and the pad insulation film PAD in the memory cell section A3. The insulation film 13 is made of, for example, an oxynitride silicon film and has a film thickness of 9 nm.

Figure 15:
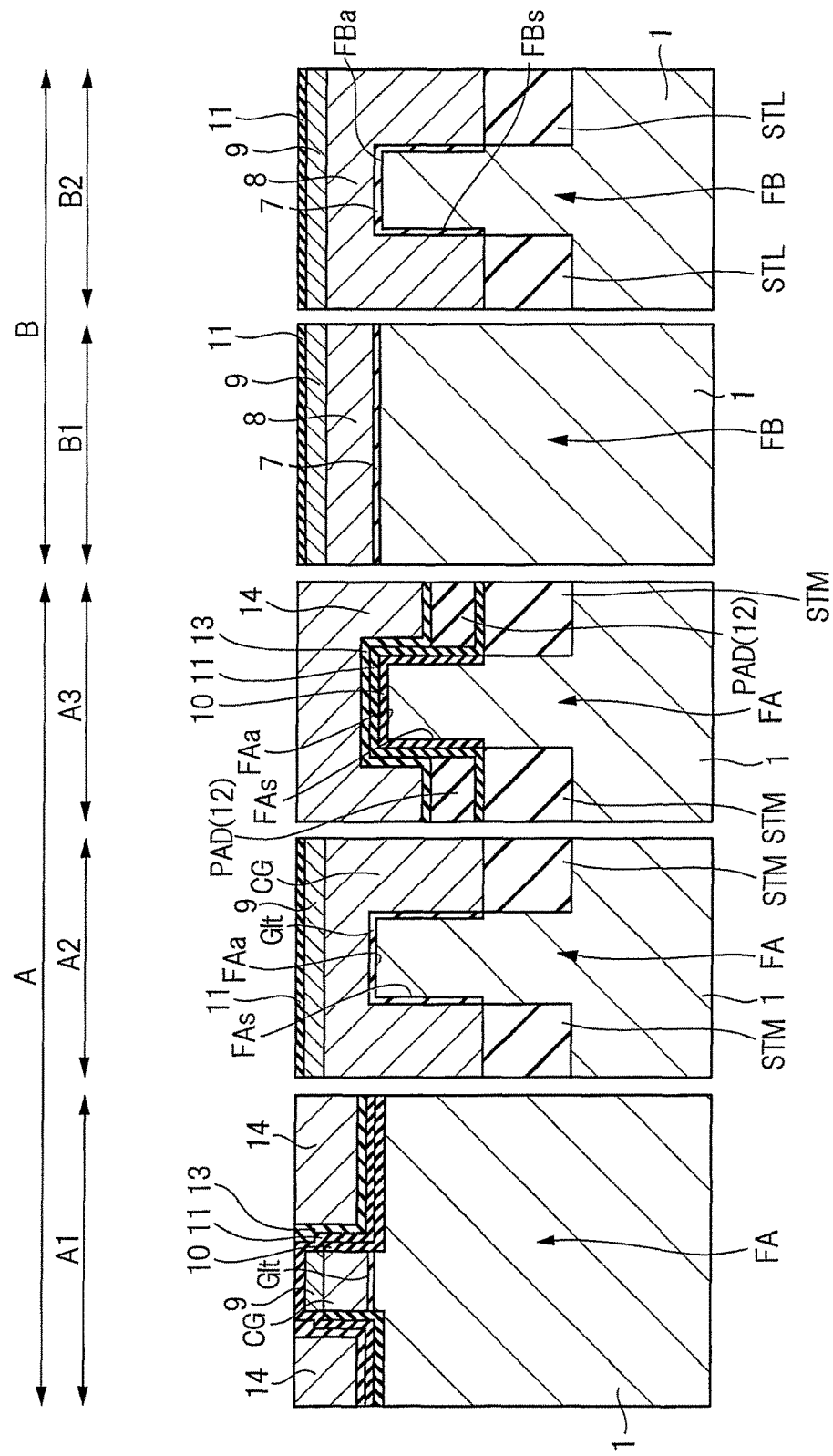
FIG. 15 is a cross-sectional view illustrating the main portion of the semiconductor device in the manufacturing process subsequent to FIG. 14.

FIG. 15 is a diagram illustrating a part of a forming process of the memory gate electrode MG described below (Step S10). A conductor film 14 is formed over the insulation film 13. As for the conductor film 14, the conductor film 14 having a film thickness equal to or higher than a height of a stacked film body of the control gate electrode CG and the insulation film 9 and the height of the fin FA in the memory cell section A3 is deposited and then subjected to the CMP, and the insulation film 11 above the control gate electrode CG is exposed. Accordingly, the conductor film 14 is selectively formed in the region exposed from the control gate electrode CG in the memory cell section A as illustrated in FIG. 15. Note that the conductor film 14 is made of a polysilicon film (silicon film). Note that, in the logic section B, the conductor film 14 is removed, and the insulation film 11 is exposed. In the memory cell section A1, the conductor film 14 is formed over each of side walls of the control gate electrode CG and over the fin FA via the insulation films 10, 11, and 13. Additionally, in the memory cell section A3, the conductor film 14 is formed over the main surface FAa and the side surfaces FAs of the fin FA via the insulation films 10, 11, and 13.

Figure 16:
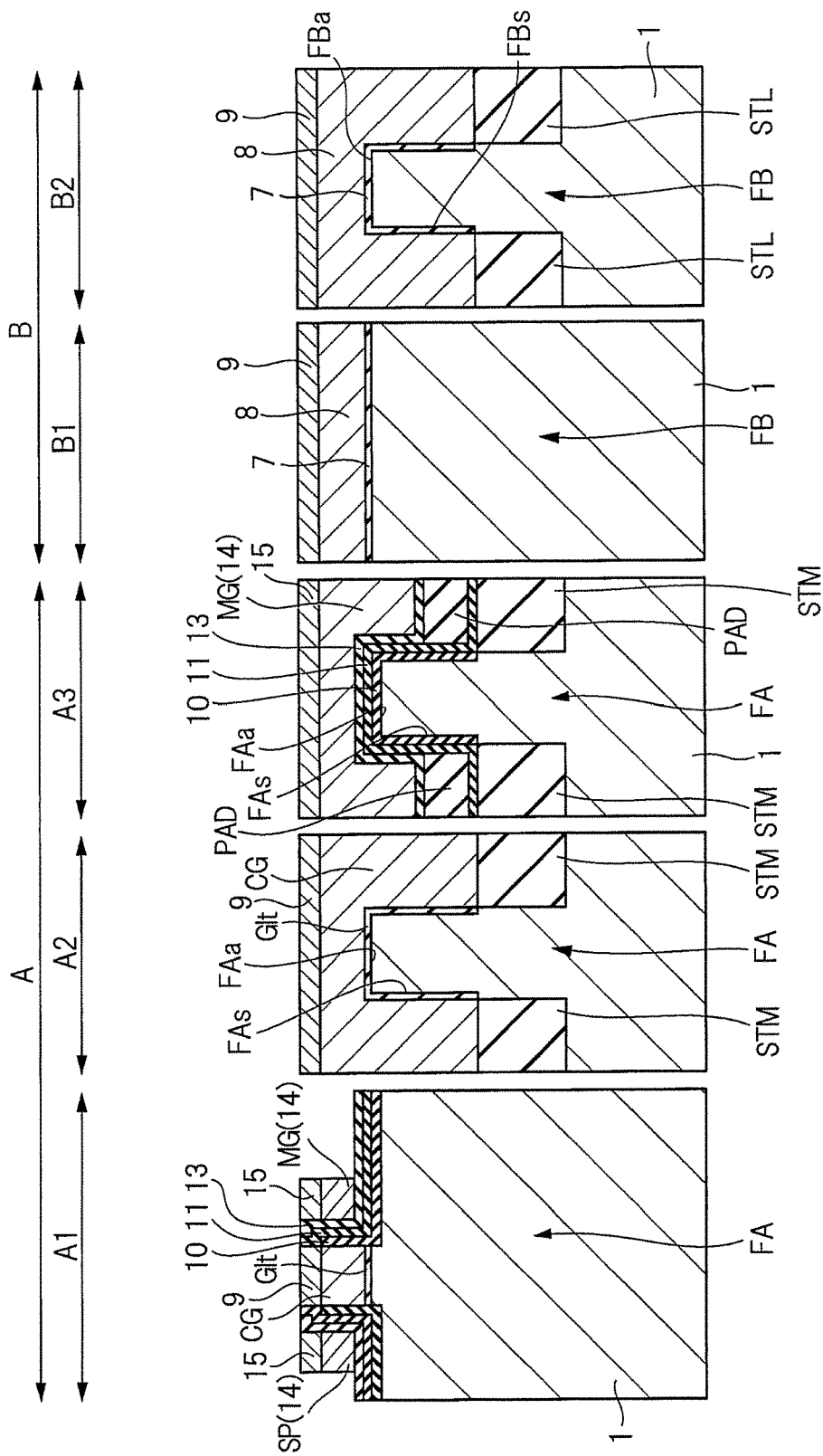
FIG. 16 is a cross-sectional view illustrating the main portion of the semiconductor device in the manufacturing process subsequent to FIG. 15.

FIG. 16 is a diagram illustrating apart of the forming process of the memory gate electrode MG described below (Step S10). First, the conductor film 14 is subjected to etching back (isotropic etching), and a height of a main surface of the conductor film 14 is lowered. After the etch-back process, the main surface of the conductor film 14 has a height substantially equal to a main surface of the control gate electrode, for example. Next, after depositing silicon nitride film over the side walls of the insulation films 9 and 11 over the control gate electrode CG and over the conductor film 14, the silicon nitride film is subjected to anisotropic dry etching, and a mask film 15 is formed over side walls of the insulation film 9 over the control gate electrode CG. In the anisotropic dry etching to form the mask film 15, the insulation film 11 above the control gate electrode CG and in the logic section B is removed. Next, the conductor film 14 exposed from the mask film 15 is removed by etching to form the memory gate electrode MG or a spacer SP over each of the side walls of the control gate electrode CG via the insulation films 10, 11, and 13. Note that the spacer SP has the same structure as the memory gate electrode MG, but a name different from the memory gate electrode MG is denoted because the spacer will be removed in a process described below.

Figure 17:
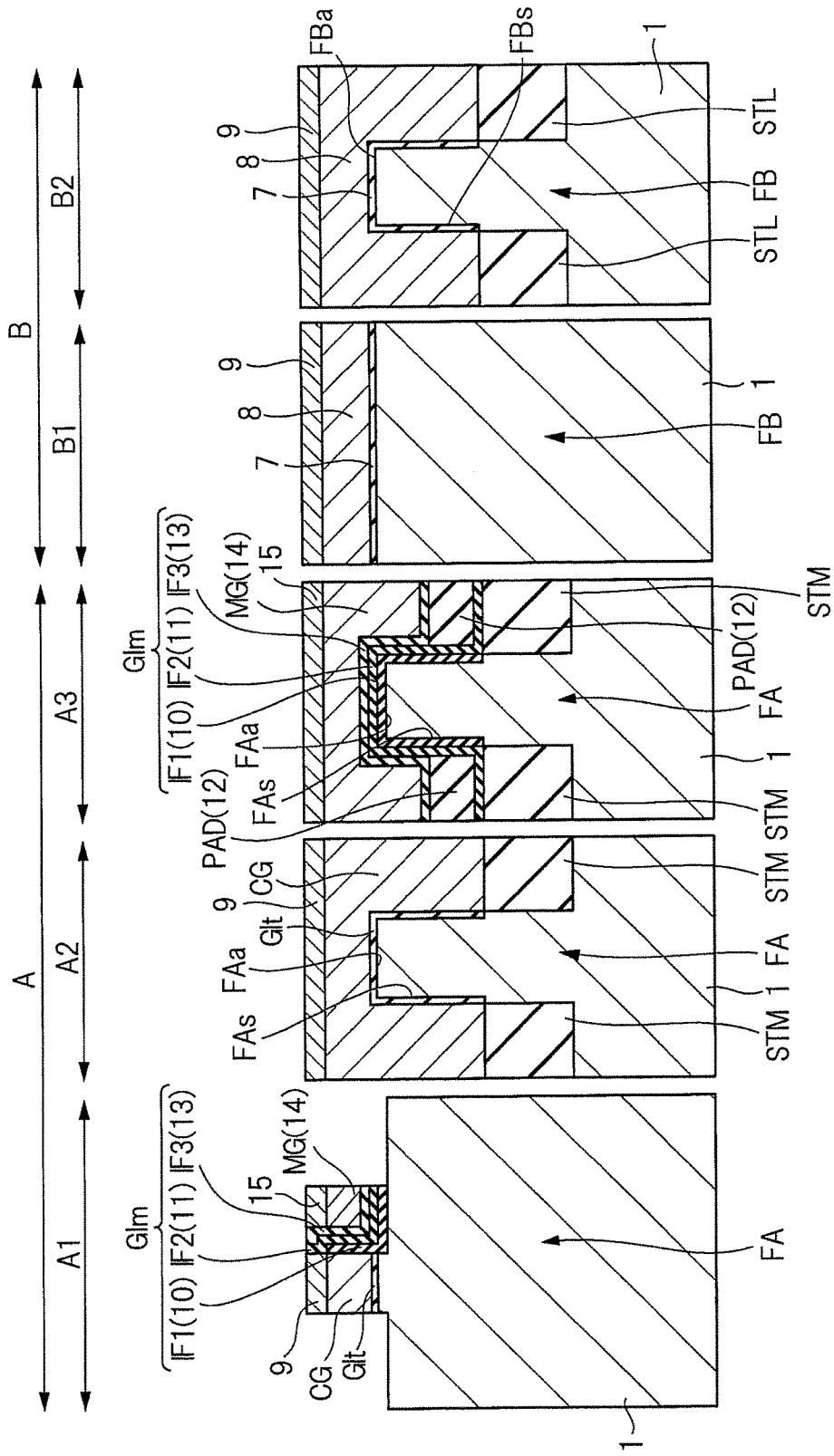
FIG. 17 is a cross-sectional view illustrating the main portion of the semiconductor device in the manufacturing process subsequent to FIG. 16.

FIG. 17 is a diagram illustrating a removing process of the spacer SP and a forming process of the gate insulation film GIm (Step S11). First, the mask film 15 over the spacer SP and the spacer SP illustrated in FIG. 16 are removed by, for example, wet etching through use of a resist film (not illustrated) which covers the memory gate electrode MG and exposes the spacer SP. Subsequently, the insulation films 13, 11, and 10 in the region exposed from the memory gate electrode MG are removed by, for example, wet etching, and the insulation films 13, 11, and 10 are made to selectively remain under the memory gate electrode MG (more specifically, between the memory gate electrode MG and the fin FA), thereby forming the gate insulation film GIm formed of the insulation films IF3, IF2, and IF1. Note that the gate insulation film GIm is formed not only between the main surface FAa of the fin FA and the memory gate electrode MG but also between the control gate electrode CG and the memory gate electrode MG. Furthermore, as illustrated in FIG. 17, the gate insulation film GIm is formed along each of the main surface FAa and the side surfaces FAs of the fin FA.

Figure 18:
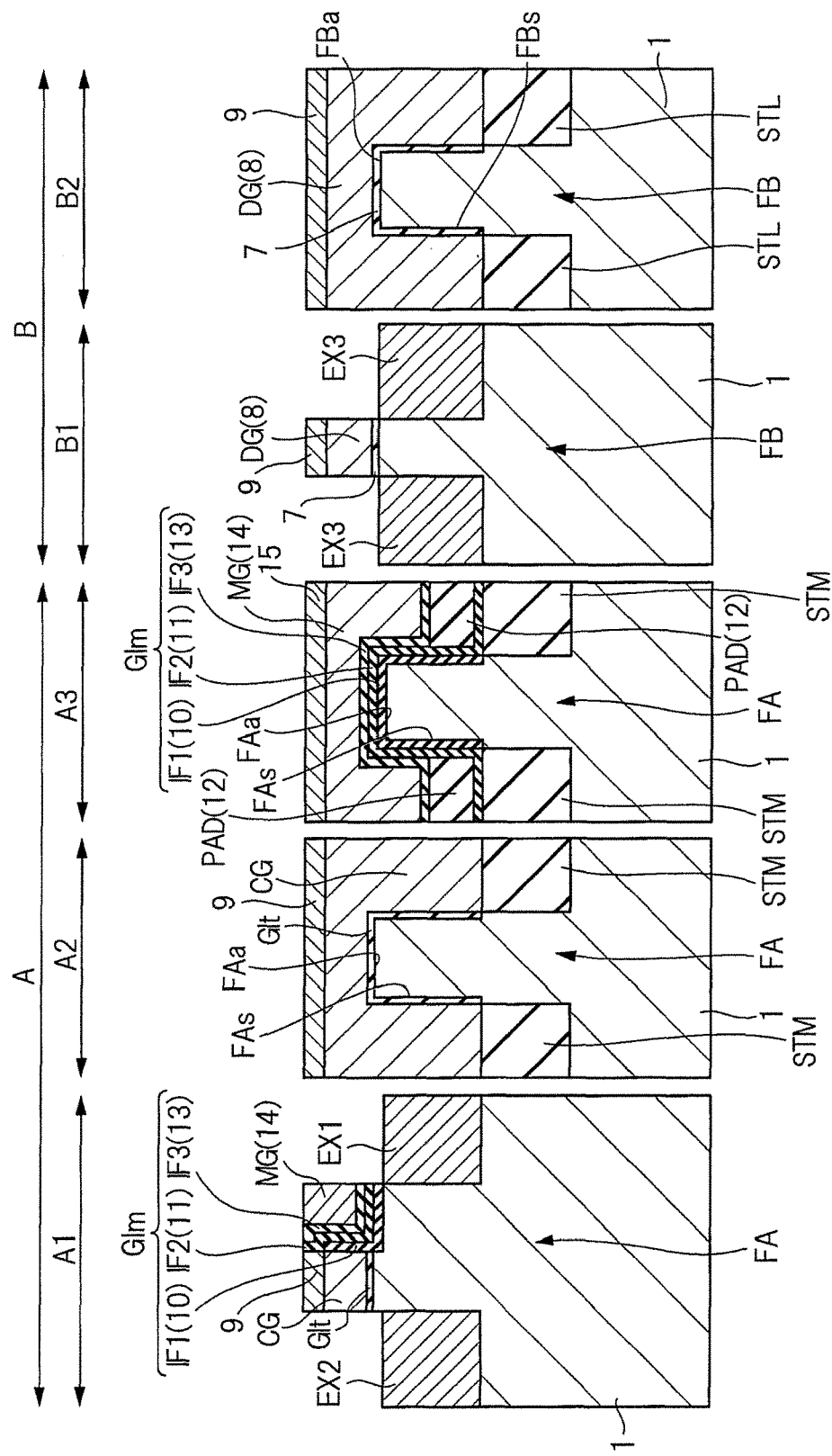
FIG. 18 is a cross-sectional view illustrating the main portion of the semiconductor device in the manufacturing process subsequent to FIG. 17.

FIG. 18 is a diagram illustrating a forming process of a dummy gate DG and n$^-$-type semiconductor regions (impurity diffusion layers) EX1, EX2, and EX3 (Step S12). First, in the logic section B, the dummy gate DG formed of the conductor film 8 is formed by patterning the insulation film 9 and the conductor film 8. The insulation film 9 over the dummy gate DG and the insulation film 7 under the dummy gate DG also have the same plane pattern as that of the dummy gate DG.

Next, by introducing n-type impurities such as arsenic (As) or phosphorus (P) into the fins FA and FB by the ion implantation, the n$^-$-type semiconductor regions EX1 and EX2 are formed in the fin FA, and the n$^-$-type semiconductor region EX3 is formed in the fin FB. The n$^-$-type semiconductor regions EX1 and EX2 are formed in a self-aligned manner relative to the control gate electrode CG and the memory gate electrode MG. More specifically, since the n-type impurities are implanted into the main surface and the side surfaces of the fin FA exposed from the control gate electrode CG and the memory gate electrode MG, the n$^-$-type semiconductor regions EX1 and EX2 are formed on both sides of the control gate electrode CG and the memory gate electrode MG so as to interpose the control gate electrode CG and the memory gate electrode MG. Since the impurities are diffused by heat processing after the ion implantation, the n$^-$-type semiconductor region EX1 partly overlaps with the memory gate electrode MG, and the n$^-$-type semiconductor region EX2 partly overlaps with the control gate electrode CG.

The n$^-$-type semiconductor region EX3 is formed in a self-aligned manner relative to the dummy gate DG. More specifically, since the n-type impurities are implanted into the main surface and the side surfaces of the fin FB exposed from the dummy gate DG, the n$^-$-type semiconductor regions EX3 are formed on both sides of the dummy gate DG so as to interpose the dummy gate DG. Since the impurities are diffused by heat processing after the ion implantation, the n$^-$-type semiconductor region EX3 partly overlaps with the dummy gate DG.

Figure 19:
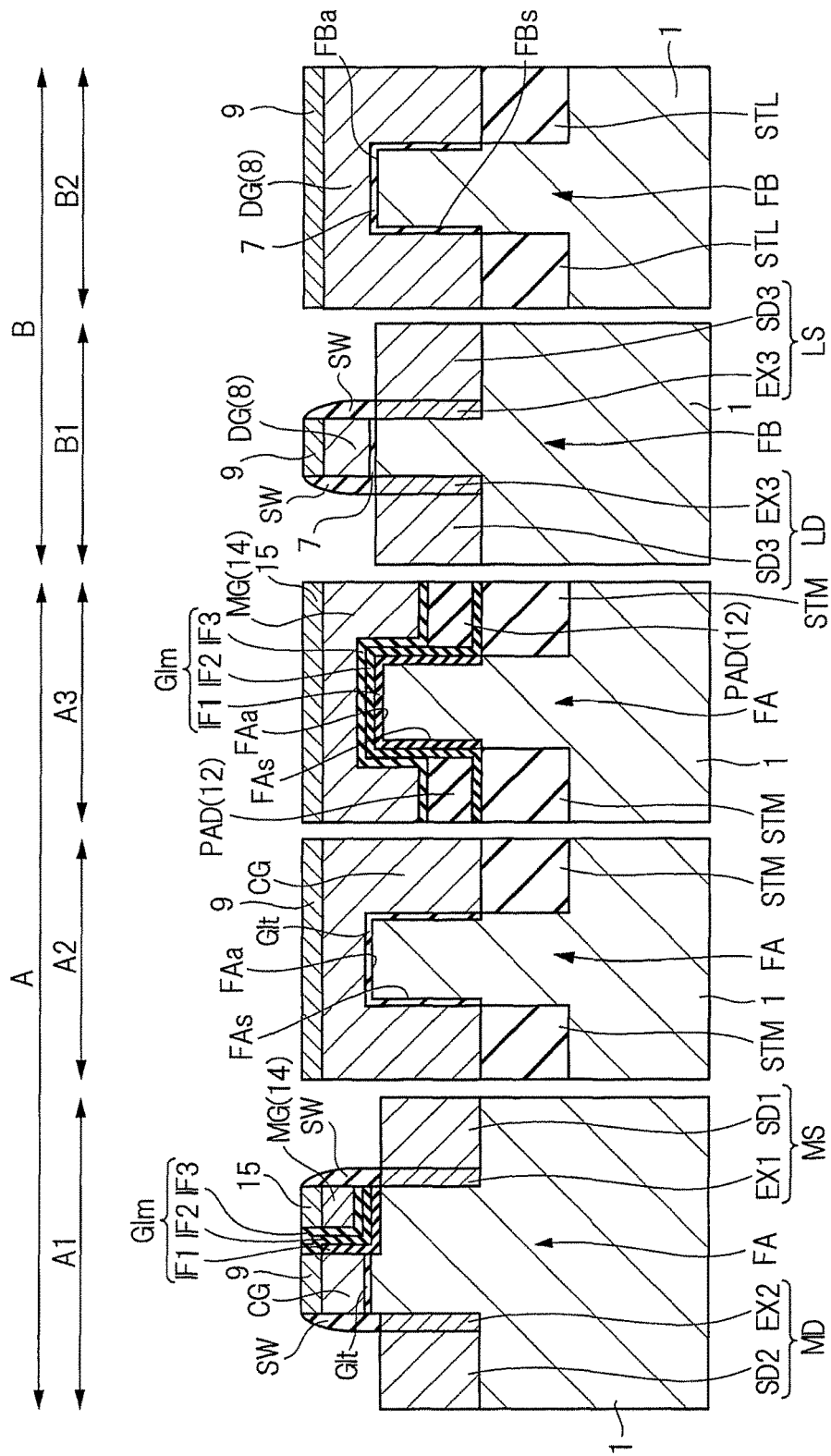
FIG. 19 is a cross-sectional view illustrating the main portion of the semiconductor device in the manufacturing process subsequent to FIG. 18.

FIG. 19 is a diagram illustrating a forming process of the side wall spacer (side wall or side wall insulation film) SW and n$^+$-type semiconductor regions (impurity diffusion layers) SD1, SD2, and SD3 (Step S13). An insulation film made of a silicon oxide film, a silicon nitride film, or a stacked film formed thereof is deposited over the semiconductor substrate 1 so as to cover the main surfaces FAa and FBa of the fins FA and FB and then is subjected to anisotropic dry etching. Thus, in the memory cell section A1, the side wall spacer SW is formed over each of a side wall of the control gate electrode CG and the insulation film 9 and a side wall of the memory gate electrode MG and the mask film 15. Furthermore, in the logic section B1, the side wall spacers SW are formed over the side walls of the dummy gate DG and the insulation film 9. The insulation films for forming the side wall spacers SW are removed by the above-described anisotropic dry etching in the memory cell sections A2 and A3 and the logic section B2, and the insulation film 9 or the mask film 15 is exposed.

Next, the n-type impurities such as arsenic (As) or phosphorus (P) are introduced into the fin FA by the ion implantation through use of the control gate electrode CG, the memory gate electrode MG, and the side wall spacers SW as masks (ion implantation preventing masks), and accordingly, the n$^+$-type semiconductor regions SD1 and SD2 are formed. Furthermore, at the same time, the impurities such as arsenic (As) or phosphorus (P) are introduced into the fin FB by the ion implantation through use of the dummy gate electrode DG and the side wall spacers SW as the masks (ion implantation preventing masks), and accordingly, the n$^+$-type semiconductor regions SD3 are formed so as to interpose the dummy gate DG.

Thus, the n-type semiconductor region functioning as the source region MS of the memory cell MC is formed by the n⁻-type semiconductor region EX1 and the n⁺-type semiconductor region SD1 having an impurity concentration higher than that of the n⁻-type semiconductor region EX1, and the n-type semiconductor region functioning as the drain region MD of the memory cell MC is formed by the n⁻-type semiconductor region EX2 and the n⁺-type semiconductor region SD2 having an impurity concentration higher than that of the n⁻-type semiconductor region EX2. Furthermore, the n-type semiconductor region functioning as the source region LS and the drain region LD of the transistor Tr in the logic section B is formed by the n⁻-type semiconductor region EX3 and the n⁺-type semiconductor region SD3 having an impurity concentration higher than that of the n⁻-type semiconductor region EX3.

Figure 20:
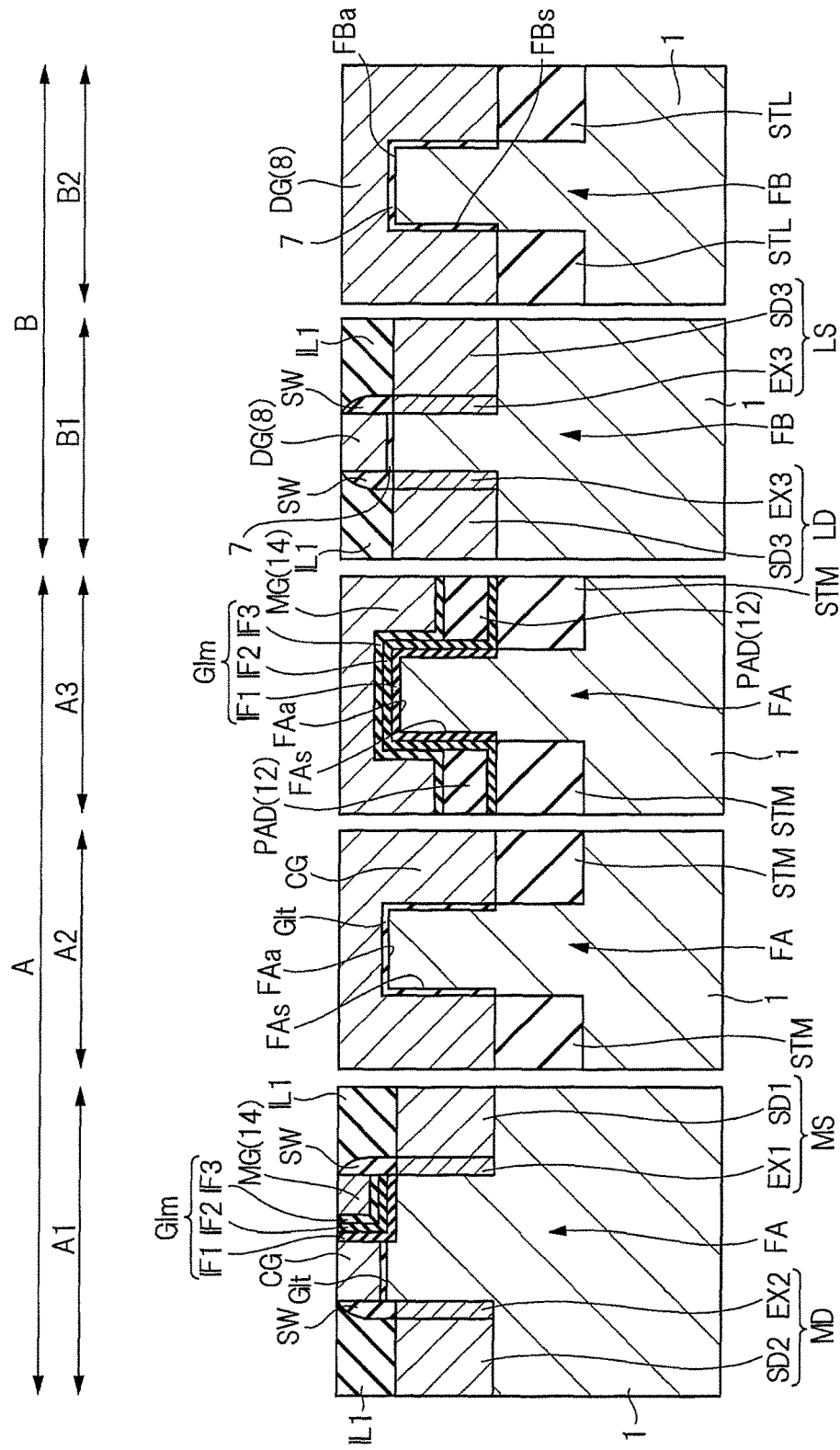
FIG. 20 is a cross-sectional view illustrating the main portion of the semiconductor device in the manufacturing process subsequent to FIG. 19.

FIG. 20 is a diagram illustrating a forming process of the interlayer insulation film IL1 (Step S14). The interlayer insulation film IL1 is formed (deposited) over the semiconductor substrate 1. The interlayer insulation film IL1 is formed of a single film of a silicon oxide film or a stacked film of a silicon nitride film and a silicon oxide film having a film thickness thicker than the silicon nitride film over the silicon nitride film and can be formed by the CVD, for example. Next, the upper surface of the interlayer insulation film IL1 is polished by the CMP (polishing processing), for example. As illustrated in FIG. 20, the respective upper surfaces of the control gate electrode CG, the memory gate electrode MG, and the dummy gate DG are exposed. More specifically, in the polishing processing, the insulation film 9 and the mask film 15 formed over each of the control gate electrode CG, the memory gate electrode MG, and the dummy gate DG are completely removed. As a matter of course, the side walls SW positioned over the side walls of the insulation film 9 and the mask film 15 are partly removed as well.

Figure 21:
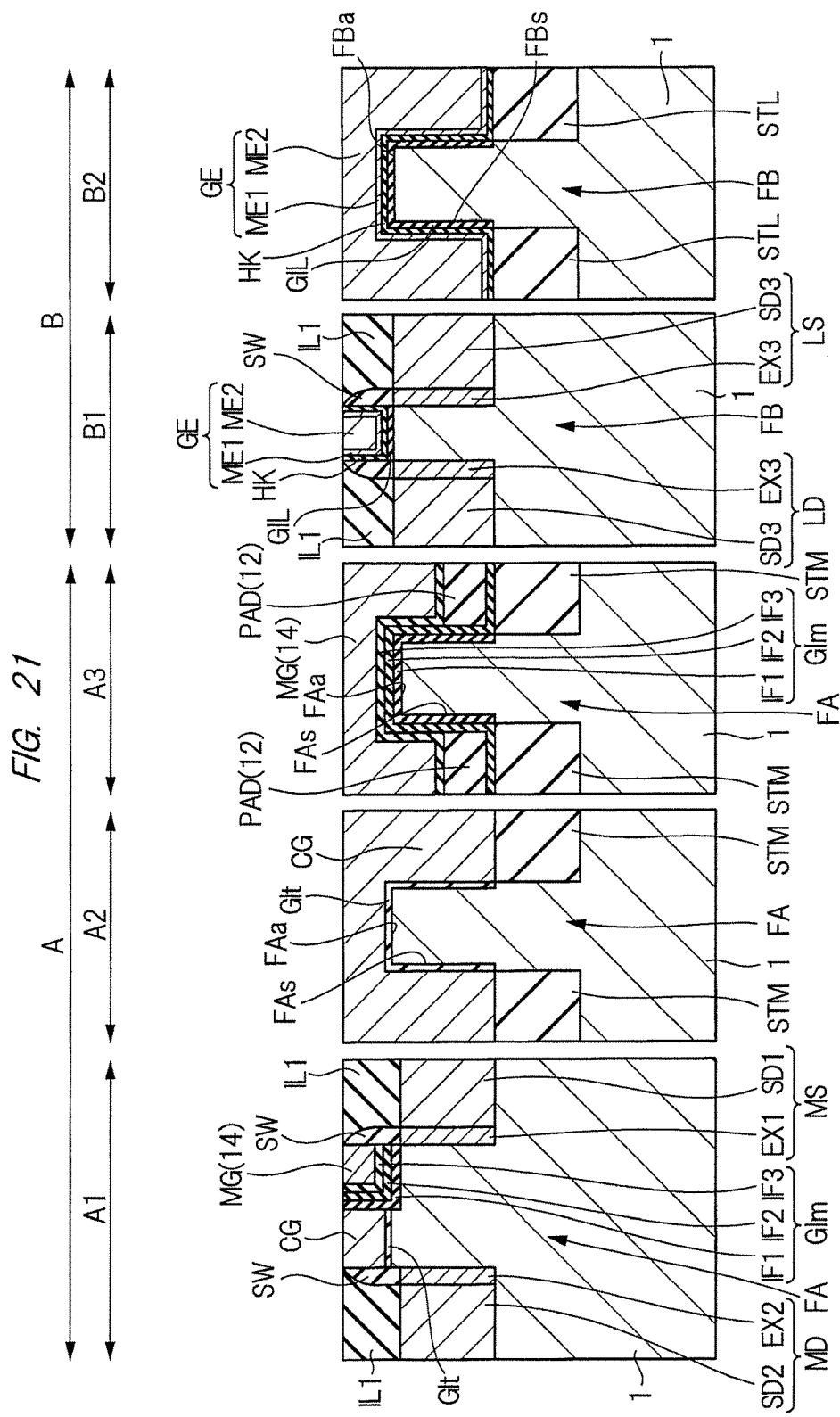
FIG. 21 is a cross-sectional view illustrating the main portion of the semiconductor device in the manufacturing process subsequent to FIG. 20.

FIG. 21 is a diagram illustrating a forming process of the gate insulation film GIL and the gate electrode GE (Step S15). First, a process of removing the exposed dummy gate DG illustrated in FIG. 20 is performed. Since the dummy gate DG is removed, a groove TR1 is formed in the interlayer insulation film IL1. A bottom portion (bottom surface) of the groove TR1 is formed by the upper surface of the insulation film 7, side walls (side surfaces) of the groove TR1 are formed by the side surfaces of the side wall spacers SW (side surfaces that have contacted the dummy gate DG before removing the dummy gate DG).

Next, a forming process of an insulation film HK, a metal film ME1, and a metal film ME2 is performed as illustrated in FIG. 21, in which the insulation film HK, the metal film ME1, and the metal film ME2 are sequentially deposited over the semiconductor substrate 1, more specifically, over the insulation film 7 inside the groove TR1 (over the bottom portion and the side walls). Furthermore, the insulation film HK, the metal film ME1, and the metal film ME2 are subjected to the CMP, and the insulation film HK, the metal film ME1, and the metal film ME2 over the interlayer insulation film IL1 are removed. Thus, a stacking structure of the gate insulation film GIL formed of the insulation film 7, the insulation film HK, the metal film ME1, and the metal film ME2 is selectively formed inside the groove TR1. Here, the insulation film HK is an insulation material film having dielectric constant (relative dielectric constant) higher than silicon nitride, that is, a High-k film (high dielectric constant film). Note that the insulation film 7 may be removed after the removing process of the dummy gate DG, and the gate insulation film GIL may be newly formed over the main surface FBa of the fin FB, and then, the insulation film HK may be formed.

As the insulation film HK, a metal oxide film such as a hafnium oxide film, a zirconium oxide film, an aluminum oxide film, a tantalum oxide film, or a lanthanum oxide film can be used. The insulation film HK can be formed by the atomic layer deposition (ALD) or the CVD.

For example, the metal film ME1 may be a titanium-aluminum (TiAl) film, and the metal film ME2 may be an aluminum (Al) film. Furthermore, threshold voltage of the transistor Tr may be adjusted by interposing a titanium (Ti) film, a titanium nitride (TiN) film, or a stacked film thereof between the metal film ME1 and the metal film ME2.

The insulation film HK is formed over the bottom portion (bottom surface) and the side walls of the groove TR1, and the gate electrode GE has the bottom portion (bottom surface) and the side walls (side surfaces) adjacent to the insulation film HK. The insulation film GIL and the insulation film HK are interposed between the gate electrode GE and the fin FB of the semiconductor substrate 1, and the insulation film HK is interposed between the gate electrode GE and the side wall spacer SW. The gate insulation film GIL and the insulation film HK immediately under the gate electrode GE function as the gate insulation film of the transistor Tr but function as a high dielectric constant gate insulation film because the insulation film HK is a high dielectric constant film.

Figure 22:
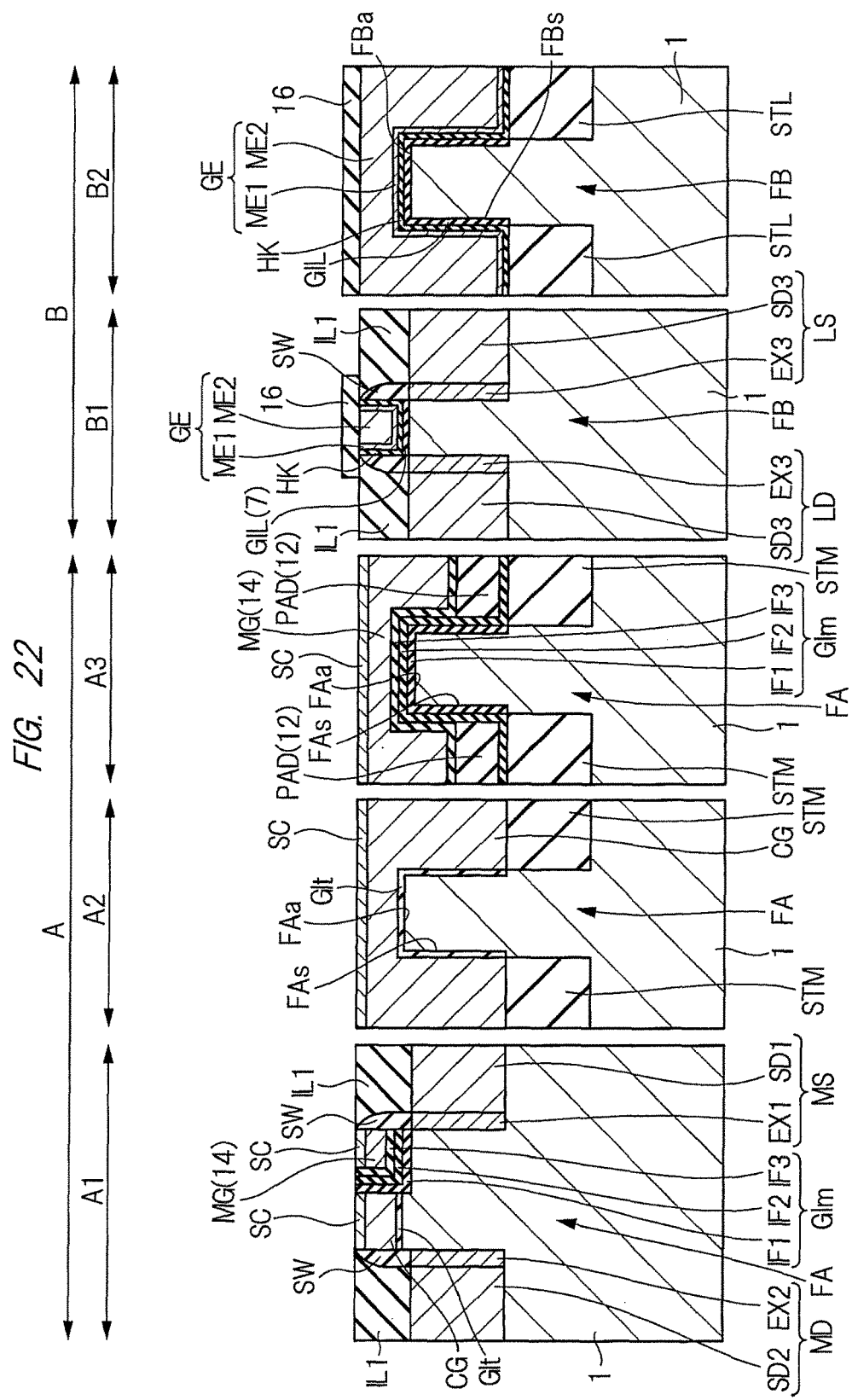
FIG. 22 is a cross-sectional view illustrating the main portion of the semiconductor device in the manufacturing process subsequent to FIG. 21.

FIG. 22 is a diagram illustrating a forming process of a silicide layer SC (Step S16). First, an insulation film 16 having a predetermined pattern is formed over the semiconductor substrate 1. The insulation film 16 is made of, for example, a silicon oxide film and can be formed by the CVD and the like. In a plan view, the insulation film 16 covers the gate electrode GE of the transistor Tr in the logic section B and includes a pattern (planar shape) to expose the memory cell section A.

Next, a metal film is deposited over the semiconductor substrate 1 and subject to heat processing, so that the silicide layer SC is formed over each of the main surfaces of the control gate electrode CG and the memory gate electrode MG. Preferably, the silicide layer SC may be a cobalt silicide layer (in the case where the metal film is cobalt), a nickel silicide layer (in the case where the metal film is nickel), or a platinum-added nickel silicide layer (in the case where the metal film is a nickel-platinum alloy film). After that, unreacted metal film is removed by wet etching or the like. FIG. 22 is a cross-sectional view illustrating this state. Furthermore, after removing the unreacted metal film, heat processing can be further performed. Additionally, no silicide layer is formed over the gate electrode GE.

Next, a forming process of the interlayer insulation film IL2, the plug electrode PG, and the metal wire MW will be described with reference to FIG. 3 (Step S17). The interlayer insulation film IL2 is formed over the silicide layer SC. For the interlayer insulation film IL2, a silicon oxide-based insulation film containing silicon oxide as a main material can be used, for example. After forming the interlayer insulation film IL2, an upper surface of the interlayer insulation film IL2 is polished by the CMP, and flatness of the upper surface of the interlayer insulation film IL2 may be improved.

Next, contact holes (opening portions or through-holes) CNT are formed in the interlayer insulation films IL1 and IL2. The contact holes CNT expose the respective surfaces of the source region MS and the drain region MD of the memory cell MC and the source region LS and the drain region LD of the transistor Tr.

Next, the conductive plug electrode PG made of tungsten (W) and the like is formed in the contact hole CNT as a conductive member for connection. The plug electrode PG has a stacking structure of a barrier conductor film (e.g., a titanium film, a titanium nitride film, or a stacked film thereof) and a main conductor film (tungsten film) positioned over the barrier conductor film. The plug electrode PG is in contact with each of the source region MS and the drain region MD of the memory cell MC and the source region LS and the drain region LD of the transistor Tr, thereby establishing an electrical connection therewith.

Next, the metal wire MW is formed over the interlayer insulation film IL2. The metal wire MW is formed of a stacking structure of a barrier conductor film (e.g., titanium nitride film, tantalum film, tantalum nitride film, or the like) and a main conductor film (copper film) formed over the barrier conductor film. In FIG. 3, the metal wire MW is illustrated in a manner such that it is integrated with the barrier conductor film and the main conductor film in order to simplify the drawing. Furthermore, the plug electrode PG is also illustrated in the same manner.

<Operation of Non-Volatile Memory>

Next, an exemplary operation of the non-volatile memory will be described with reference to FIG. 24.

Figures 23, 24:
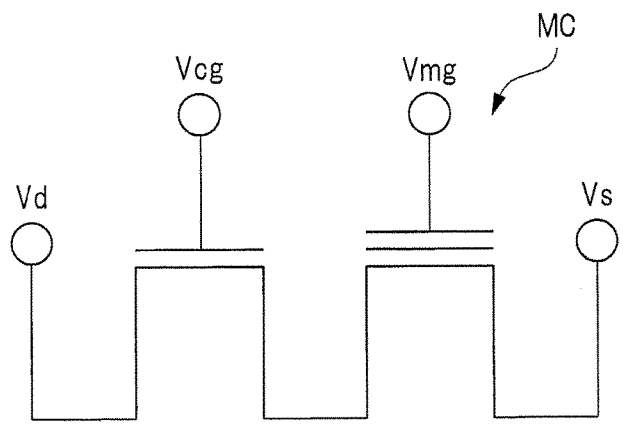
FIG. 23 is a diagram illustrating an equivalent circuit of a memory cell.
FIG. 24 is a table indicating an example of voltage applying conditions for respective portions of a selection memory cell at the time of "writing," "erasing," and "reading"

FIG. 23 is a diagram illustrating an equivalent circuit of the memory cell MC of the non-volatile memory. FIG. 24 is a table indicating an example of voltage applying conditions for respective portions of a selection memory cell at the time of "writing," "erasing," and "reading." The table of FIG. 24 specifies voltage Vmg applied to the memory gate electrode MG, voltage Vs applied to the source region MS, voltage Vcg applied to the control gate electrode CG, voltage Vd applied to the drain region MD, and voltage Vb applied to the p-type well PW1 at the time of "writing," "erasing," and "reading" in the memory cell (selection memory cell) illustrated in FIG. 23. Note that FIG. 24 provides a preferable example of the voltage applying conditions, and the voltage applying conditions are not limited thereto and various kinds of changes can be made in accordance with necessity. Furthermore, according to the present embodiment, electron injection into the insulation film IF2 (silicon nitride film that is the charge accumulation layer) in the gate insulation film GIm of the memory transistor is defined as "writing," and hole injection is defined as "erasing."

As for a writing method, a writing method called the source side injection (SSI) method in which writing is performed by injecting hot electrons by the source side injection (hot electron injection writing method) can be used. For example, voltages provided in "writing" boxes of FIG. 24 are applied to the respective portions of the selection memory cell where writing is performed, and writing is performed by injecting electrons into the insulation film IF2 in the gate insulation film GIm of the selection memory cell. At this point, hot electrons are generated in a channel region (between a source and a drain) positioned below a region between the two gate electrodes (memory gate electrode MG and control gate electrode CG) and injected into the insulation film IF2 that is the charge accumulation layer below the memory gate electrode MG. In other words, the hot electrons are injected into the insulation film IF2 from the semiconductor substrate 1 side. The injected hot electrons are trapped in a trap level in the insulation film IF2. As a result, threshold voltage of the memory transistor is increased. In other words, the memory transistor is in a writing state.

The erasing method is performed by the so-called FN tunnel method. More specifically, erasing is performed by injecting holes from the memory gate electrode MG into the insulation film IF2 that is the charge accumulation layer. For example, voltages provided in the "erasing" boxes of FIG. 24 are applied to the respective portions of the selection memory cell where erasing is performed, and the holes are injected into the insulation film IF2 of the selection memory cell and re-combined with the injected electrons, thereby lowering the threshold voltage of the memory transistor. In other words, the memory transistor is in an erasing state.

At the time of reading, for example, voltages provided in the "reading" boxes in FIG. 24 are applied to the respective portions of the selection memory cell where reading is performed. Whether the state is in the writing state or in the erasing state can be detected by setting the voltage Vmg applied to the memory gate electrode MG at the time of reading to a value between the threshold voltage of the memory transistor in the writing state and the threshold voltage of the memory transistor in the erasing state.

Figure 25A:
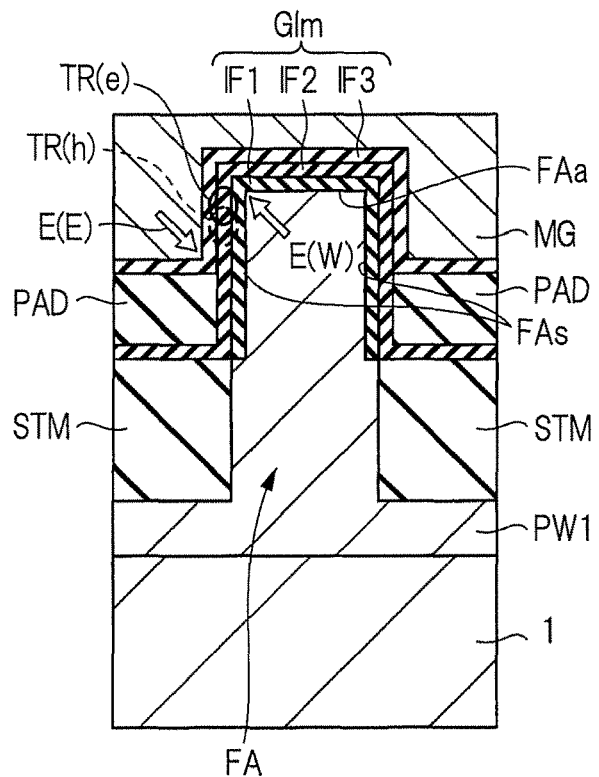
FIG. 25A is a cross-sectional view illustrating a charge trap region of the memory cell according to the embodiment.
Figure 25B:
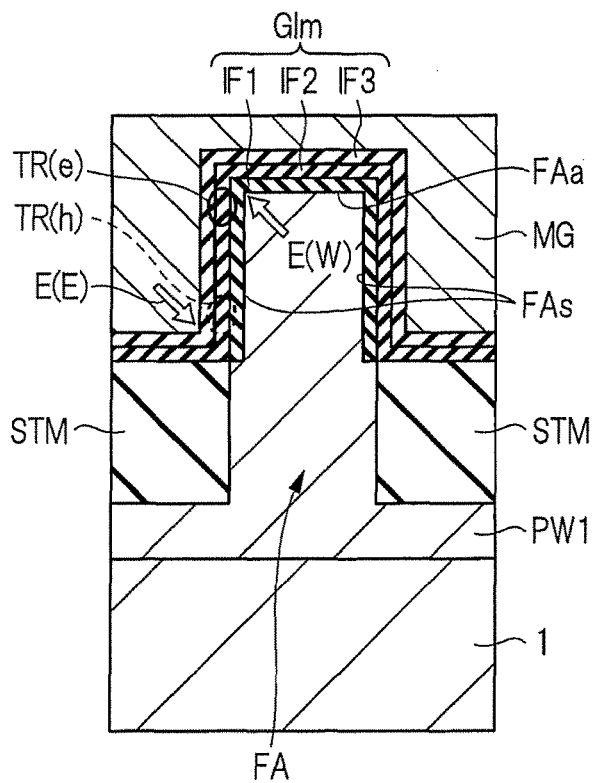
FIG. 25B is a cross-sectional view illustrating a charge trap region of a memory cell according to a comparative example.

Next, FIG. 25A is a cross-sectional view illustrating a charge trap region of the memory cell according to the present embodiment. FIG. 25B is a cross-sectional view illustrating a charge trap region of a memory cell according to a comparative example. FIGS. 25A and 25B are diagrams illustrating an electron trap region TR(e) and a hole trap region TR(h) included in the insulation film IF2 formed along one of the side surfaces FAs of the fin FA. The electron trap region TR(e) represents a region where an electron trap amount is large, and electrons are also trapped in regions other than the electron trap region TR(e). The same can be applied to the hole trap region TR(h). Furthermore, a similar charge trap region is also formed in the insulation film IF2 formed along the other of the side surfaces FAs of the fin FA. Moreover, the charge trap region is also formed in the insulation film IF2 formed along the main surface FAa, but a description thereof will be omitted.

As described above, at the time of writing, the electrons generated in the substrate 1 (or well region PW1) are injected into the insulation film IF2 that is the charge accumulation layer due to an electrical field between the semiconductor substrate 1 and the memory gate electrode MG. However, since an electrical field E(W) is concentrated at the corner portion of the upper end of the fin FA as illustrated in FIGS. 25A and 25B, the electron trap region TR(e) is formed inside the insulation film IF2 positioned in the vicinity thereof. Furthermore, at the time of erasing, the holes in the memory gate MG are injected into the insulation film IF2 that is the charge accumulation layer due to an electrical field between the memory gate electrode MG and the semiconductor substrate 1. However, since an electrical field E(E) is concentrated at the corner portion of the lower end of the memory gate electrode MG as illustrated in FIGS. 25A and 25B, the hole trap region TR(e) is formed inside the insulation film IF2 positioned in the vicinity thereof.

As illustrated in FIG. 25A, the pad insulation film PAD is formed between the memory gate electrode MG and the element isolation film STM in the memory cell MC of the present embodiment, and the lower end of the memory gate electrode MG is raised to the main surface FAa side of the fin FA. Consequently, the hole trap region TR(h) can be located closer to the electron trap region TR(e) and made to overlap therewith. Therefore, mismatch between electron distribution and hole distribution can be reduced, and endurance of the fin-type non-volatile memory cell can be improved.

In the comparative example in FIG. 25B, the hole trap region TR(h) is distant from the electron trap region TR(e). Therefore, mismatch is caused between the electron distribution and the hole distribution, and endurance of the fin-type non-volatile memory cell is degraded.

<Main Characteristics and Effects>

Figure 26:
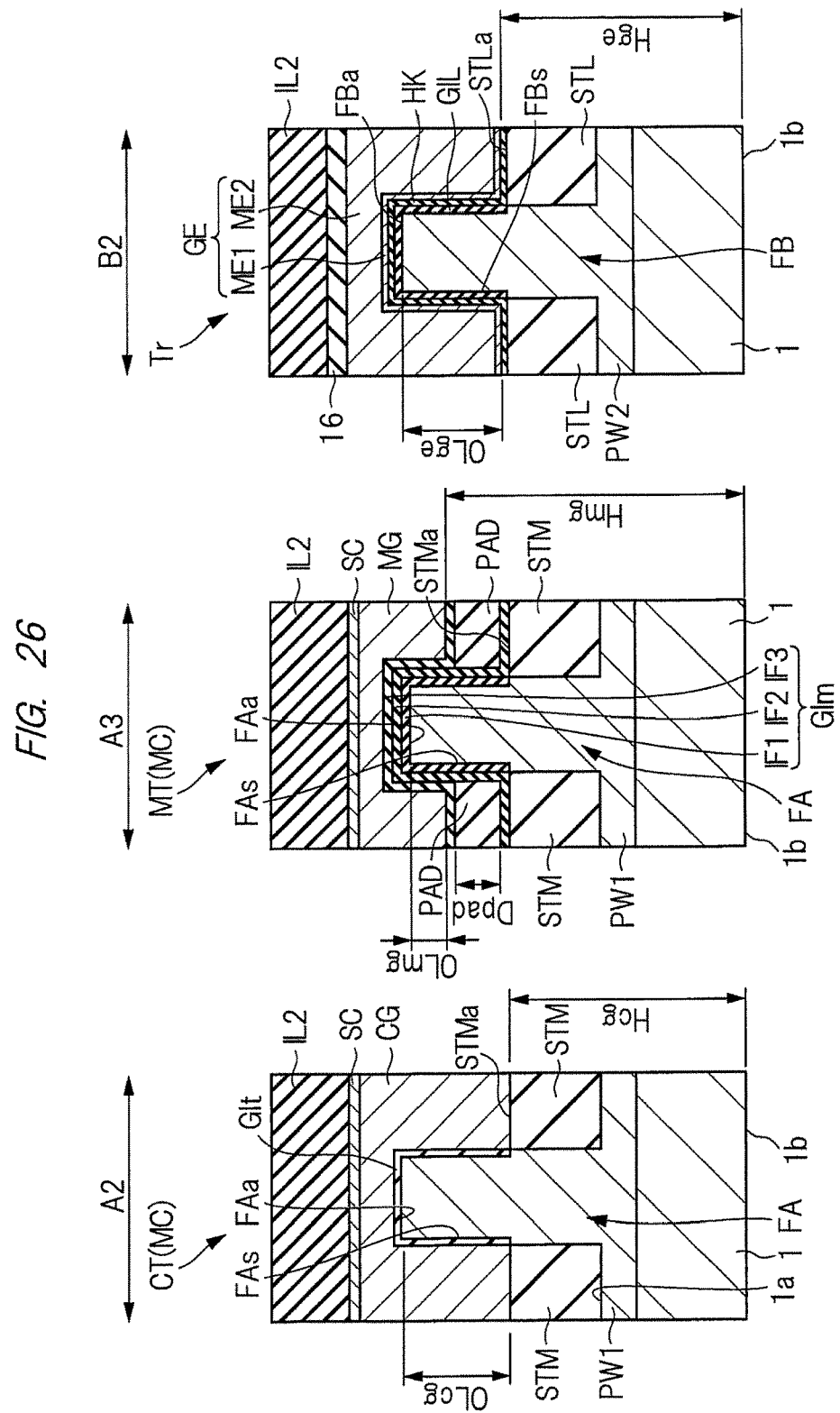
FIG. 26 is a cross-sectional view illustrating the main portion of the semiconductor device according to the embodiment.

FIG. 26 is a cross-sectional view illustrating the main portion of the semiconductor device according to the present embodiment. FIG. 26 is a cross-sectional view illustrating main portions of the memory cell sections A2 and A3 and the logic section B2.

First, the memory cell sections A2 and A3 will be described.

A height Hmg of a lower surface of the memory gate electrode MG differs from a height Hcg of a lower surface of the control gate electrode CG and is higher than the height Hcg of the lower surface of the control gate electrode CG. Here, a height of a back surface $1b$ of the semiconductor substrate 1 is set as a reference. Furthermore, the lower surface means the lower surface positioned outside the fin FA and at the corner portion where the memory gate electrode MG or the control gate electrode CG is brought close to both the fin FA and the element isolation film STM.

Since the height Hmg of the lower surface of the memory gate electrode MG is higher than the height Hcg of the lower surface of the control gate electrode CG by film thicknesses of the insulation film IF2, the pad insulation film PAD, and the insulation film IF3, a following relational expression (Expression 1) can be established.

$$Hmg=Hcg+D(IF2+IF3+PAD) \quad \text{(Expression 1)}$$

Here, D (IF2+IF3+PAD) is a summed film thicknesses of the insulation film IF2, the insulation film IF3, and the pad insulation film PAD. In other words, the insulation film IF2, the pad insulation film PAD, and the insulation film IF3 are present between the memory gate electrode MG and the element isolation film STM and are not present between the control gate electrode CG and the element isolation film STM.

Furthermore, since the pad insulation film PAD is not formed below the control gate electrode CG but is formed below the memory gate electrode MG, a following relational expression (Expression 2) is also established.

$$Hmg>Hcg+D(IF2+IF3) \quad \text{(Expression 2)}$$

Here, D (IF2+IF3) is a summed film thicknesses of the insulation film IF2 and the insulation film IF3.

Furthermore, an overlap amount OLmg between the memory gate electrode MG and the side surface FAs of the fin FA differs from an overlap amount OLcg between the control gate electrode CG and the side surface FAs of the fin FA and is smaller than the overlap amount OLcg. Note that the overlap amount may also be referred to as an overlap length, a superposed amount, and a superposed length.

Moreover, the insulation film IF2, the pad insulation film PAD, and the insulation film IF3 are present between the memory gate electrode MG and the element isolation film STM and are not present between the control gate electrode CG and the element isolation film STM. Furthermore, in the forming process of the insulation film IF1, the main surface FAa of the fin FA below the memory gate electrode MG is lowered by the film thickness of the insulation film IF1. Therefore, a following relational expression (Expression 3) is established.

$$OLmg=OLcg-D(IF1+IF2+IF3+PAD) \quad \text{(Expression 3)}$$

Here, D (IF1+IF2+IF3+PAD) is a summed film thicknesses of the insulation film IF1, the insulation film IF2, the insulation film IF3, and the pad insulation film PAD.

Furthermore, since the pad insulation film PAD is not formed below the control gate electrode CG but is formed below the memory gate electrode MG, a following relational expression (Expression 4) is also established.

$$OLmg<OLcg-D(IF1+IF2+IF3) \quad \text{(Expression 4)}$$

Here, D (IF1+IF2+IF3) is a summed film thicknesses of the insulation film IF1, the insulation film IF2, and the insulation film IF3.

Due to the above-described characteristics, the pad insulation film PAD is not formed below the control gate electrode CG but formed below the memory gate electrode MG. Therefore, for example, the overlap amount between the memory gate electrode MG and the fin FA can be reduced without reducing the overlap amount between the control gate electrode CG and the fin FA. Accordingly, drive performance of the control transistor CT can be improved, and endurance of the memory transistor MT can be improved. In other words, performance of the semiconductor device including the fin-type non-volatile memory can be improved.

Furthermore, by having the fin-type non-volatile memory, sub-threshold characteristics are improved, and high-speed reading can be achieved.

Next, the memory cell section A3 and the logic section B2 will be described.

There is no pad insulation film PAD provided in the logic section B2. In other words, the pad insulation film PAD is present between the memory gate electrode MG and the element isolation film STM but is not present between the gate electrode GE and the element isolation film STL. The height Hmg of the lower surface of the memory gate electrode MG differs from a height Hge of a lower surface of the gate electrode GE and is higher than the height Hge of the lower surface of the gate electrode GE.

Furthermore, an overlap (superposed) amount OLge between the gate electrode GE and the side surface FBs of the fin FB differs from the overlap (superposed) amount OLmg between the memory gate electrode MG and the side surface FAs of the fin FA and is smaller than the overlap (superposed) amount OLmg.

Since the overlap (superposed) amount OLge between the gate electrode GE of the transistor Tr and the side surface FBs of the fin FB in the logic section B is increased, drive performance of the transistor Tr can be improved, and high-speed operation can be achieved. Furthermore, drive performance of the transistor Tr can be improved, and endurance of the memory transistor MT can be improved.

Moreover, according to the manufacturing method of the present embodiment, the pad insulation film PAD is formed over the insulation film 11. Therefore, side etching is applied to the gate insulation film GIt under the control gate electrode CG in the forming process of the pad insulation film PAD (Step S8), and deterioration of characteristics of the control transistor CT can be prevented.

In other words, as illustrated in FIG. 12, the insulation film 11 made of the silicon nitride film is interposed between the insulation film 12 made of the silicon oxide film for forming the pad insulation film PAD and the gate insulation film GIt. Accordingly, since the insulation film 11 functions as an etching stopper at the time of forming the pad insulation film PAD lower than the fin FA by applying the isotropic etching to the insulation film 12 as illustrated in FIG. 13, side etching of the gate insulation film GIt can be prevented.

First Modification Example

Figure 27:
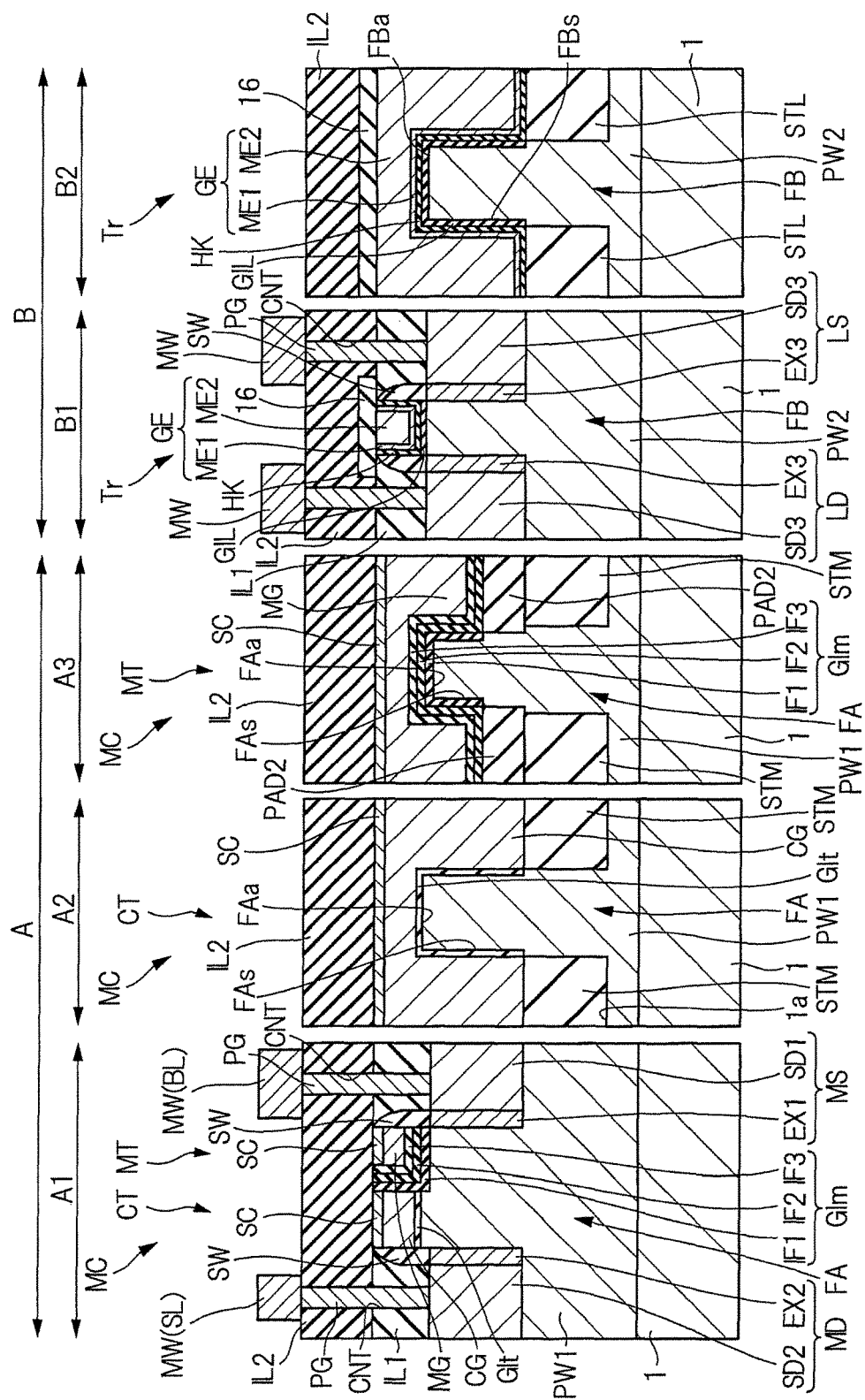
FIG. 27 is a cross-sectional view illustrating a main portion of a semiconductor device according to a first modification example.

A first modification example is a modification example of the above-described embodiment, and a forming position of a pad insulation film PAD2 is different. Other characteristics are the same as the above-described embodiment. FIG. 27 is a cross-sectional view illustrating a main portion of a semiconductor device according to the first modification example. In the memory cell section A3, the pad insulation film PAD2 is arranged under the insulation film IF2. In other words, the pad insulation film PAD2 is arranged between the insulation film IF2 and the element isolation film STM. A film material and a film thickness of the pad insulation film PAD2 are the same as those of the pad insulation film PAD of the above-described embodiment. Furthermore, the pad insulation film PAD2 is formed below the memory gate electrode MG and is not formed over the main surface FAa of the fin FA, below the control gate electrode CG, and in the logic section B.

Figure 28:
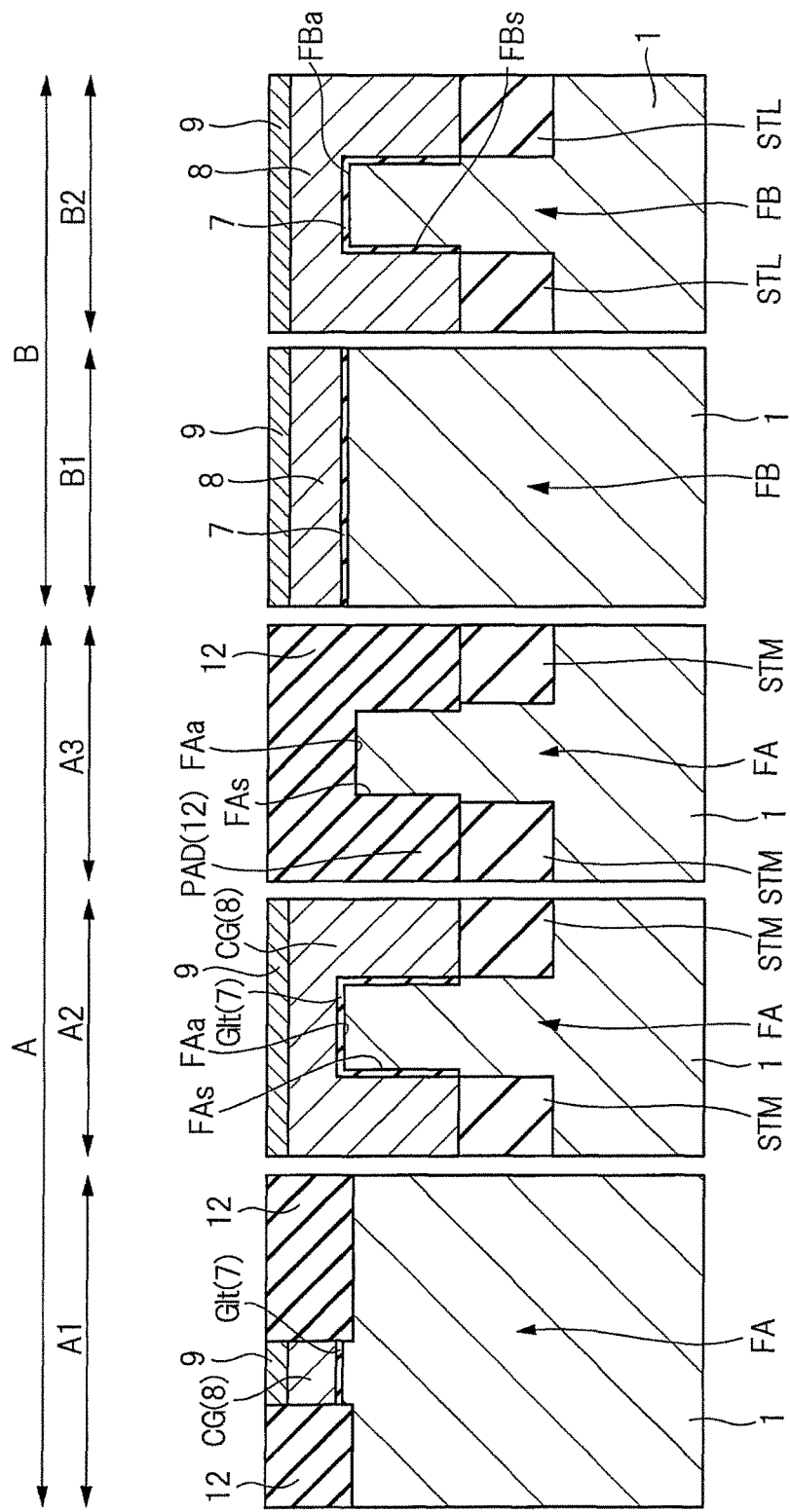
FIG. 28 is a cross-sectional view illustrating the main portion of the semiconductor device in a manufacturing process according to the first modification example.
Figure 29:
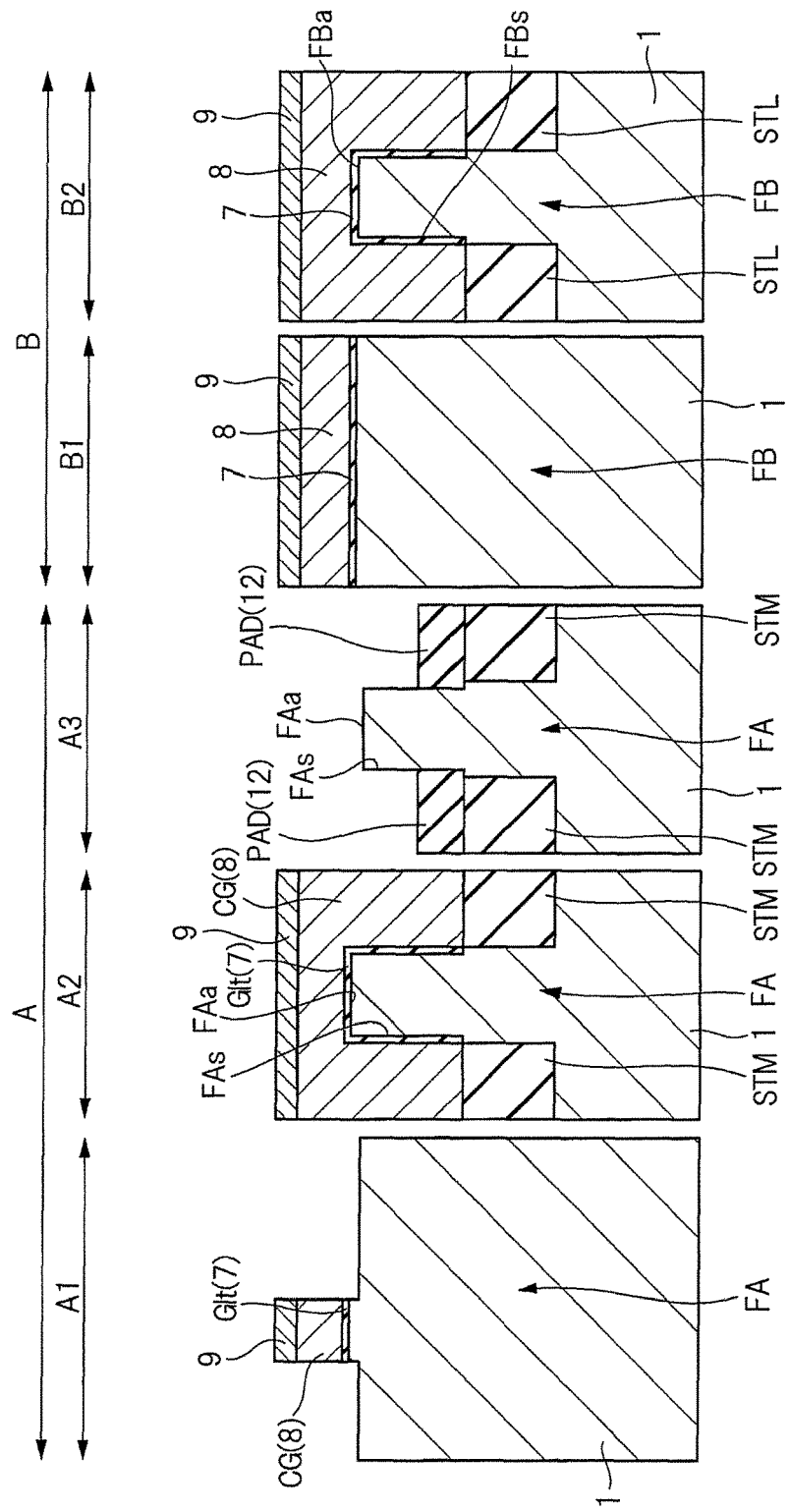
FIG. 29 is a cross-sectional view illustrating the main portion of the semiconductor device in the manufacturing process subsequent to FIG. 28.
Figure 30:
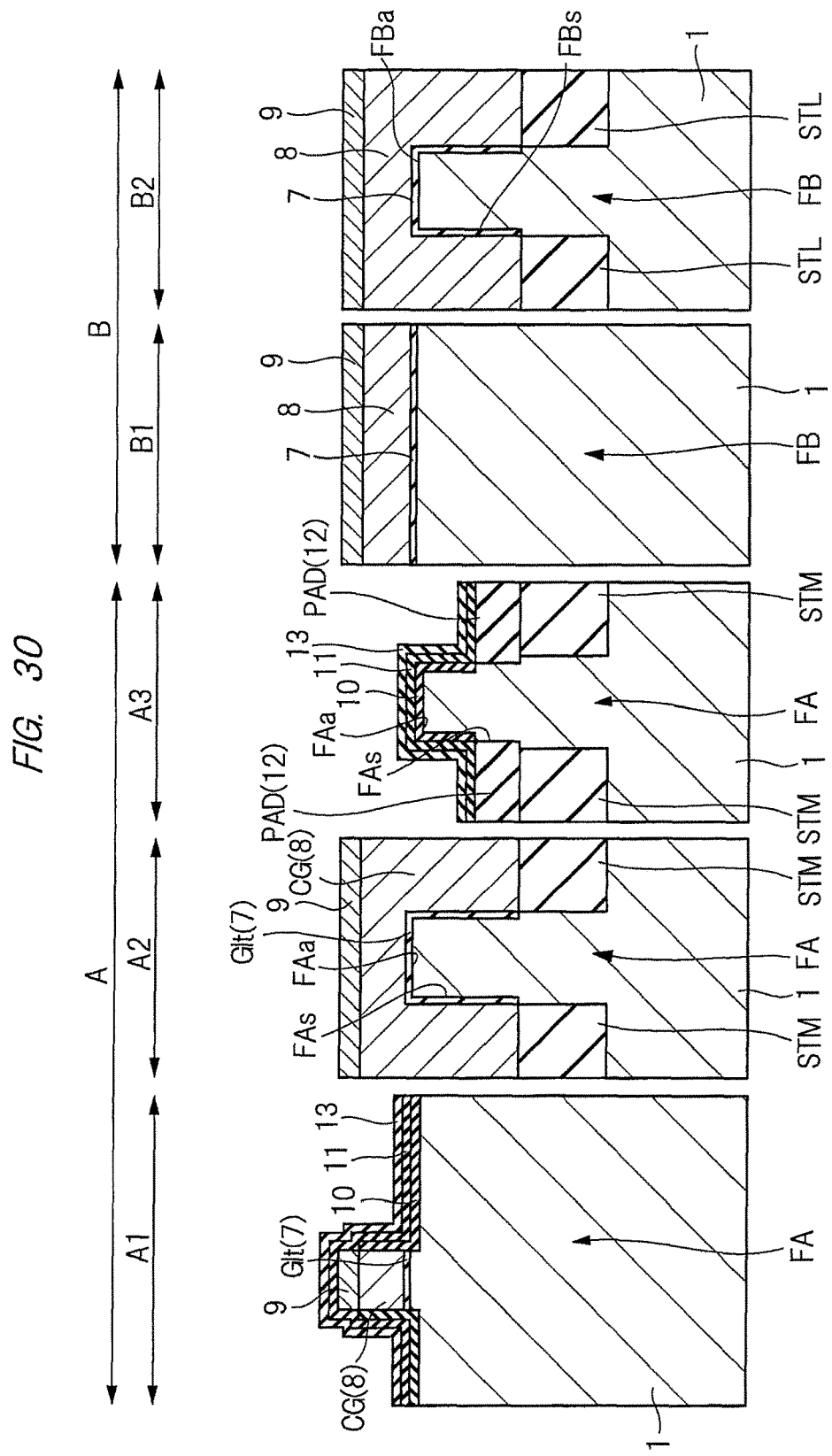
FIG. 30 is a cross-sectional view illustrating the main portion of the semiconductor device in the manufacturing process subsequent to FIG. 29.

Next, a manufacturing method of the semiconductor device according to the first modification example will be described. FIGS. 28 to 30 are cross-sectional views each illustrating the main portion of the semiconductor device in a manufacturing process according to the first modification example.

In the above-described embodiment, the forming process of the pad insulation film PAD (Step S8) is performed after the forming process of the insulation films 10 and 11 (Step S7) described with reference to FIG. 12. Conversely, in the first modification example, the forming process of the insulation films 10 and 11 (Step S7) is performed after the forming process of the pad insulation film PAD2 (Step S8). Note that other processes are the same as the above-described embodiment.

FIG. 28 is a diagram illustrating a part of the forming process of the pad insulation film PAD2 described below (Step S8). After the forming process of the above-described control gate electrode CG (Step S6), the insulation film 12 having a film thickness equal to or higher than the height of the fin FA is formed so as to cover the main surface FAa and the side surfaces FAs of the fin FA in the memory cell section A3. The insulation film 12 is made of, for example, a silicon oxide film. The silicon oxide film is deposited over the main surface FAa and the side surfaces FAs of the fin FA in order to form the insulation film 12 and subjected to the CMP polishing to expose the insulation films 9 formed over the control gate electrodes CG in the memory cell sections A1 and A2, thereby forming the insulation film 12.

FIG. 29 is a diagram illustrating a part of the forming process of the pad insulation film PAD2 (Step S8) subsequent to FIG. 28. The insulation film 12 is subjected to the isotropic etching, and the insulation film 12 over the main surface FAa of the fin FA is removed. Moreover, the isotropic etching is continued, and the insulation film 12 is made to selectively remain over the element isolation film STM, thereby forming the pad insulation film PAD2. A film thickness and a forming region in the plan view of the pad insulation film PAD2 are the same as those of the pad insulation film PAD.

FIG. 30 is a diagram illustrating a forming process of the insulation films 10 and 11 (Step S7) and a forming process of the insulation film 13 (Step S9) subsequent to the forming process of the pad insulation film PAD2. The insulation films 10 and 11 are sequentially formed over the main surface FAa and the side surfaces FAs of the fin FA. The insulation film 10 is a silicon oxide film formed by thermally oxidizing the main surface FAa and the side surfaces FAs of the fin FA and has a film thickness of 4 nm which is thicker than that of the gate insulation film GIt. Next, the insulation film 11 is made of a silicon nitride film and has a film thickness of 7 nm. Next, the insulation film 13 is formed over the insulation film 11. The insulation film 13 is made of, for example, an oxynitride silicon film and has a film thickness of 9 nm. The insulation films 11 and 13 are formed over the pad insulation film PAD2 in the memory cell section A3. After that, the processes subsequent to Step S10 in the above-described embodiment are performed.

According to the manufacturing method of the semiconductor device in the first modification example, the insulation film 11 to be the charge accumulation layer is formed after forming the pad insulation film PAD2. Therefore, a surface of the insulation film 11 is not damaged by etching in the forming process of the pad insulation film PAD2. In other words, deterioration of charge retention characteristics due to etching damage to the insulation film 11 can be prevented.

Second Modification Example

A second modification example is a modification example of the above-described embodiment but is different in having a non-volatile memory formed of a single gate cell from the above-described embodiment having the non-volatile memory formed of the split gate cell. Furthermore, they are also different in a gate electrode structure of a transistor in the logic section.

In the second modification example, following reference characters are used: a memory cell MC2, a memory gate electrode MG2, a pad insulation film PAD3, a transistor Tr2, a gate electrode GE2, and the like. Other portions in common with the above-described embodiment are denoted by the same reference characters.

Figure 31:
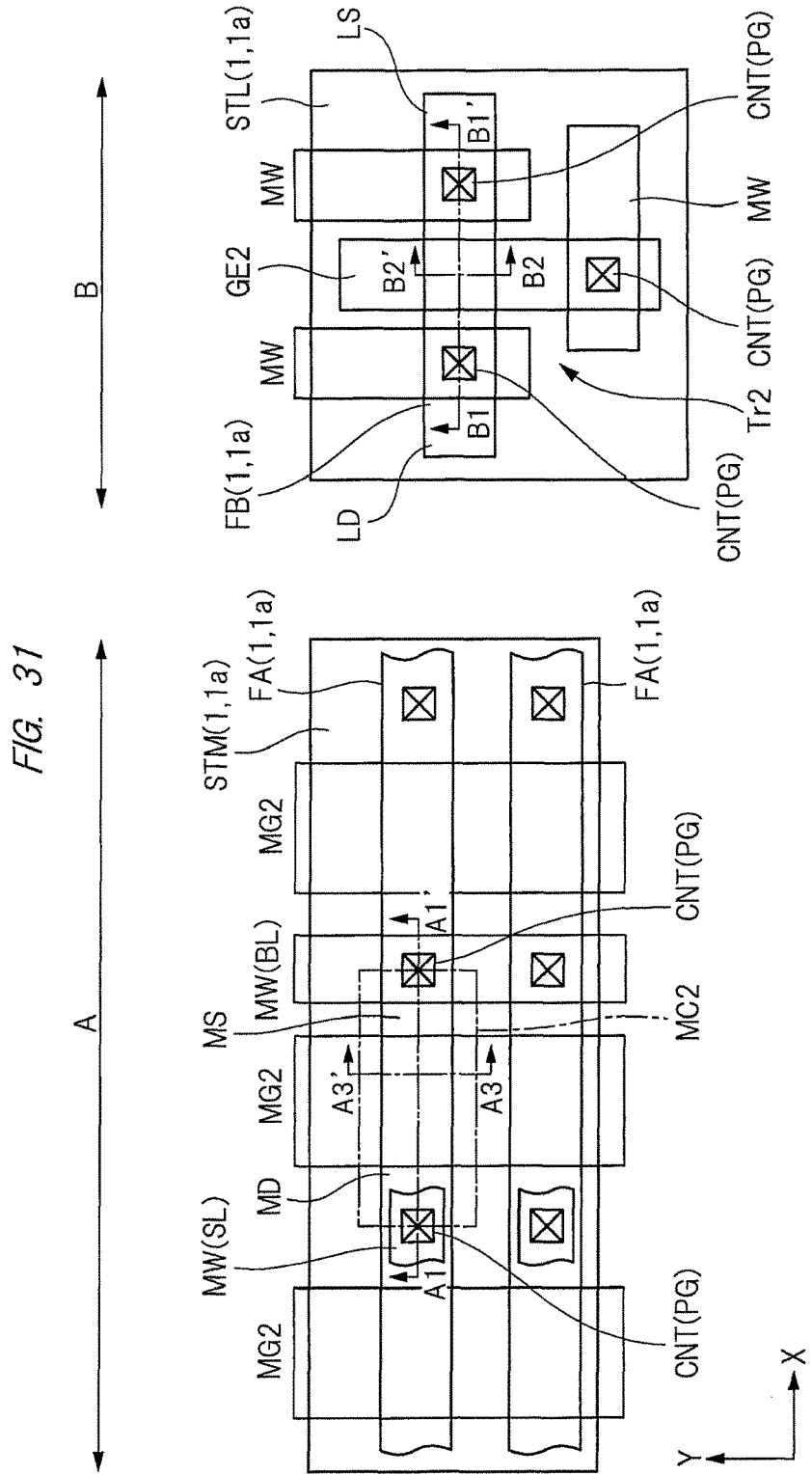
FIG. 31 is a plan view illustrating a main portion of a semiconductor device according to a second modification example.
Figure 32:
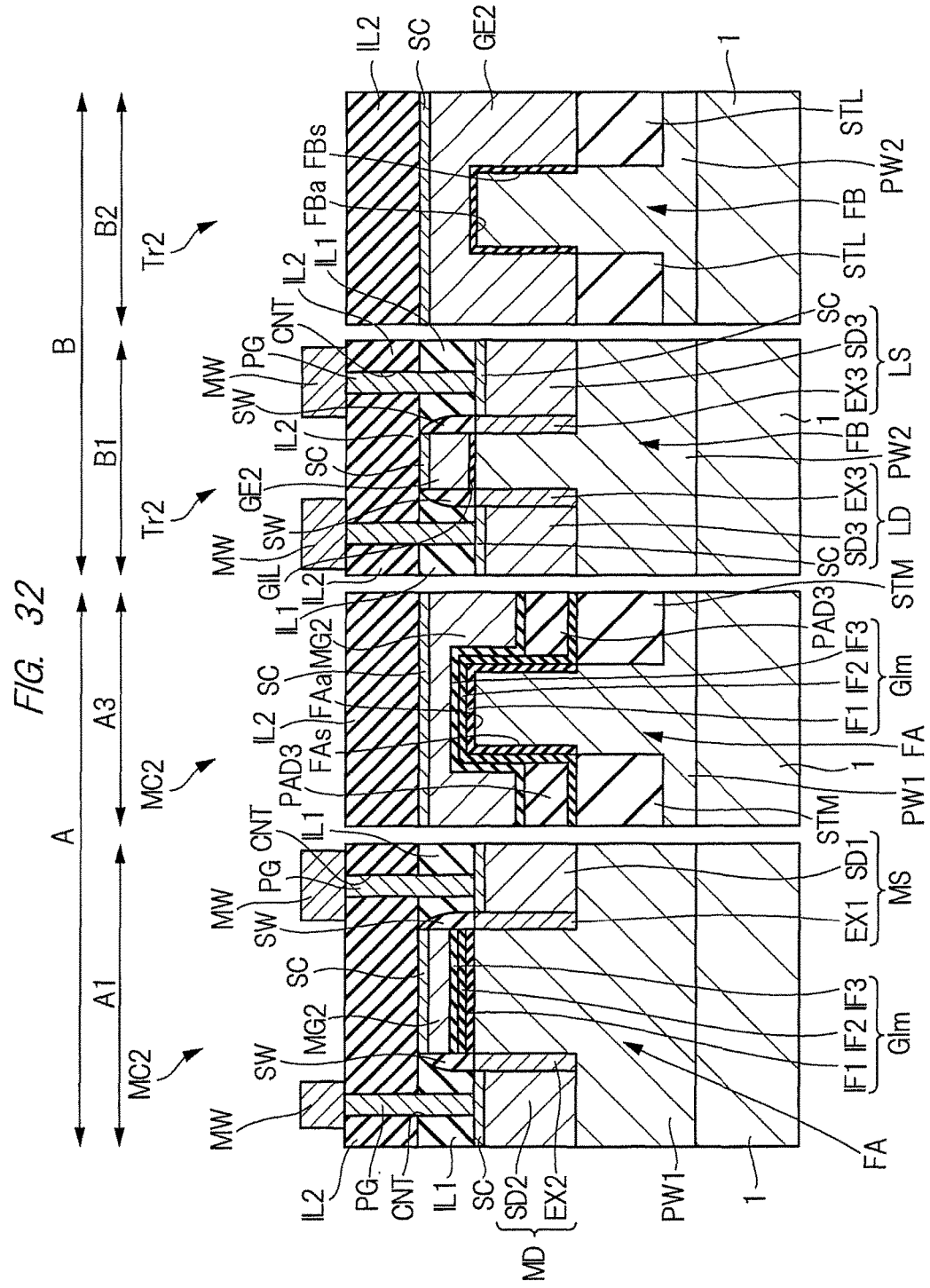
FIG. 32 is a cross-sectional view illustrating the main portion of the semiconductor device according to the second modification example.

FIG. 31 is a plan view illustrating a main portion of a semiconductor device according to the second modification example. FIG. 32 is a cross-sectional view illustrating the main portion of the semiconductor device according to the second modification example. FIG. 32 is a diagram illustrating two cross-sectional views in the memory cell section A and two cross-sectional views in the logic section B. The memory cell section A1 is the cross-sectional view taken along the line A1-A1' in FIG. 31, the memory cell section A3 is the cross-sectional view taken along the line A3-A3' in FIG. 31, the logic section B1 is a cross-sectional view taken along the line B1-B1' in FIG. 31, and the logic section B2 is a cross-sectional view taken along the line B2-B2' in FIG. 31.

As illustrated in FIG. 31, a plurality of fins FA extending in the X-direction are arranged at equal intervals in the Y-direction in the memory cell section A. A plurality of memory gate electrodes MG2 extending in the Y-direction (orthogonal to the X-direction) are arranged over the plurality of fin FA so as to intersect with the plurality of fins FA. The drain region MD and the source region MS are formed at both ends of the memory gate electrode MG2 so as to interpose the memory gate electrode MG2. More specifically, the memory cell MC2 is a single gate cell.

Furthermore, the transistor Tr2 in the logic section B includes: the gate electrode GE2 thereof; and the drain region LD and the source region LS positioned at both ends of the gate electrode GE2 and formed in the fin FB so as to interpose the gate electrode GE2.

Next, structures of the memory cell MC2 and the transistor Tr2 will be described with reference to FIG. 32.

The memory cell MC2 includes the memory gate electrode (gate electrode) MG2, the drain region MD, and the source region MS. The memory gate electrode (gate electrode) MG2 is formed along the main surface FAa and the side surfaces FAs of the fin FA, and the gate insulation film GIm is interposed between the memory gate electrode MG2 and the semiconductor substrate 1 (or p-type well PW1). The gate insulation film GIm is formed of a stacking structure of the above-described insulation films IF1, IF2, and IF3. Furthermore, in the memory cell section A, the pad insulation film PAD3 is formed outside (around) the fin FA.

In the logic section B, the gate electrode GE2 is formed over the main surface FBa and the side surfaces FBs of the fin FB via the gate insulation film GIL, and the drain region LD and the source region LS are formed in the fin FB so as to interpose the gate electrode GE2. No pad insulation film PAD3 is formed in the logic section B.

Next, a manufacturing method of the semiconductor device according to the second modification example will be described. FIGS. 33 to 38 are cross-sectional views each illustrating the main portion of the semiconductor device in a manufacturing process according to the second modification example.

Figure 33:
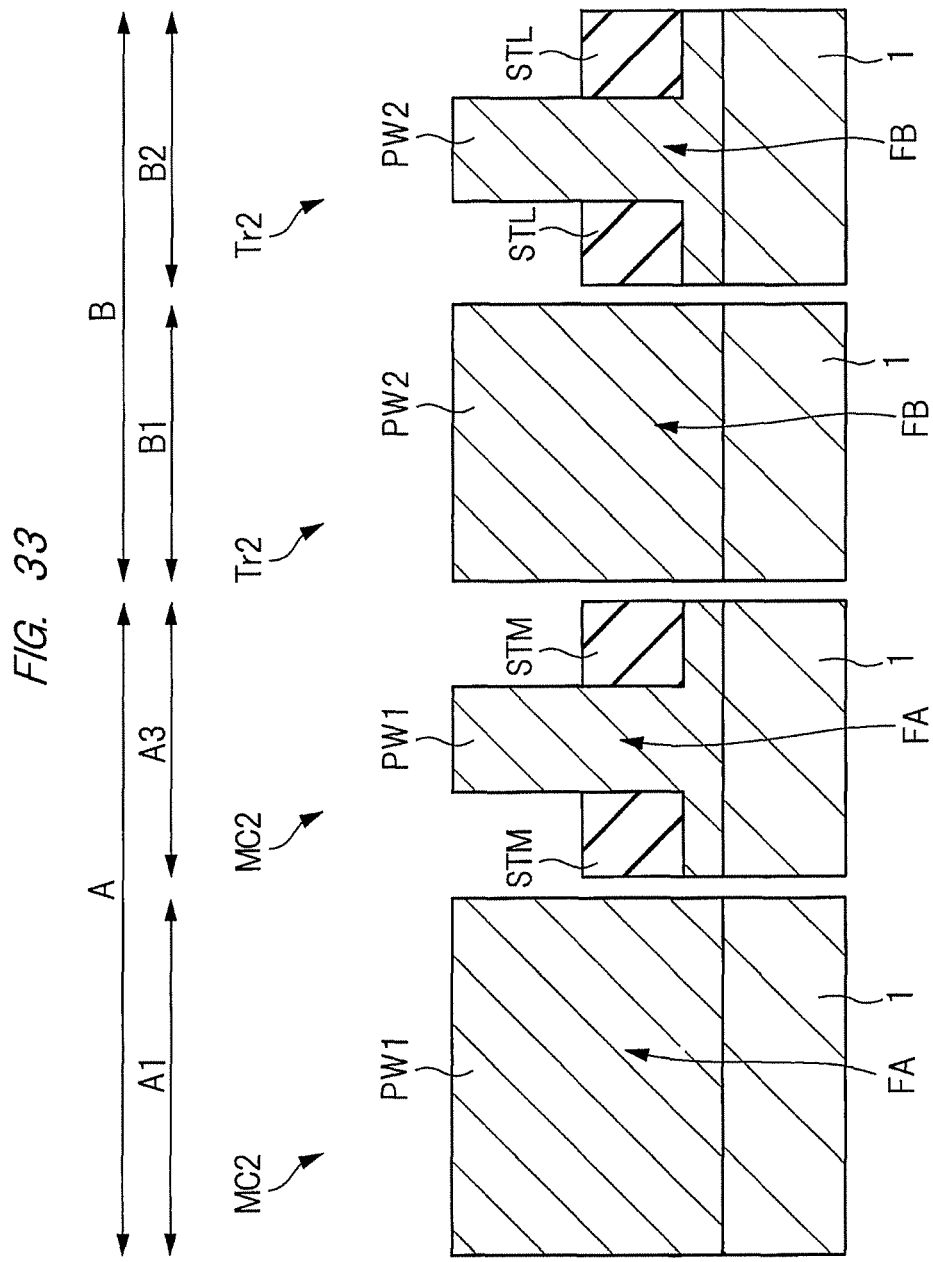
FIG. 33 is a cross-sectional view illustrating the main portion of the semiconductor device in a manufacturing process according to the second modification example.

First, the semiconductor substrate 1 including the fins FA and FB illustrated in FIG. 33 is prepared by performing Step S1 to Step S4 in the above-described embodiment.

Figure 34:
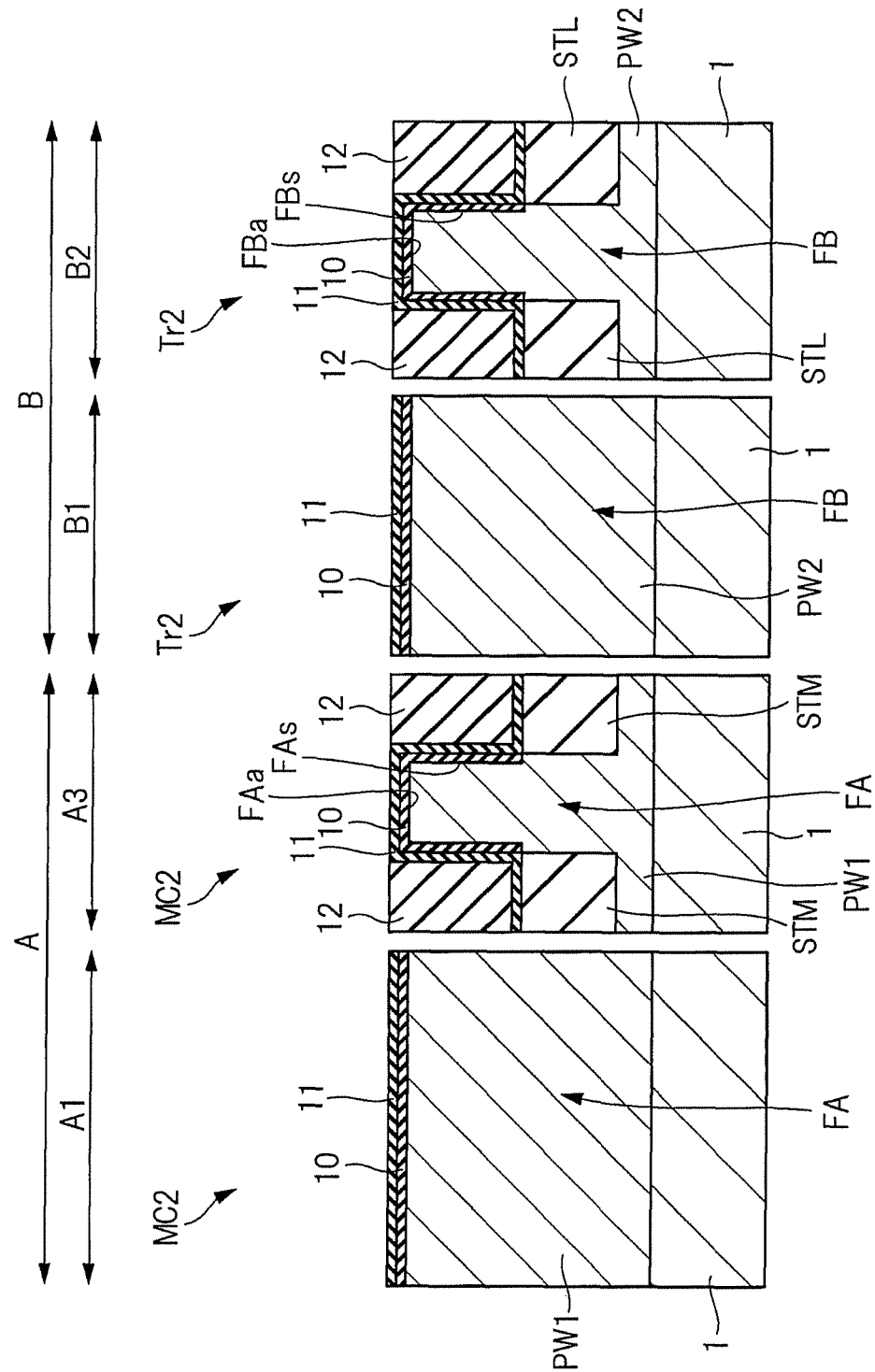
FIG. 34 is a cross-sectional view illustrating the main portion of the semiconductor device in the manufacturing process subsequent to FIG. 33.

Next, as illustrated in FIG. 34, Step S7 in the above-described embodiment is performed. The above-described insulation films 10 and 11 are sequentially formed over the main surface FAa and the side surfaces FAs of the fin FA and the main surface FBa and the side surfaces FBs of the fin FB.

Moreover, FIG. 34 is a diagram illustrating apart of a forming process of the pad insulation film PAD3 described below (Step S8). In the memory cell section A3 and the logic section B2, the insulation film 12 having a film thickness equal to or higher than the heights of the fins FA and FB is formed so as to cover the main surface FAa and the side surfaces FAs of the fin FA and the main surface FBa and the side surfaces FBs of the fin FB. The insulation film 12 is made of, for example, a silicon oxide film. In order to form the insulation film 12, a silicon oxide film is deposited over the insulation film 11 and subjected to the CMP polishing to expose the insulation film 11 formed over the memory gate electrodes MG in the memory cell sections A1 and A3, thereby forming the insulation film 12.

Figure 35:
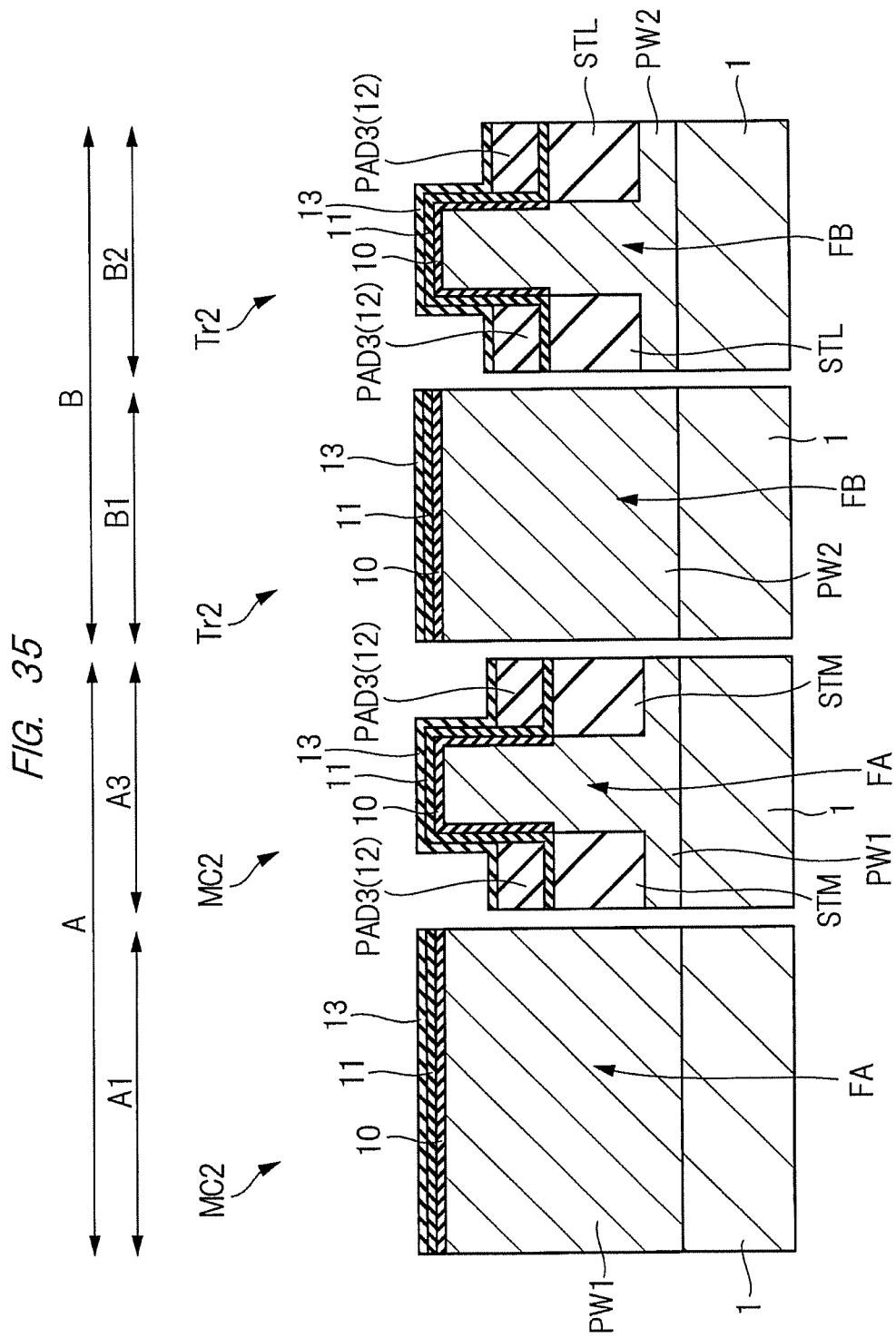
FIG. 35 is a cross-sectional view illustrating the main portion of the semiconductor device in the manufacturing process subsequent to FIG. 34.

FIG. 35 is a diagram illustrating apart of the forming process of the pad insulation film PAD3 (Step S8) subsequent to FIG. 34. The pad insulation film PAD3 is formed in the same manner as the above-described embodiment. In the second modification example, the pad insulation film PAD3 is also formed in the logic section B2.

Next, as illustrated in FIG. 35, a forming process of the insulation film 13 is performed (Step S9). Next, the insulation film 13 is formed over the pad insulation film PAD3.

Figure 36:
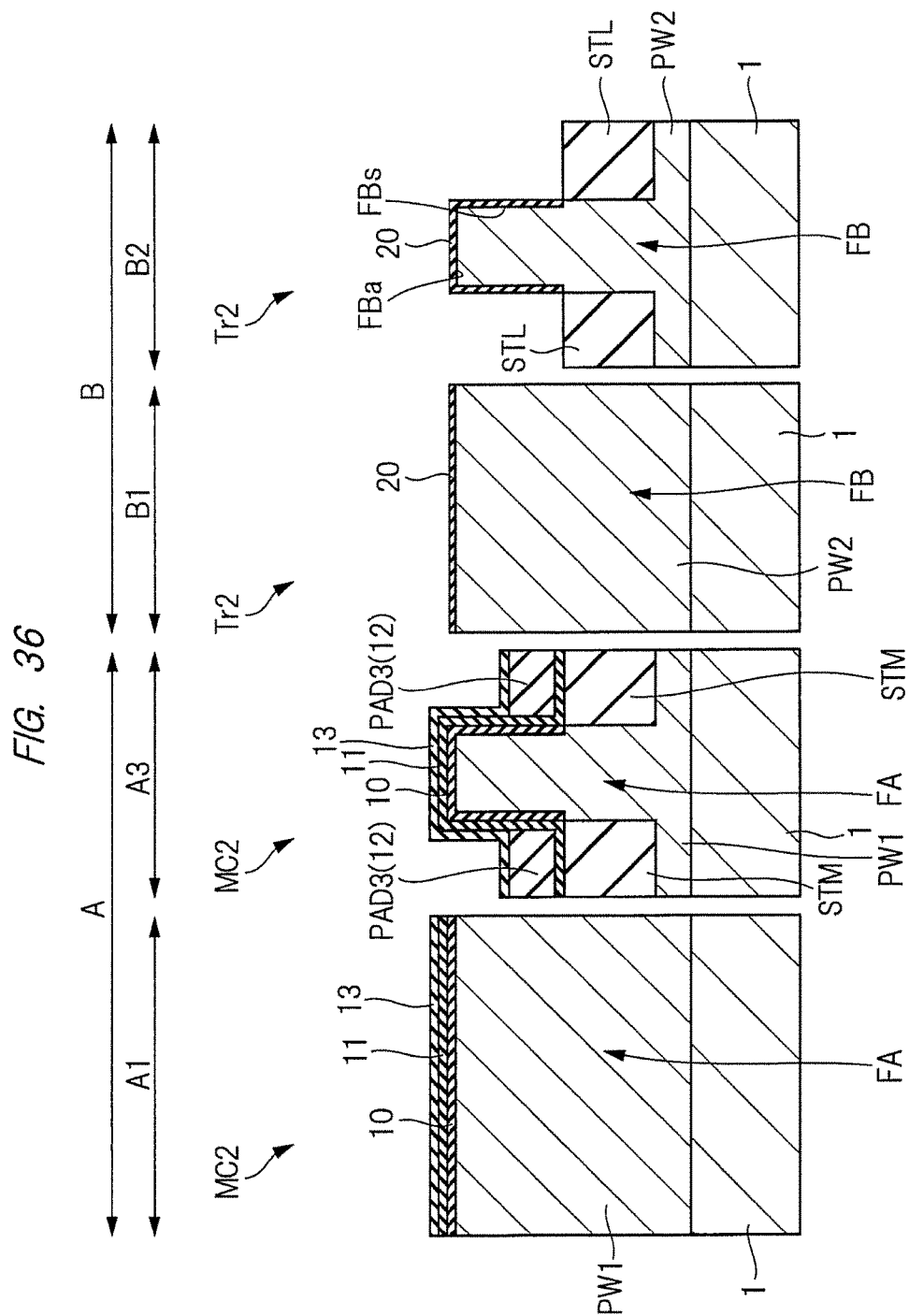
FIG. 36 is a cross-sectional view illustrating the main portion of the semiconductor device in the manufacturing process subsequent to FIG. 35.

Next, as illustrated in FIG. 36, for example, and the insulation films 13, 11, and 10 in the logic section B and the pad insulation film PAD3 are removed by using, as a mask, a resist film (not illustrated) covering the memory cell section A and exposing the logic section B. Then, after the main surface FBa and the side surfaces FBs of the fin FB are exposed, an insulation film 20 is formed over the main surface FBa and the side surfaces FBs of the fin FB. The insulation film 20 is made of a silicon oxide film, an oxynitride silicon film, a high-k film, or a stacked film thereof. Note that the resist film covering the memory cell section A and exposing the logic section B is removed before forming the insulation film 20.

Figure 37:
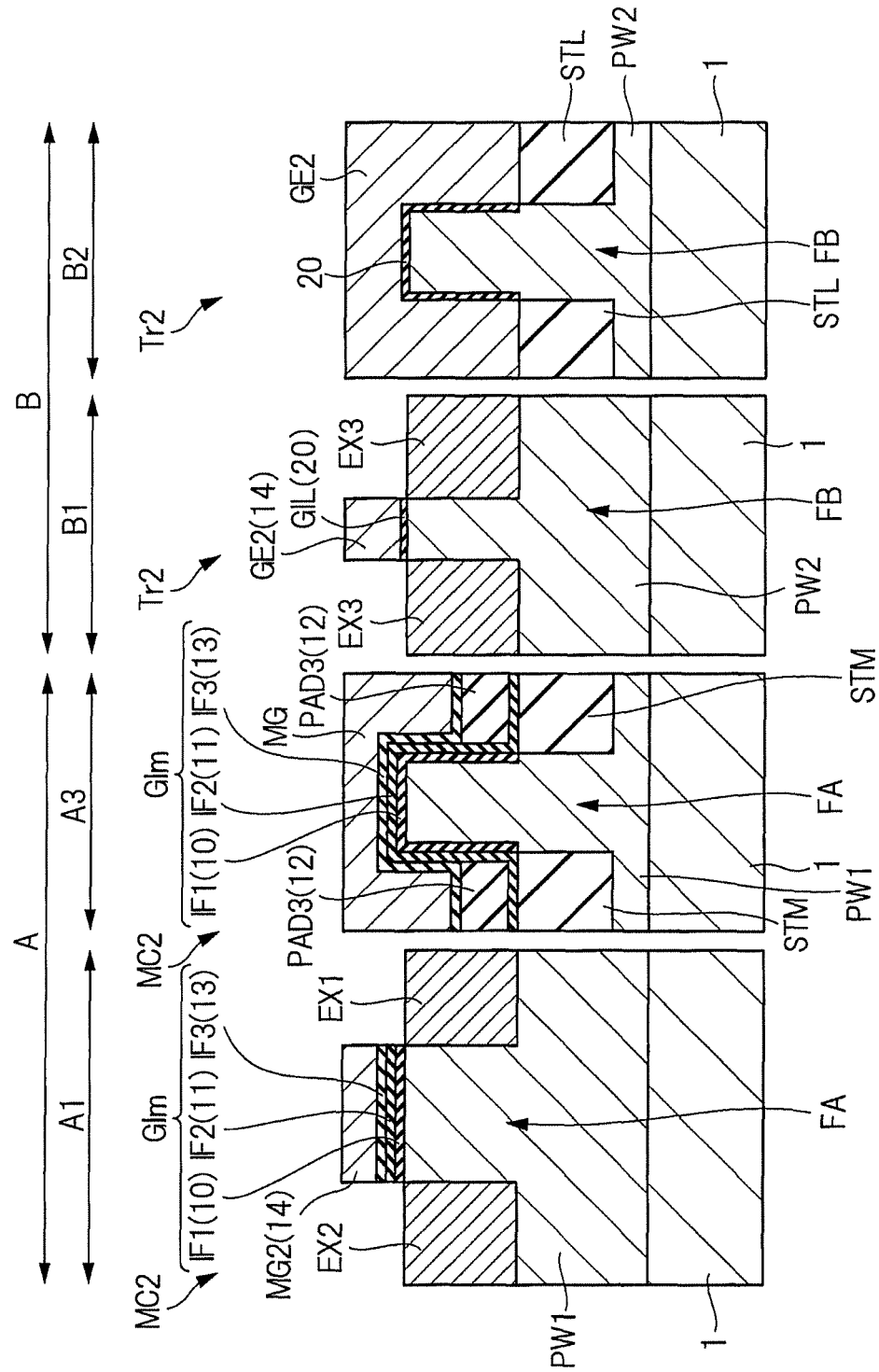
FIG. 37 is a cross-sectional view illustrating the main portion of the semiconductor device in the manufacturing process subsequent to FIG. 36.

Next, as illustrated in FIG. 37, a forming process of the memory gate electrode MG is performed (Step S10). After a conductor film 14 is deposited over the insulation film 13 and the insulation film 20, the conductor film 14 is subjected to the CMP processing to flatten the surface of the conductor film 14. Next, the conductor film 14 is patterned to form the memory gate electrode MG2 in the memory cell section A and the gate electrode GE2 in the logic section B. Furthermore, the insulation films 13, 11, and 10 are subjected to etching processing to form the insulation films IF3, IF2, and IF1 each having a planar shape equal to the memory gate electrode MG2. The insulation films IF3, IF2, and IF1 function as the gate insulation film GIm of the memory cell MC2. Additionally, in the logic section B, the gate insulation film GIL is formed by processing the insulation film 20 to be planar shape equal to the gate electrode GE2.

Furthermore, as illustrated in FIG. 37, a forming process of the n⁻-type semiconductor regions (impurity diffusion layers) EX1, EX2, and EX3 is performed (Step S12), and the n⁻-type semiconductor regions EX1 and EX2 are formed at both ends of the memory gate electrode MG2, and the n⁻-type semiconductor regions EX3 are formed at both ends of the gate electrode GE2.

Figure 38:
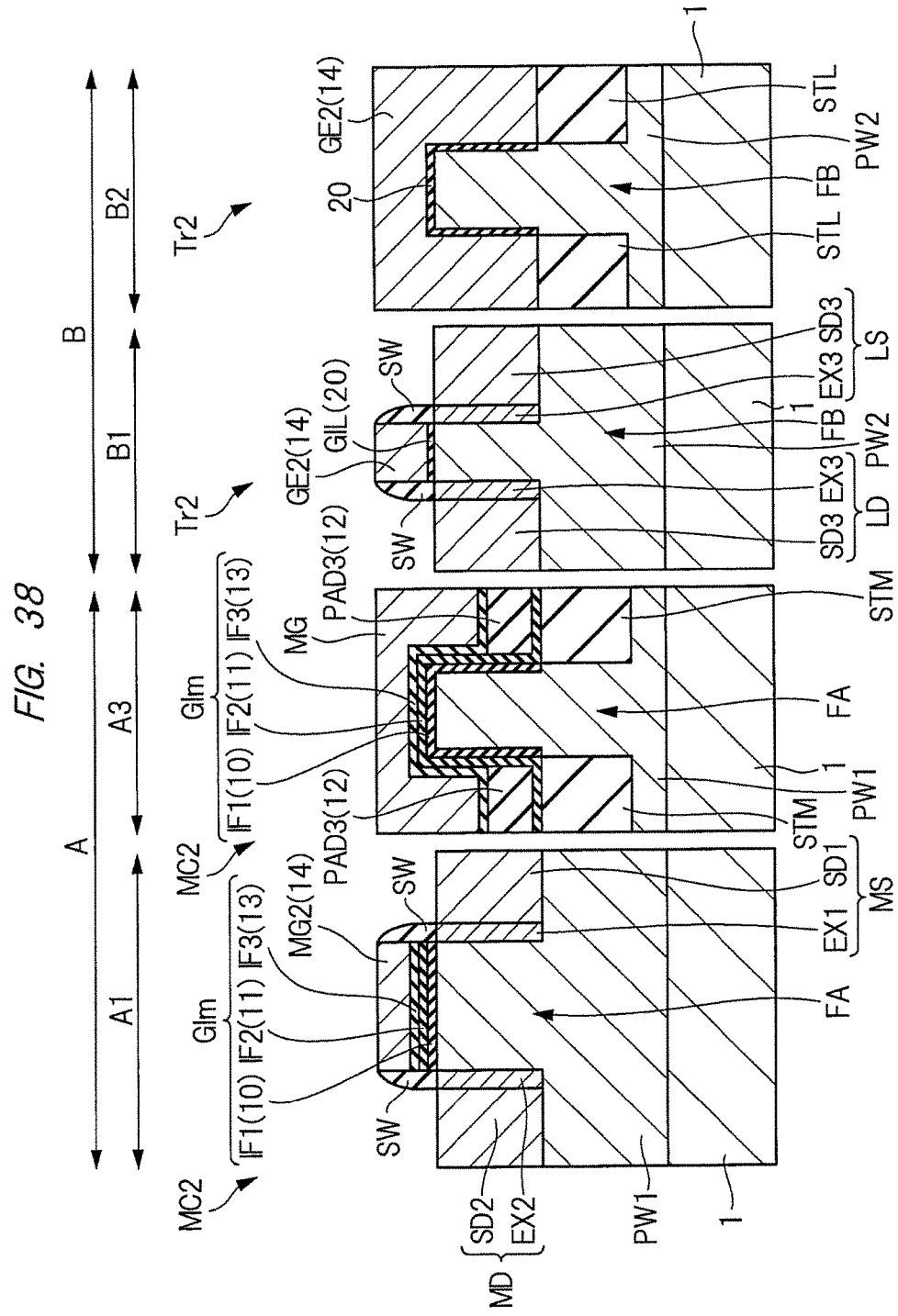
FIG. 38 is a cross-sectional view illustrating the main portion of the semiconductor device in the manufacturing process subsequent to FIG. 37.

Next, as illustrated in FIG. 38, a forming process of the side wall spacers SW and the n⁺-type semiconductor regions (impurity diffusion layers) SD1, SD2, and SD3 is performed (Step S13). Then, the side wall spacers SW are formed over side walls of the memory gate electrode MG2 and the gate electrode GE2. Moreover, the n⁺-type semiconductor regions SD1 and SD2 are formed at both ends of the memory gate electrode MG2, and the n⁺-type semiconductor regions SD3 are formed at both ends of the gate electrode GE2.

Furthermore, a forming process of the silicide layer SC (Step S16) and a forming process of the interlayer insulation film IL2, the plug electrode PG, and the metal wire MW (Step S17) are performed, and the semiconductor device of the second modification example illustrated in FIG. 32 is completed.

Next, an exemplary operation of the non-volatile memory in the second modification example will be described with reference to FIG. 40.

Figures 39, 40:
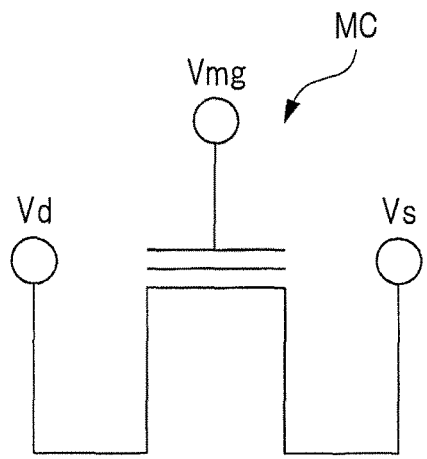
FIG. 39 is a diagram illustrating an equivalent circuit of a memory cell according to the second modification example.
FIG. 40 is a table indicating an example of voltage applying conditions for respective portions of a selection memory cell at the time of "writing" and "erasing"

FIG. 39 is a diagram illustrating an equivalent circuit of a memory cell MC2 according to the second modification example. FIG. 40 is a table indicating an example of voltage applying conditions for respective portions of a selection memory cell at the time of "writing" and "erasing." The table of FIG. 40 specifies voltage Vmg applied to the memory gate electrode MG2, voltage Vs applied to the source region MS, voltage Vd applied to the drain region MD, and voltage Vb applied to the p-type well PW1 in the memory cell (selection memory cell) illustrated in FIG. 39 at the time of "writing" and "erasing," respectively. Note that FIG. 40 provides a preferable example of voltage applying conditions, and the voltage applying conditions are not limited thereto and various kinds of changes can be made in accordance with necessity. Furthermore, according to the present embodiment, electron injection into the insulation film IF2 (silicon nitride film that is the charge accumulation layer) inside the gate insulation film GIm of the memory cell MC2 is defined as "writing," and hole (positive hole) injection is defined as "erasing."

As a writing method, a writing method of a so-called channel hot electron injection (CHE) method can be used. For example, voltages provided in "writing" boxes of FIG. 40 are applied to the respective portions of the selection memory cell where writing is performed, and writing is performed by injecting the electrons into the insulation film IF2 in the gate insulation film GIm of the selection memory cell. At this point, hot electrons are generated at a channel region (between source and drain) below the memory gate electrode MG2 and injected into the insulation film IF2 that is the charge accumulation layer below the memory gate electrode MG2. In other words, the hot electrons are injected into the insulation film IF2 from the semiconductor substrate 1 side. The injected hot electrons are trapped in a trap level in the insulation film IF2. As a result, threshold voltage of the memory cell is increased. In other words, the memory cell is in a writing state.

The erasing method is performed by the so-called FN tunnel method. More specifically, erasing is performed by injecting holes from the memory gate electrode MG2 into the insulation film IF2 that is the charge accumulation layer. For example, voltages provided in "erasing" boxes of FIG. 40 are applied to the respective portions of the selection memory cell where erasing is performed, and the holes are injected into the insulation film IF2 of the selection memory cell and recombined with the electrons having been injected, so that the threshold voltage of the memory cell is lowered. In other words, the memory cell is in an erasing state.

Thus, such methods are adopted in which the electrons are injected from the semiconductor substrate 1 side into the insulation film IF2 that is the charge accumulation layer at the time of "writing" and the holes are injected from the memory gate electrode MG2 to the insulation film IF2 at the time of "erasing." Therefore, it is effective to provide the pad insulation film PAD3 even in the fin-type non-volatile memory cell of the second modification example. More specifically, this is because, in a case in which the pad insulation film PAD3 is not provided even in the single gate cell where the memory gate electrode MG2 and the insulation film IF2 that is the charge accumulation layer are formed along the main surface FAa and the side surfaces FAs of the fin FA, mismatch is caused between electron distribution and hole distribution as described in FIG. 25B, and endurance of the fin-type non-volatile memory cell is deteriorated.

Also in the second modification example, the pad insulation film PAD3 is present between the memory gate electrode MG2 and the element isolation film STM and is not present between the gate electrode GE2 and the element isolation film STL. Accordingly, a relation between the memory gate electrode MG and the gate electrode GE of the transistor Tr in the logic section B2 described in FIG. 26 in accordance with the present embodiment is the same as in the second modification example. In other words, a height Hmg2 of a lower surface of the memory gate electrode MG2 differs from a height Hge2 of a lower surface of the gate electrode GE2 and is higher than the height Hge2 of the lower surface of the gate electrode GE2. Furthermore, an overlap amount OLge2 between the gate electrode GE2 and the side surface FBs of the fin FB differs from an overlap amount OLmg2 between the memory gate electrode MG2 and the side surface FAs of the fin FA and is larger than the overlap amount OLmg2.

Since the overlap amount OLmg2 between the memory gate electrode MG2 and the side surface FAs of the fin FA is reduced, endurance of the memory cell MC2 can be improved. Furthermore, since the overlap amount OLge2 between the gate electrode GE of the transistor Tr and the side surface FBs of the fin FB in the logic section B is increased, drive performance of the transistor Tr can be improved, and high-speed operation can be achieved.

Third Modification Example

Figure 41:
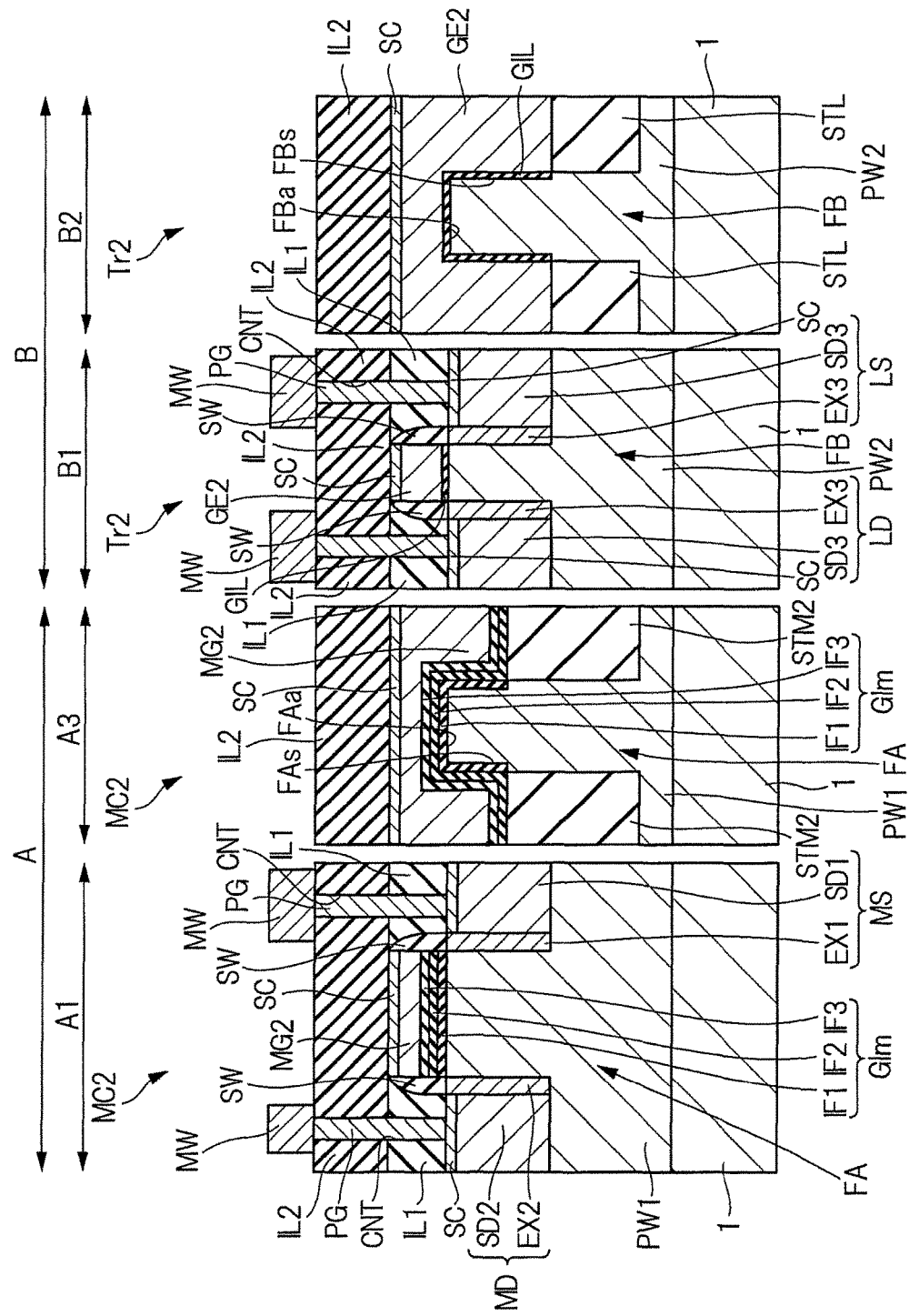
FIG. 41 is a cross-sectional view illustrating a main portion of a semiconductor device according to a third modification example.
Figure 42:
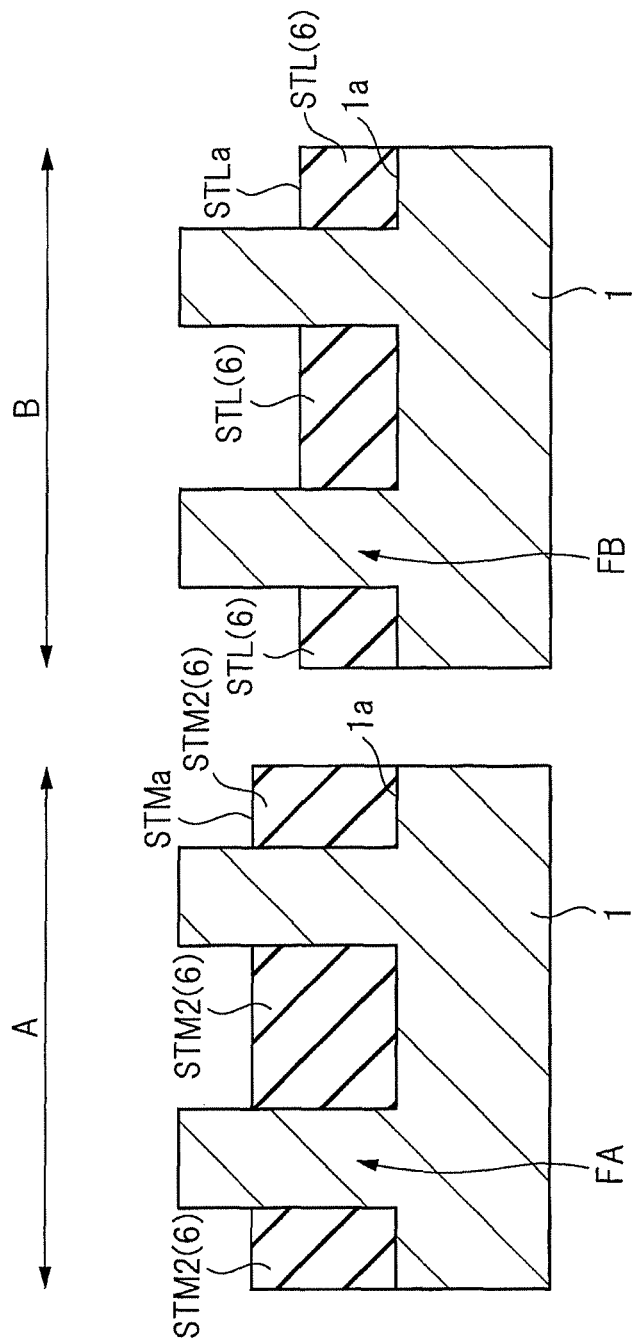
FIG. 42 is a cross-sectional view illustrating the main portion of the semiconductor device in a manufacturing process according to the third modification example.

A third modification example is a modification example of the above-described embodiment and is a semiconductor device including a non-volatile memory formed of a single gate cell like the second modification example but different in that the element isolation film STM2 in the memory cell section A is formed to be thick so as to make up for the thickness of the pad insulation film PAD3 of the second modification example which is not provided in the third modification example. FIG. 41 is a cross-sectional view illustrating a main portion of the semiconductor device according to the third modification example. FIG. 42 is a cross-sectional view illustrating the main portion of the semiconductor device in a manufacturing process according to the third modification example.

As illustrated in FIG. 41, the element isolation film STM2 in the memory cell section A is formed to be thicker than the element isolation film STL in the logic section B. More specifically, a film thickness of the element isolation film STM2 in the memory cell section A is equal to a thickness obtained by adding the film thickness of the pad insulation film PAD3 of the second modification example to the film thickness of the element isolation film STL in the logic section B. Accordingly, the overlap amount between the memory gate electrode MG2 and the side surface FAs of the fin FA, the height of the lower surface of the memory gate electrode MG2, the overlap amount between the gate electrode GE2 and the side surface FBs of the fin FB, and the height of the lower surface of the gate electrode GE2 are the same as those in the above-described second modification example.

Next, a manufacturing method of the semiconductor device according to the third modification example will be described. In the above-described embodiment, the insulation film 6 is subjected to etching processing in the forming process of the element isolation films STM and STL in FIG. 8 (Step S4), and the main surface 6a of the insulation film 6 is lowered, so that the element isolation films STM and STL having the same height are formed. In the third modification example, etching processing of the insulation film 6 is performed in two steps. More specifically, in a first step, the element isolation film STM2 in the memory cell section A is formed in each of the memory cell section A and the logic section B, and in a second step, the insulation film 6 in the logic section B is selectively etched in a state that the memory cell section A is covered with a resist film (not illustrated), thereby forming the element isolation film STL in the logic section B. Thus, the element isolation films STM2 and STL having different thicknesses can be formed. More specifically, the semiconductor substrate 1 including the fins FA and FB having exposure heights different from the element isolation films STM2 and STL can be prepared.

Next, the semiconductor device of the third modification example can be manufactured by the same manufacturing method as that of the second modification example. However, the forming process of the pad insulation film PAD3 in the second modification example is not performed.

In the manufacturing method of the third modification example, the element isolation film STM2 is thickened, and accordingly, there is no need to form the pad insulation film. Therefore, like the first modification example, the insulation film 11 to be the charge accumulation layer is not damaged by etching, and deterioration of charge retention characteristics can be prevented.

In the foregoing, the invention made by the inventors of the present invention has been concretely described based on the embodiments. However, it is needless to say that the present invention is not limited to the foregoing embodiments and various modifications and alterations can be made within the scope of the present invention.

Additionally, part of the matters described in the above-described embodiment will be recited in the following.

[Supplementary Note 1]

A manufacturing method of a semiconductor device which includes:

a projecting portion projecting from an upper surface of a semiconductor substrate in a direction vertical to the upper surface, having a width in a first direction of the upper surface, and extending in a second direction orthogonal to the first direction;

an element isolation film being in contact with the projecting portion and positioned over the upper surface of the semiconductor substrate so as to surround a lower portion of the projecting portion;

a first gate electrode arranged in a first region above the upper surface of the semiconductor substrate and extending in the first direction over the projecting portion and the element isolation film; and a second gate electrode arranged in a second region different from the first region above the upper surface of the semiconductor substrate and extending in the first direction over the projecting portion and the element isolation film, the manufacturing method including the steps of:

(a) preparing a semiconductor substrate having the projecting portion and the element isolation film;

(b) forming, in the first region, the first gate electrode over a side surface of the projecting portion via a first gate insulation film;

(c) forming a second gate insulation film having a charge accumulation layer over the side surfaces of the projecting portion and the element isolation film in the second region, and over the first gate electrode in the first region;

(d) depositing a first insulation film over the second gate insulation film and then removing the first insulation film formed over the projecting portion and the first gate electrode, and forming a pad insulation film formed of the first insulation film above the element isolation film in the second region; and (e) forming, in the second region, the second gate electrode above the second gate insulation film formed over the side surfaces of the projecting portion and above the element isolation film.

[Supplementary Note 2]

The manufacturing method of the semiconductor device according to Supplementary Note 1, in which the first gate electrode and the first gate insulation film are covered with the second gate insulation film in the step (d).

[Supplementary Note 3]

The manufacturing method of the semiconductor device according to Supplementary Note 2, in which the first gate insulation film and the first insulation film are made of silicon oxide films and the second gate insulation film is made of a silicon nitride film.

[Supplementary Note 4]

The manufacturing method of the semiconductor device according to Supplementary Note 1, in which a step (f) of forming a second insulation film over the second gate insulation film of the projecting portion and the pad insulation film in the second region is included between the step (d) and the step (e).

[Supplementary Note 5]

A manufacturing method of a semiconductor device which includes:

a projecting portion projecting from an upper surface of a semiconductor substrate in a direction vertical to the upper surface, having a width in a first direction of the upper surface, and extending in a second direction orthogonal to the first direction;

an element isolation film being in contact with the projecting portion and positioned over the upper surface of the semiconductor substrate so as to surround a lower portion of the projecting portion;

a first gate electrode arranged in a first region above the upper surface of the semiconductor substrate and extending in the first direction over the projecting portion and the element isolation film; and a second gate electrode arranged in a second region different from the first region above the upper surface of the semiconductor substrate and extending in the first direction over the projecting portion and the element isolation film, the manufacturing method including the steps of:

(a) preparing a semiconductor substrate having the projecting portion and the element isolation film;

(b) forming, in the first region, the first gate electrode over a side surface of the projecting portion via a first gate insulation film;

(c) depositing a first insulation film so as to cover the projecting portion and then removing the first insulation film formed over the projecting portion and the first gate electrode, and forming a pad insulation film formed of the first insulation film over the element isolation film in the second region;

(d) forming, in the second region, a second gate insulation film having a charge accumulation layer over the side surfaces of the projecting portion and the pad insulation film; and (e) forming, in the second region, the second gate electrode above the second gate insulation film formed over the side surfaces of the projecting portion and above the element isolation film.

[Supplementary Note 6]

A manufacturing method of a semiconductor device, including the steps of:

(a) preparing a semiconductor substrate having a first projecting portion projecting from an upper surface thereof in a vertical direction and formed in a first region above the upper surface, a second projecting portion formed in a second region different from the first region, a first element isolation film being in contact with a lower portion of the first projecting portion and surrounding the first projecting portion, and a second element isolation film being in contact with a lower portion of the second projecting portion and surrounding the second projecting portion;

(b) forming a first insulation film having a charge accumulation layer over the first projecting portion, the first element isolation film, the second projecting portion, and the second element isolation film;

(c) depositing a second insulation film over the first insulation film and then etching the second insulation film, and forming a pad insulation film formed of the second insulation film above the first element isolation film and the second element isolation film;

(d) forming a third insulation film over the first projecting portion, the pad insulation film above the first element isolation film, the second projecting portion, and the pad insulation film above the second element isolation film;

(e) removing the third insulation film and the second insulation film in the second region;

(f) forming a first conductor film over the third insulation film in the first region; and (g) forming a second conductor film over the second projecting portion in the second region.

[Supplementary Note 7]

A manufacturing method of a semiconductor device, including the steps of:

(a) preparing a semiconductor substrate having a first projecting portion projecting from an upper surface thereof in a vertical direction and formed in a first region above the upper surface, and a second projecting portion formed in a second region different from the first region;

(b) forming a first element isolation film being in contact with a lower portion of the first projecting portion and surrounding the first projecting portion, and a second element isolation film being in contact with a lower portion of the second projecting portion and surrounding the second projection portion;

(c) forming a first insulation film having a charge accumulation layer over the first projecting portion and the first element isolation film;

(d) forming a second insulation film over the first insulation film, and then forming a first conductor film over the second insulation film; and (e) forming a third insulation film over the second projection portion, and then forming a second conductor film over the third insulation film, in which the first element isolation film is thicker than the second element isolation film.

What is claimed is:

1. A manufacturing method of a semiconductor device which includes:

a projecting portion projecting from an upper surface of a semiconductor substrate in a direction vertical to the upper surface, having a width in a first direction of the upper surface, and extending in a second direction orthogonal to the first direction;

an element isolation film being in contact with the projecting portion and positioned over the upper surface of the semiconductor substrate so as to surround a lower portion of the projecting portion;

a first gate electrode arranged in a first region above the upper surface of the semiconductor substrate and extending in the first direction over the projecting portion and the element isolation film; and a second gate electrode arranged in a second region different from the first region above the upper surface of the semiconductor substrate and extending in the first direction over the projecting portion and the element isolation film, the manufacturing method including the steps of:

(a) preparing a semiconductor substrate having the projecting portion and the element isolation film;

(b) forming, in the first region, the first gate electrode over a side surface of the projecting portion via a first gate insulation film;

(c) forming a second gate insulation film having a charge accumulation layer over the side surfaces of the projecting portion and the element isolation film in the second region, and over the first gate electrode in the first region;

(d) depositing a first insulation film over the second gate insulation film and then removing the first insulation film formed over the projecting portion and the first gate electrode, and forming a pad insulation film formed of the first insulation film above the element isolation film in the second region; and (e) forming, in the second region, the second gate electrode above the second gate insulation film formed over the side surfaces of the projecting portion and above the element isolation film.

2. The manufacturing method of the semiconductor device according to claim 1, in which the first gate electrode and the first gate insulation film are covered with the second gate insulation film in the step (d).

3. The manufacturing method of the semiconductor device according to claim 2, in which the first gate insulation film and the first insulation film are made of silicon oxide films and the second gate insulation film is made of a silicon nitride film.

4. The manufacturing method of the semiconductor device according to claim 1, in which a step (f) of forming a second insulation film over the second gate insulation film of the projecting portion and the pad insulation film in the second region is included between the step (d) and the step (e).

* * * * *